United States Patent
Lee et al.

(10) Patent No.: US 12,476,618 B2
(45) Date of Patent: Nov. 18, 2025

(54) PHASE SHIFTER AND ELECTRONIC SWITCH

(71) Applicants: Choon Sae Lee, Dallas, TX (US); Guang Yang, Dallas, TX (US); Guan-Guo Cheng, Torrance, CA (US)

(72) Inventors: Choon Sae Lee, Dallas, TX (US); Guang Yang, Dallas, TX (US); Guan-Guo Cheng, Torrance, CA (US)

( * ) Notice: Subject to any disclaimer, the term of this patent is extended or adjusted under 35 U.S.C. 154(b) by 106 days.

(21) Appl. No.: 18/236,940

(22) Filed: Aug. 22, 2023

(65) Prior Publication Data

US 2025/0070758 A1    Feb. 27, 2025

(51) Int. Cl.
*H03H 11/20* (2006.01)

(52) U.S. Cl.
CPC ................... *H03H 11/20* (2013.01)

(58) Field of Classification Search
None
See application file for complete search history.

(56) References Cited

U.S. PATENT DOCUMENTS

| | | | |
|---|---|---|---|
| 10,211,801 B2* | 2/2019 | Birkbeck | H03H 7/25 |
| 2009/0278624 A1* | 11/2009 | Tsai | H01P 1/18 |
| | | | 333/167 |
| 2021/0167746 A1* | 6/2021 | Dani | H01P 1/184 |
| 2024/0304976 A1* | 9/2024 | Elmasry | H01P 5/184 |
| 2025/0055171 A1* | 2/2025 | Staudinger | H03H 7/48 |

* cited by examiner

*Primary Examiner* — Patrick C Chen
(74) *Attorney, Agent, or Firm* — ScienBiziP, P.C.

(57) ABSTRACT

A phase shifter that relies on a reflected wave from a load such as a varactor with a capacitance varied by an external bias voltage is provided. The phase shift does not depend on the wave propagation through an active medium. The input RF signal is sent to the variable loading and the reflected wave from the load is channeled to the output port via a network that takes the input signal without much reflection to the input terminal but passes most of the power from the variable load to the output terminal with a phase change depending on the variable bias input of the loading. Such network to steer the input to the variable loading and send the signal reflected from the loading to the output port without much reflection includes a quadrature hybrid or a circulator.

12 Claims, 57 Drawing Sheets

PHASE SHIFTER AND ELECTRONIC SWITCH

FIELD

The present disclosure generally relates to phase shifters, electronic switches, aperture coupled antenna elements with embedded power splitters, phased array antennas, and more particularly, to a system for electromagnetic communication.

BACKGROUND

It is highly desirable that a person in a moving car be able to establish and maintain communication with another mobile device. If the antenna is fixed to a vehicle, the direction of the antenna beam shifts as the vehicle moves. In order to maintain proper reception, the antenna would have to be adjusted accordingly. In addition, when such beam-steerable antenna is installed at a cellular-phone base station, the antenna beam may follow an individual user and the overall system will be able to accommodate more customers, resulting in increased capacity of the base station.

The most widely used antennas for beam steering or direction finding are phased-array antennas. A phased-array antenna is a computer-controlled array of antennas that creates a beam of radio waves that may be electronically steered to point in different directions without moving the antennas. A phase shifter is used to alter the input phase at each radiating element of the phased-array antenna. The design of the existing phase shifters for phased array antennas is very complicated, making the phased-array antennas impractical for many commercial applications. Furthermore, many of the existing phase shifters depend on wave propagation through an active medium that makes these phase shifters large and lossy.

SUMMARY

Some implementations provide a phase shifter that includes a quadrature hybrid. A quadrature hybrid is a four-port device. When the input power enters port 1, the input terminal, the input impedance is well matched without reflection, port 2 receives a half of the incident power with $-90$ degree phase shift, the other half with $-180$ degree phase shift is transmitted to port 3, and no power passes through port 4.

The phase shifter of the present implementation is a quadrature hybrid with ports 2 and 3 terminated with identical varactors. The capacitance of the varactors may be changed by an external bias voltage. The resultant device becomes a two-port network where all the input power at port 1 is transmitted to port 4, the output terminal, without any reflection at the input terminal.

When the input power enters port 1, the power after the initial transmission through the quadrature hybrid is split between ports 2 and 3 with phase changes of $-90$ degrees and $-180$ degrees, respectively, while there is no reflection at port 1, and port 4 is isolated without any output power. The initial transmitted signals at ports 2 and 3 attain the same additional phase change after reflection from the identical varactors and are transmitted through the quadrature hybrid again to ports 1 and 4 where power at each of ports 2 and 3 is split between ports 1 and 4. The power at each of ports 1 and 4 is sum of the two contributions from ports 2 and 3. The two contributions at port 1 are 180 degrees out of phase to give no transmitted power, resulting in zero reflection at the input port. On the other hand, The two signals from ports 2 and 3 are constructively interfered at port 4 to give a total transmission to port 4 with a phase shift of $-270$ degrees (90 degrees) after passing through the quadrature hybrid twice plus additional phase shift from the varactors. The resultant device is a two-port network with minimal reflection at the input port and total transmission at the output port where the phase of the output is varied by an external bias voltage to the varactors. In implementation, port 1 is the input terminal for radio frequency (RF) signal and port 4 is the output terminal that is connected to a device in need of phase shift, such as an array element in a phased-array antenna.

In order to increase the sensitivity of phase shift by the bias voltage, an inductor may be connected either in parallel, or in series, with each of the varactors to create a resonant condition. Near the resonance, the impedance of a pair of inductor and varactor in parallel changes rapidly with variation of the external bias voltage, to give a large phase change with a small voltage shift of the control bias input while providing a wide range of phase shift. Varying of the external bias voltage for pair of inductor and varactor provides a phase shift in both positive and negative angles as well as a large dynamic range of phase shift.

Some of the present implementations provide a phase shifter that is realized by a varactor and a circulator. In these implementations, the circulator replaces the quadrature hybrid. A circulator is a passive, non-reciprocal three- or four-port device that only allows RF signal to exit through its neighboring port. A circulator is a device that may require materials such as ferrite.

Some of the present implementations may provide an electronic switch that includes a quadrature hybrid. The switch may be implemented with only one varactor. After the initial transmission of an input power at port 1 through the quadrature hybrid to ports 2 and 3, the phase changes of the waves after reflection from the capacitive loadings at those two ports are the same for the on-state of the switch or 180 degrees apart of the off-state of the switch. For example, in order to create such required condition, port 2 may be open-ended for a loading of large impedance and the capacitive loading of a varactor at port 3 may be changed by the bias voltage to large impedance (on-state) or small impedance (off-state).

The switch in some implementation may use a pair of inductor and varactor (either in parallel or in series) in place of a single varactor to reduce the bias-voltage difference between on- and off-state. The switch, in a modulation state, may become a modulator when the capacitance of the varactor is set between the capacitances for the on- and the off-state. In other words, the varactor bias voltage modulates the RF signal, resulting in a simple low-loss amplitude modulator.

Some implementations provide a linear feeding network for aperture coupled fed structure. By incorporating the use of power dividers that progressively give power splits of $1:N-1$, $1:N-2 \ldots 1:1$, designing a N-element array antenna becomes much more straightforward by using the special feeding technique of the present implementations referred to herein as series aperture coupled feeding. One example of such N-element array antenna is a 3-element array antenna that use 1:1 and 2:1 power splitters.

The series aperture coupled feeding method of the present implementations provides the technical advantage of simplifying the design of an N-element array antenna which makes easier without clumsy and cumbersome power splitting feeding network, like conventional quarter wavelength or Wilkinson divider. The series aperture coupled feeding method of the present implementations provides the technical advantage of allowing for greater flexibility in the design of the antenna, enabling the antenna to be tailored to meet specific requirements.

Some implementations provide a phased-array antenna that performs beamforming by introducing phase shifters of the present embodiments (e.g., phase shifters that are based on quadrature hybrids or circulators) placed between transmission line segments of the radiating patches of a linear feeding network for aperture coupled fed.

BRIEF DESCRIPTION OF THE DRAWINGS

Aspects of the exemplary disclosure are best understood from the following detailed description when read with the accompanying figures. Various features are not drawn to scale, and dimensions of various features may be arbitrarily increased or reduced for clarity of discussion.

Figure 19:
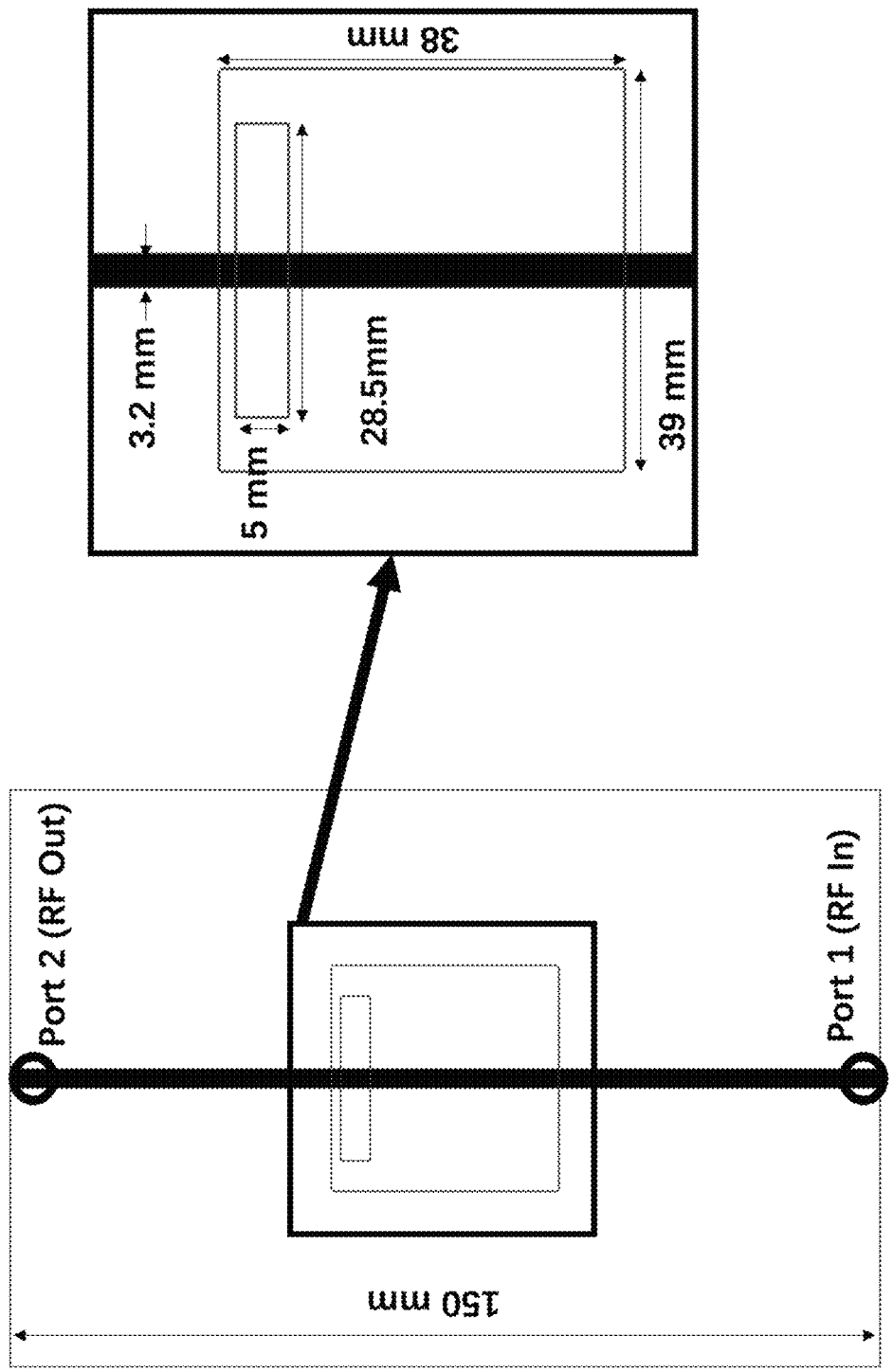

FIG. 19 illustrates an example of structure with a reduced length with the patch size of 39 mm×38 mm, with both top and bottom substrates of material having thickness of 62 mil and dielectric constant of 3.55, according to an example implementation of the present application.

Figure 20:
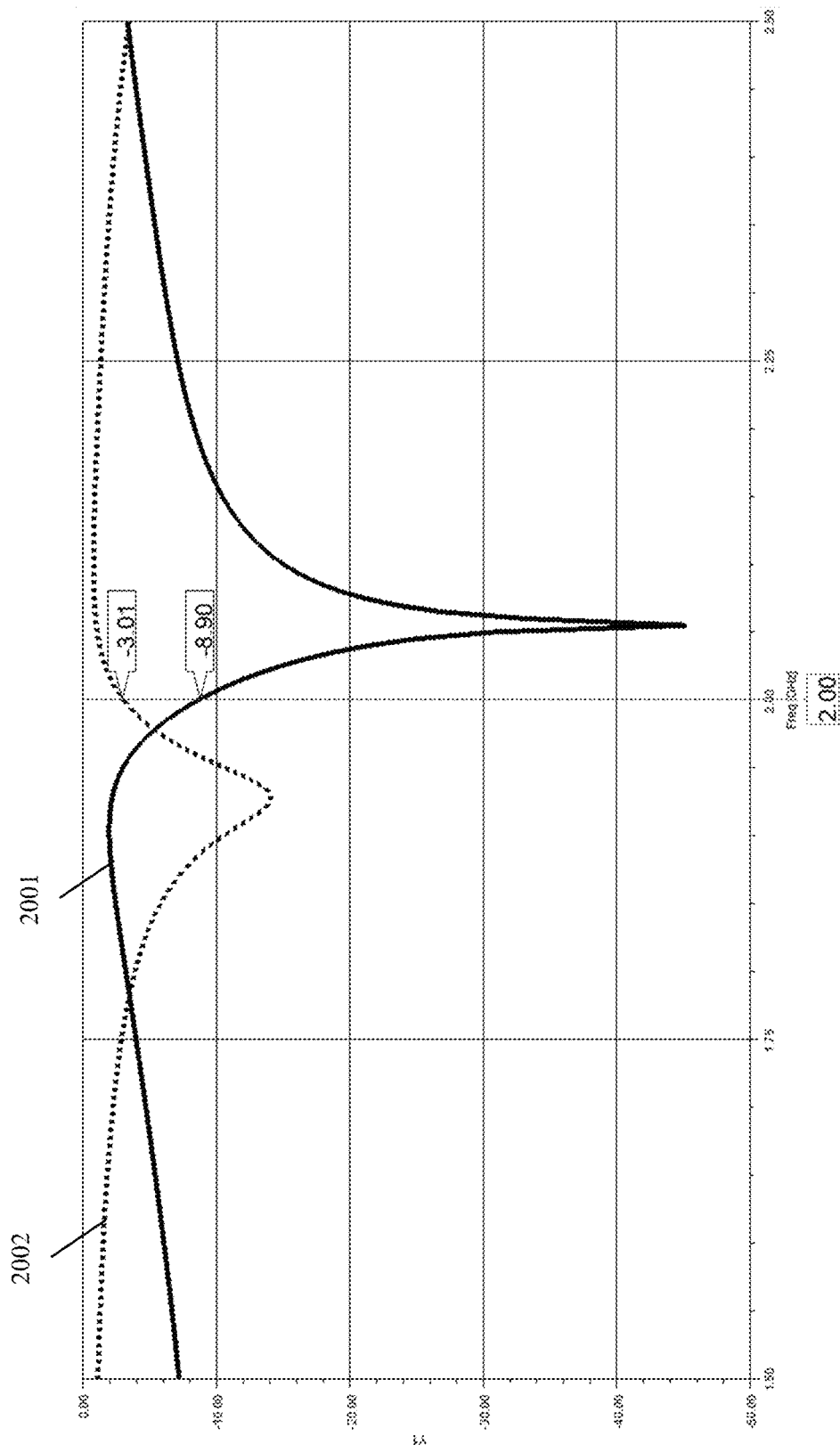

FIG. 20 illustrates the transmission performance of the structure of FIG. 19 at an operating frequency of 2 GHz, according to an example implementation of the present application.

Figure 21:
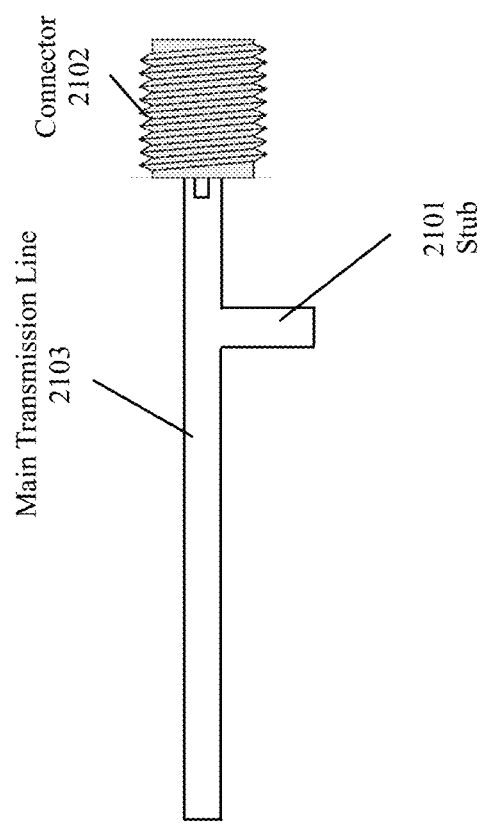

FIG. 21 illustrates a stub that may be placed before an output connector to compensate for mismatch, according to an example implementation of the present application.

Figure 22:
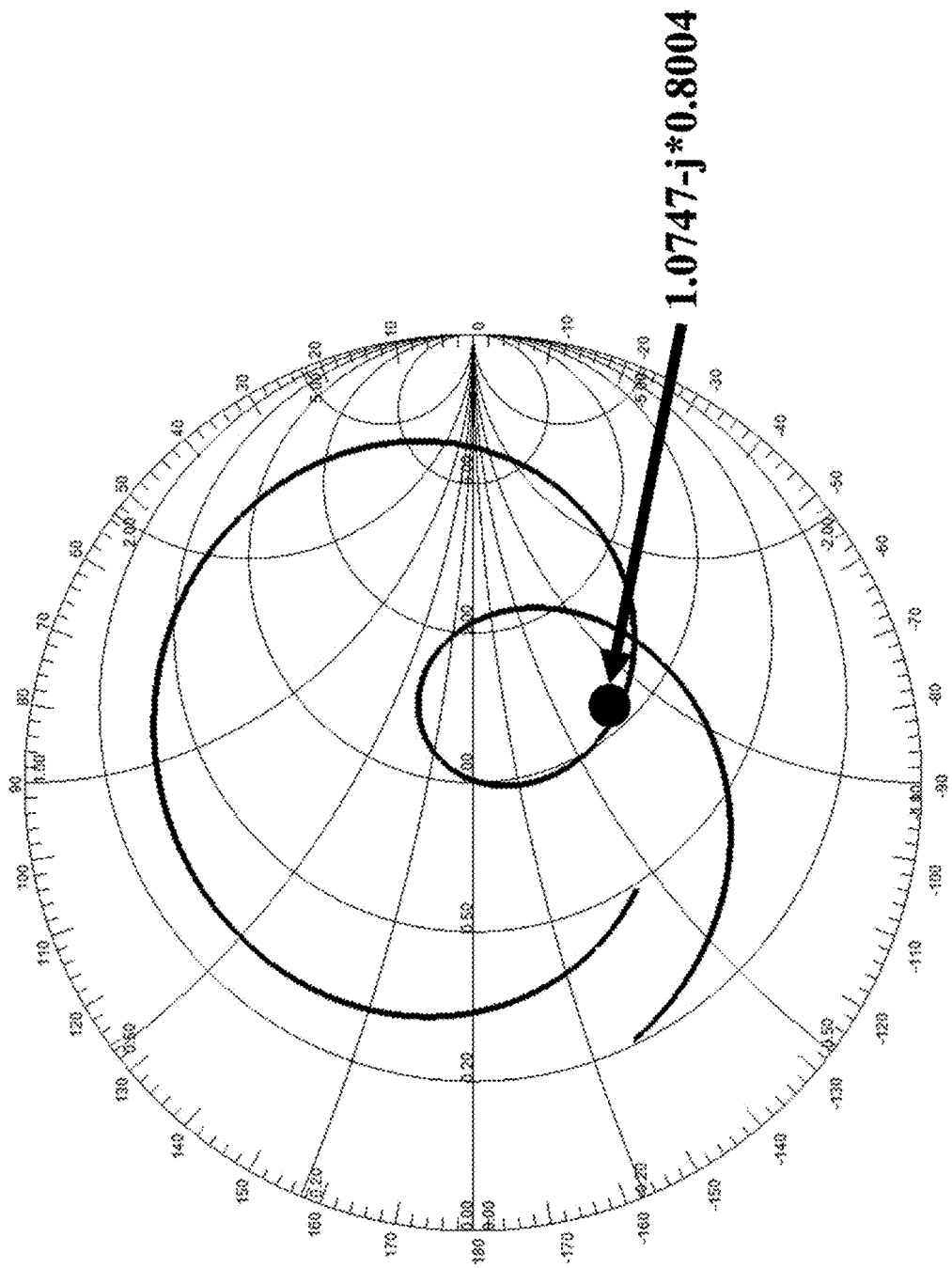

FIG. 22 illustrates the normalized characteristic impedance at 2 GHz labelled on the Smith chart when the information on FIG. 20 is transferred to Smith chart, according to an example implementation of the present application.

Figure 23:
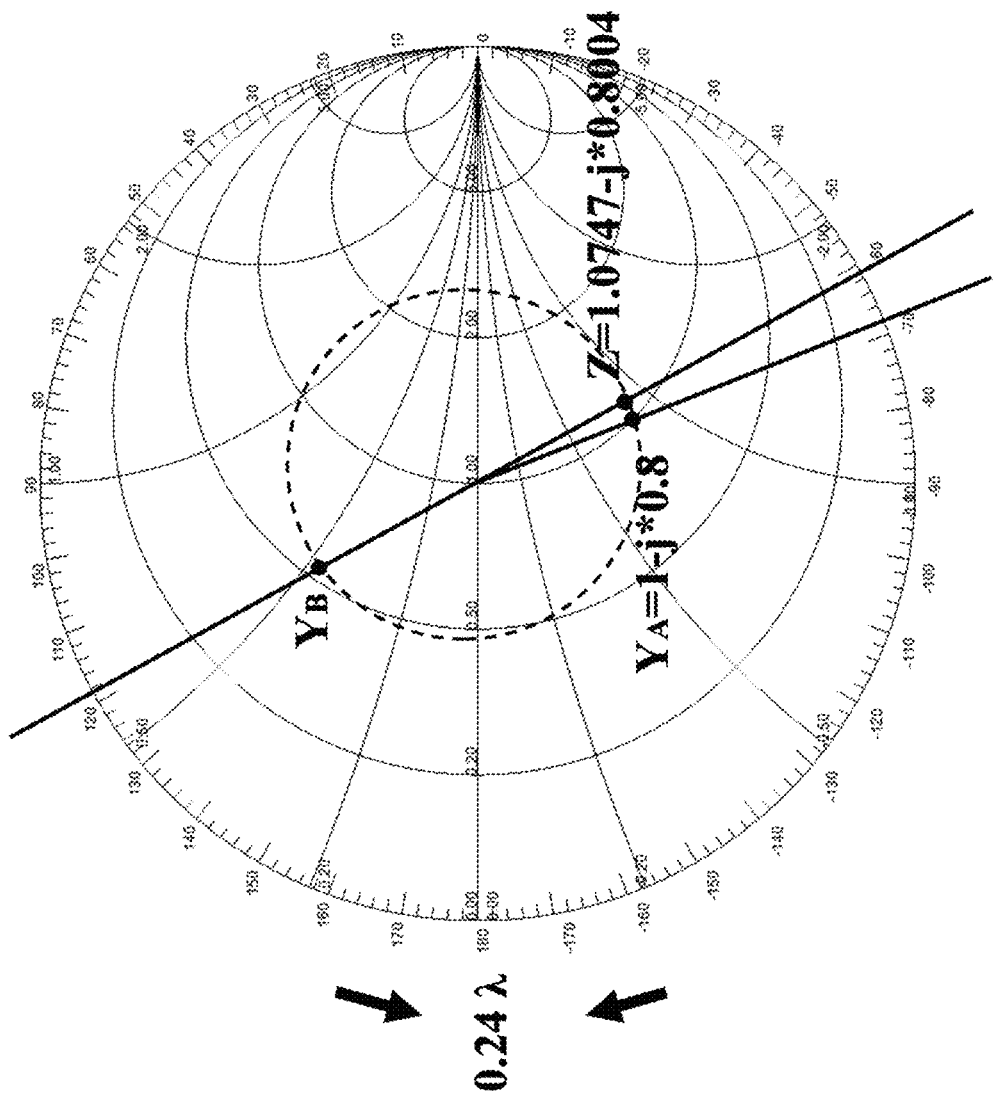

FIG. 23 illustrates the stub matching solution on the Smith chart in terms of the matching stub's length and location, according to an example implementation of the present application.

Figure 24:
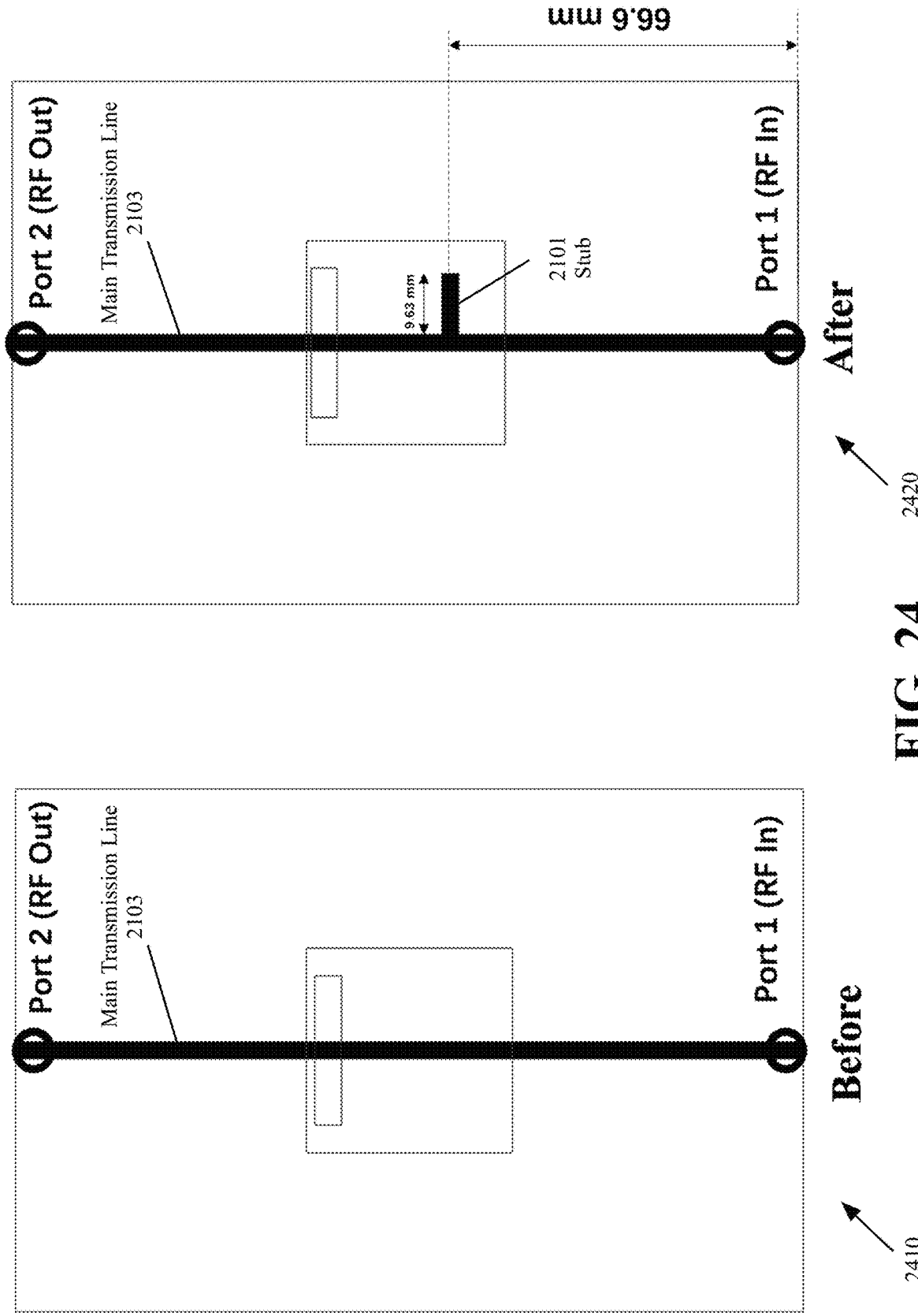

FIG. 24 illustrates the structure of an aperture coupled antenna element before and after a stub is added to the main transmission line underneath the radiating patch, according to an example implementation of the present application.

Figure 25:
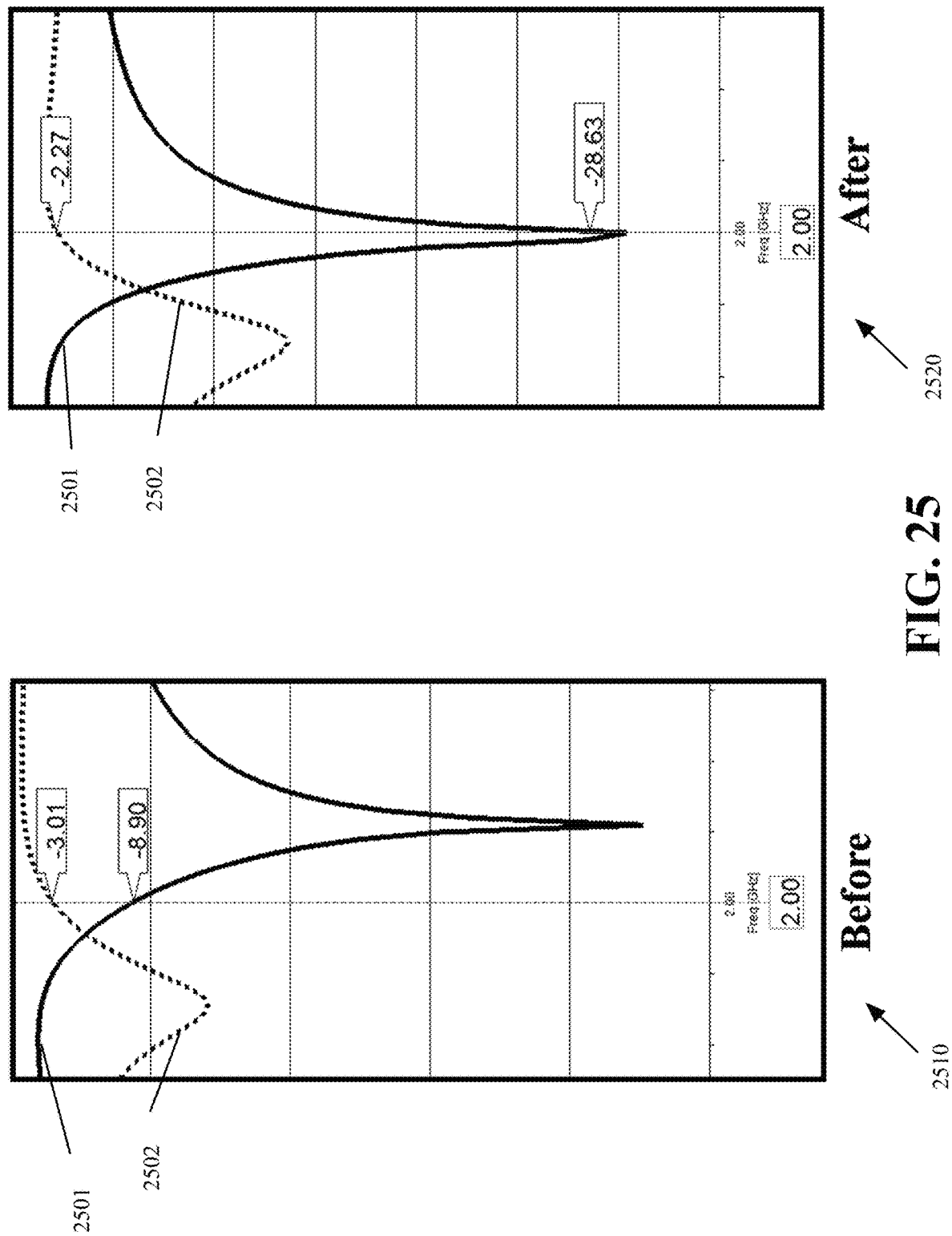

FIG. 25, illustrates the comparison of transmission performance at 2 GHZ, according to an example implementation of the present application.

Figure 26:
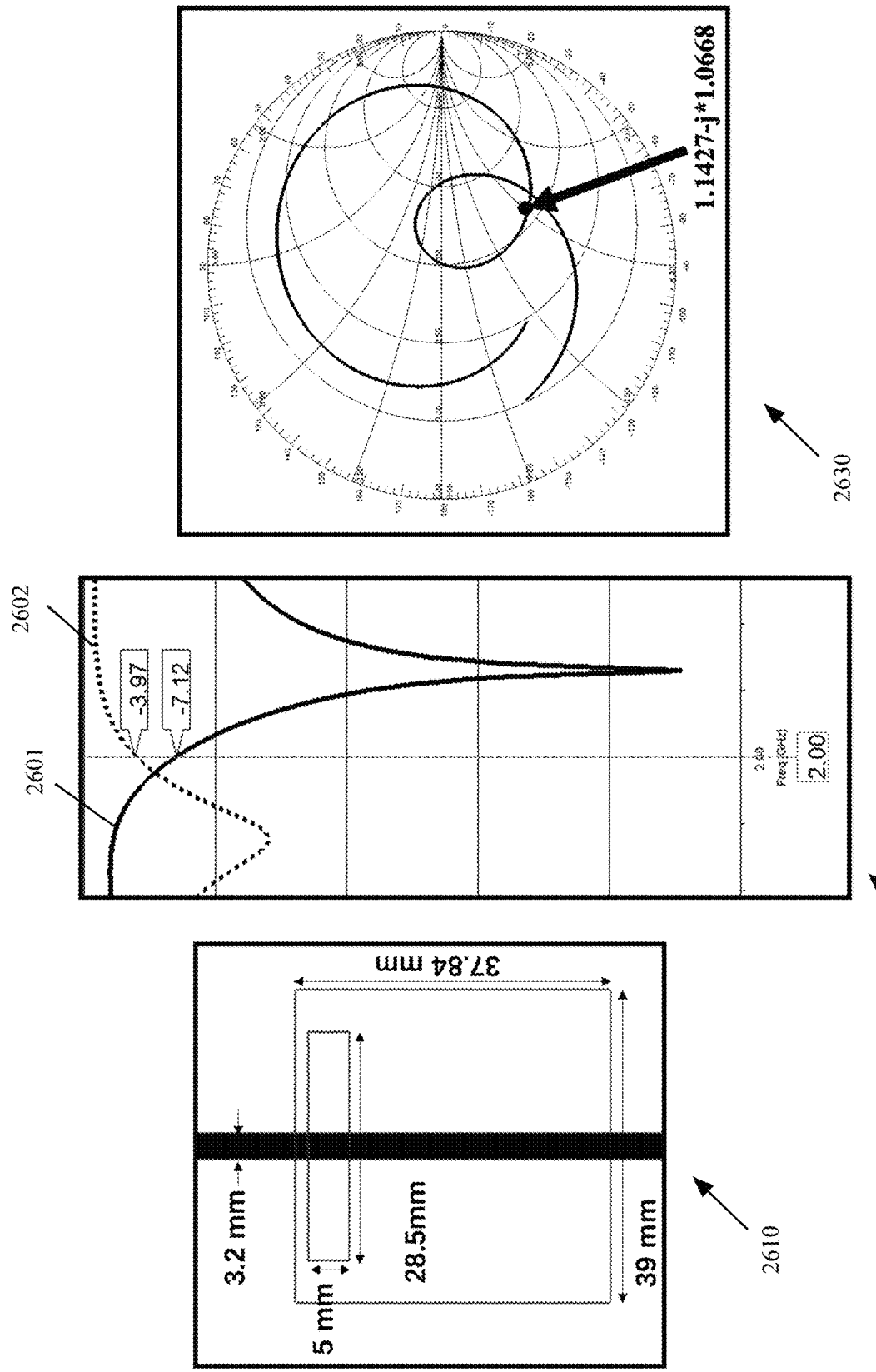

FIG. 26 illustrates the structure with the patch size of 39 mm×37.84 mm and the corresponding transmission performance and normalized characteristic impedance, according to an example implementation of the present application.

Figure 27:
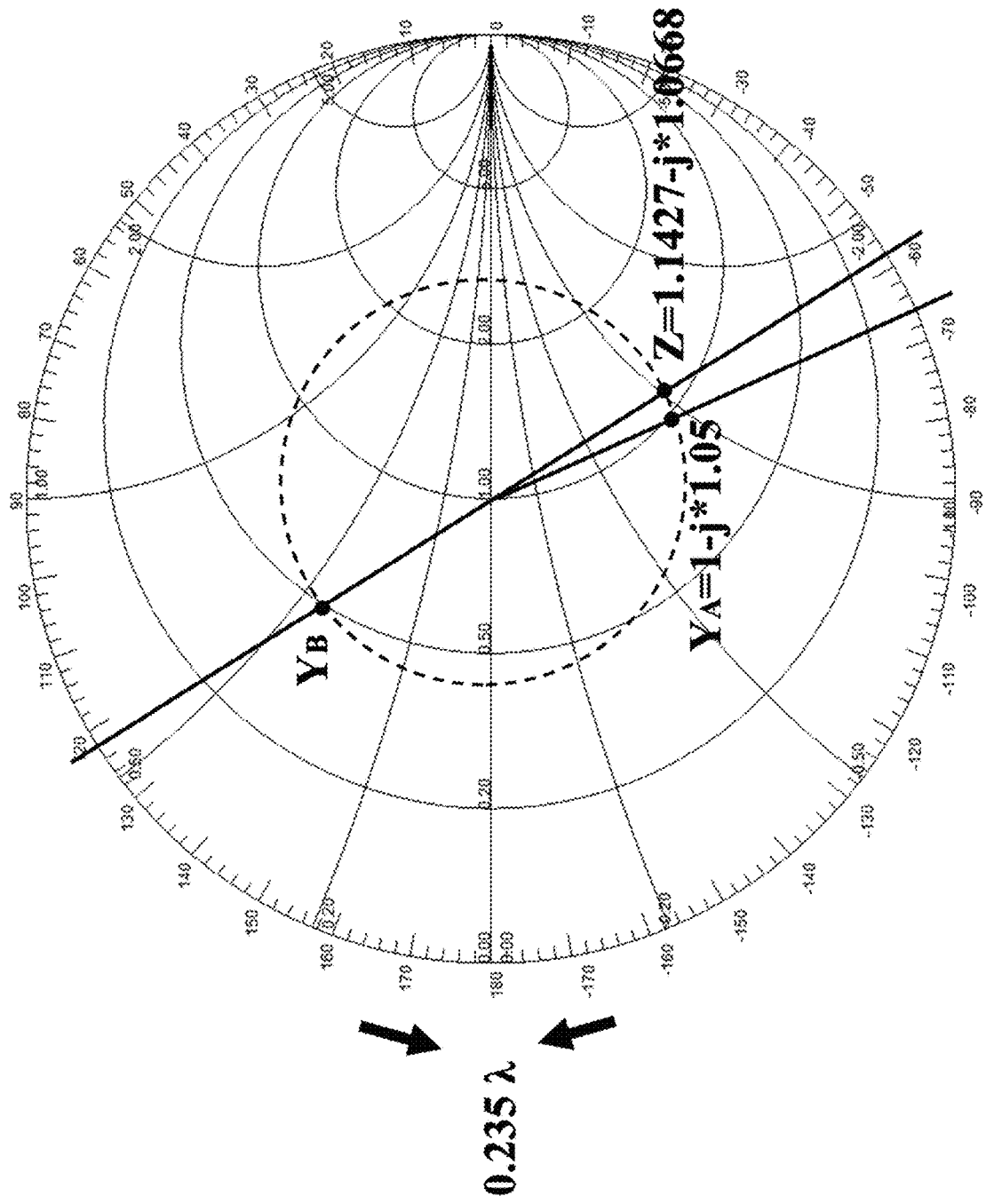

FIG. 27 illustrates the stub matching procedure on the Smith chart, according to an example implementation of the present application.

Figure 28:
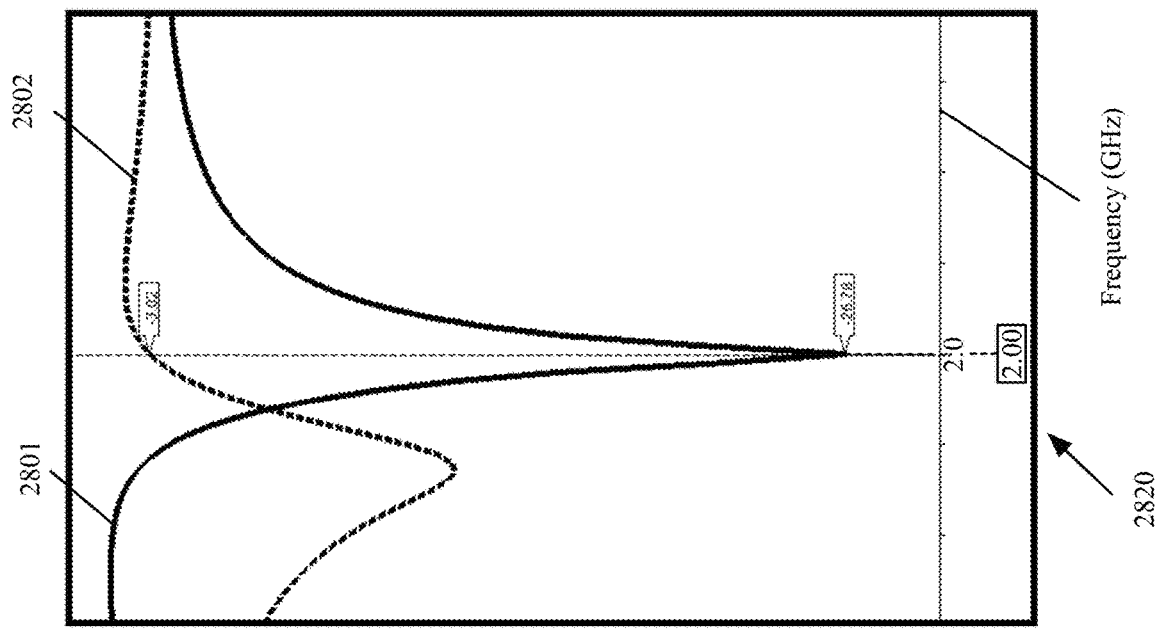
Figure 28:
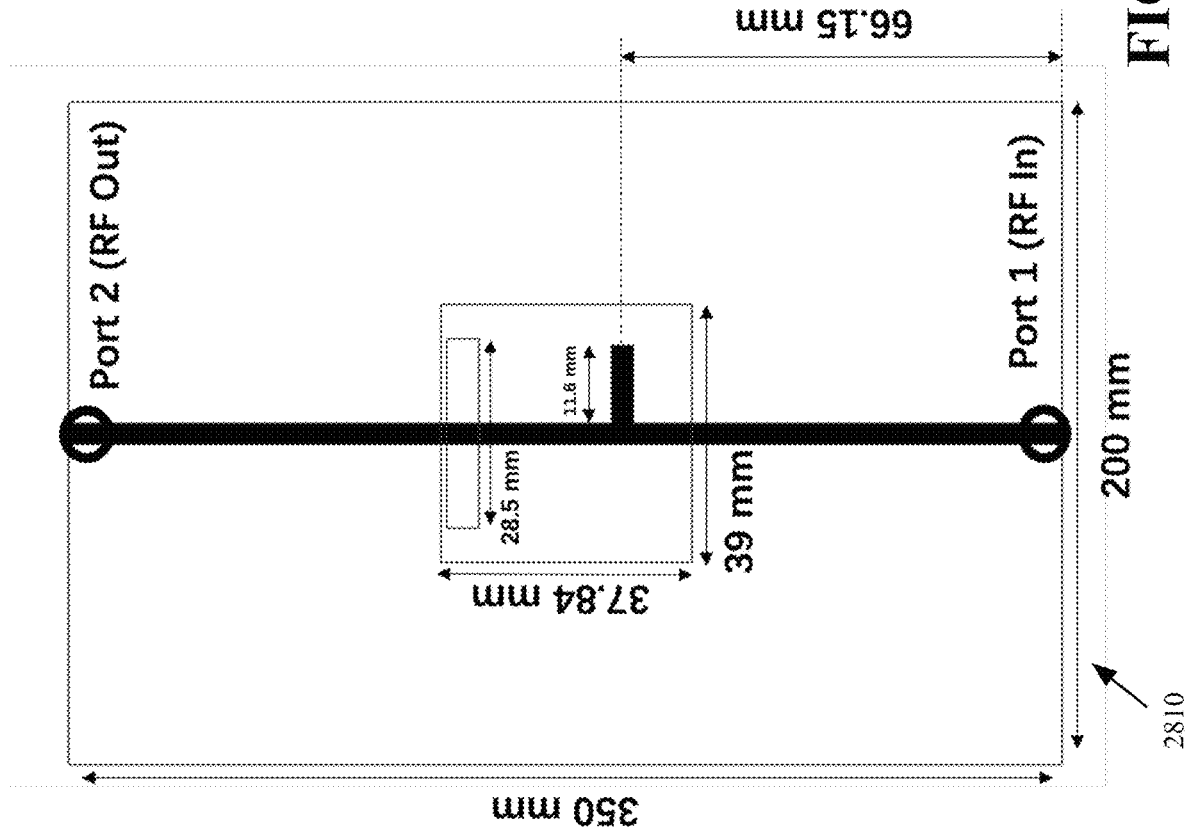

FIG. 28 illustrates the adjusted structure with matching stub and the corresponding transmission performance, according to an example implementation of the present application.

Figure 29:
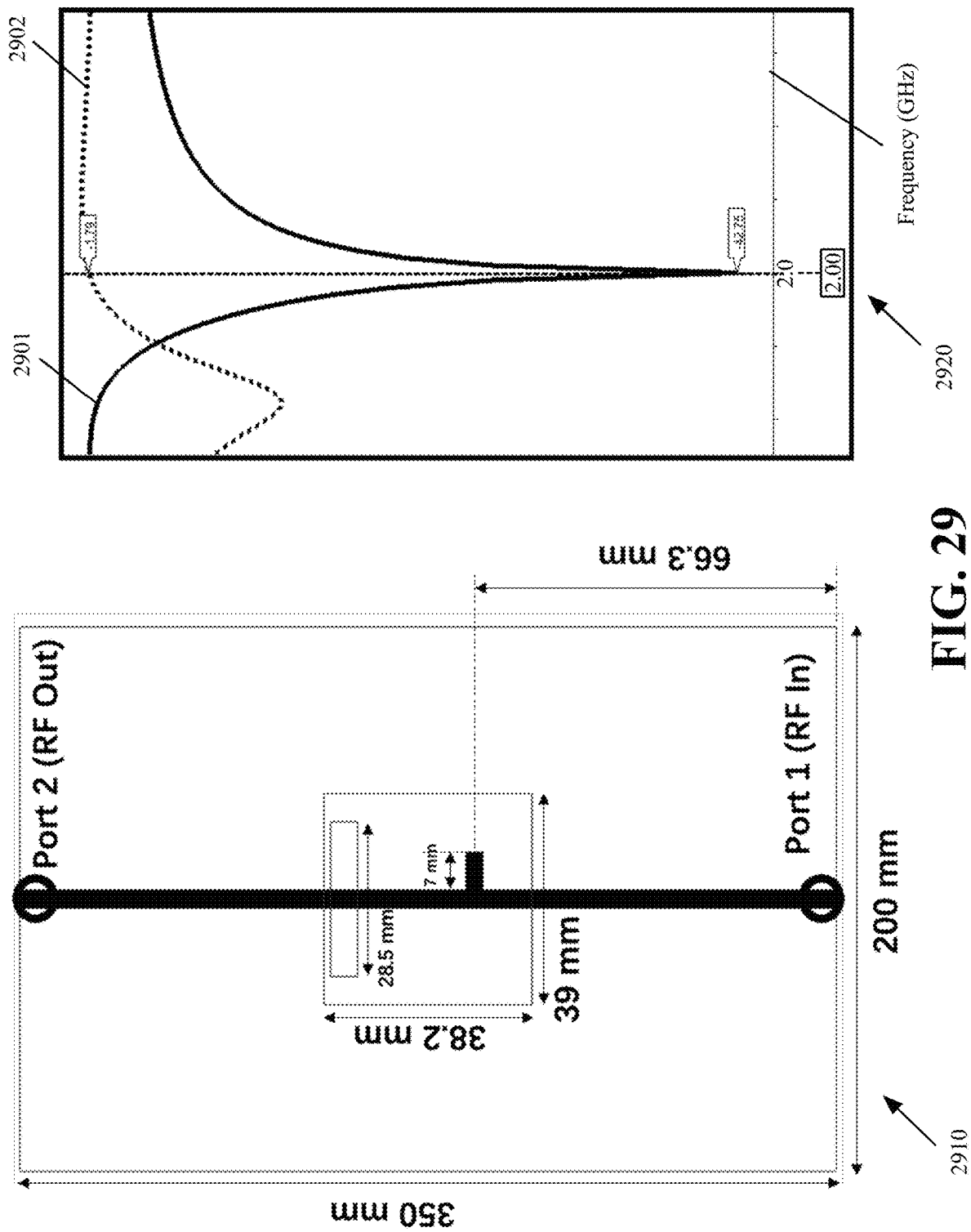

FIG. 29 illustrates an example structure with a 2:1 power splitter working at 2 GHZ, according to an example implementation of the present application.

Figures 30A, 30B:
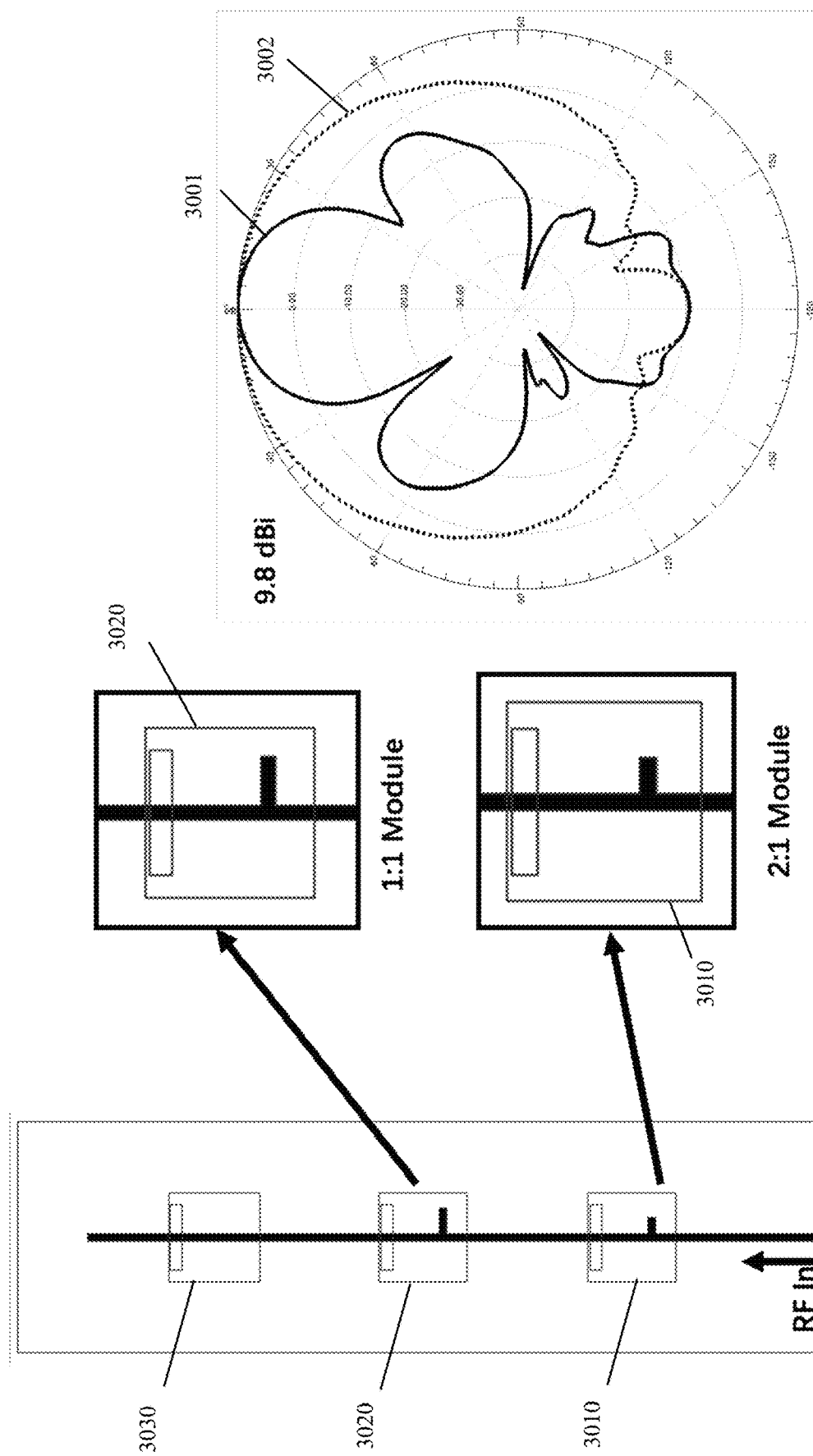

FIG. 30A illustrates a 1×3 antenna array based on the feeding technique of series aperture coupled feeding, according to an example implementation of the present application.

FIG. 30B illustrates the radiation pattern of the antenna array of FIG. 30A at 2 GHz.

Figure 31:
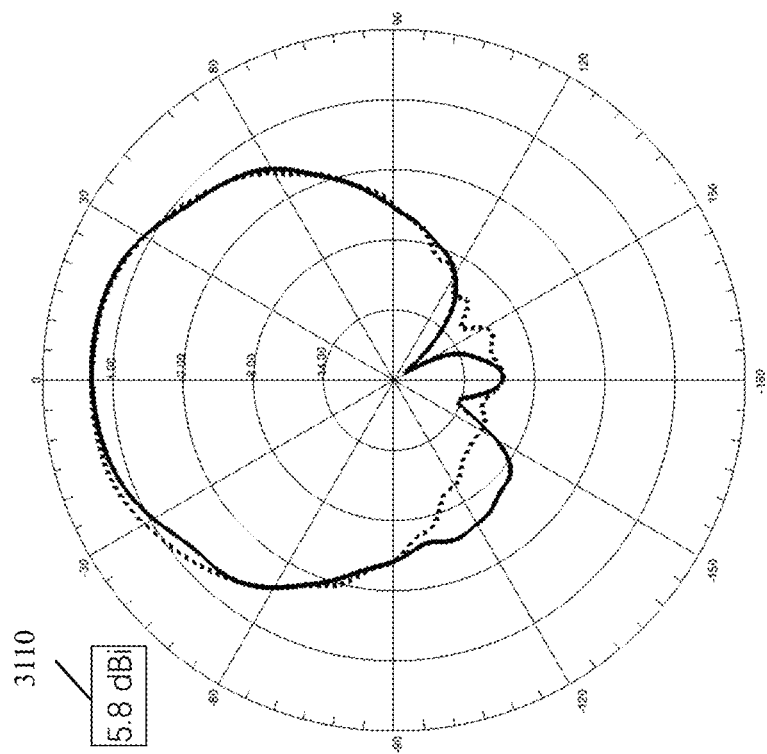
Figure 31:
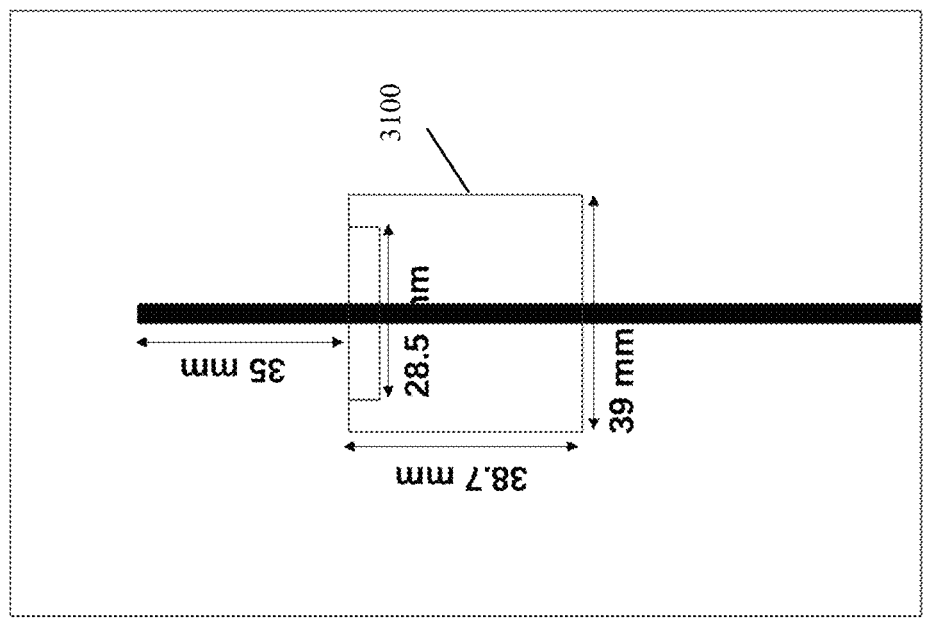

FIG. 31, illustrates a typical aperture coupled fed antenna with a gain of 5.8 dBi, according to an example implementation of the present application.

Figure 32:
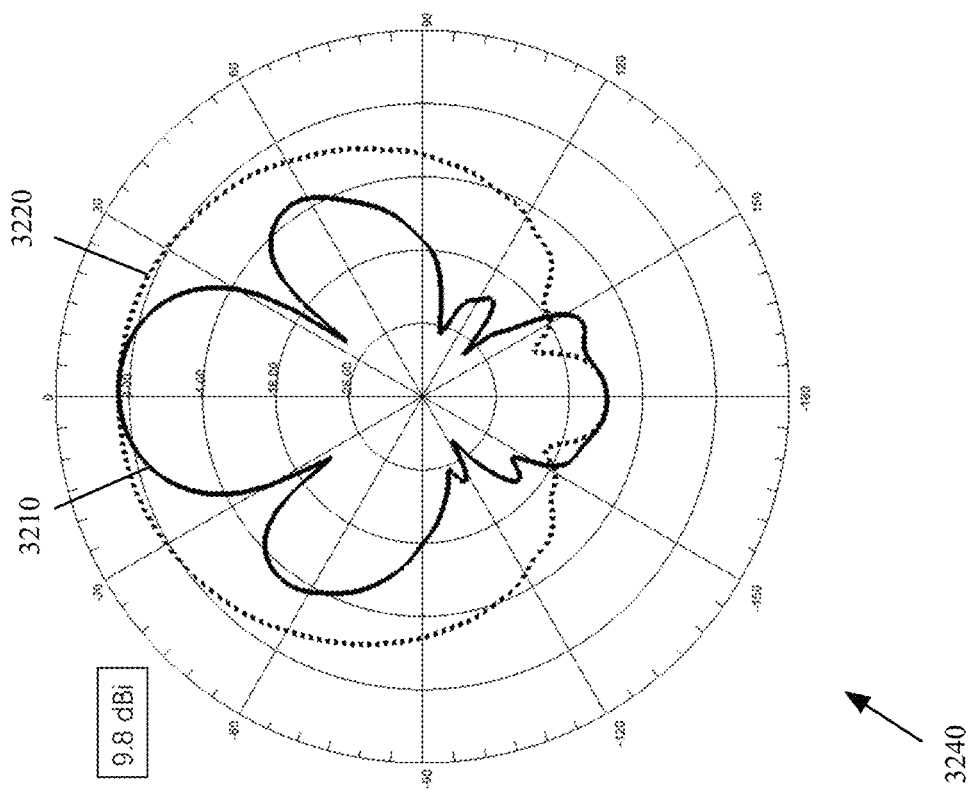
Figure 32:
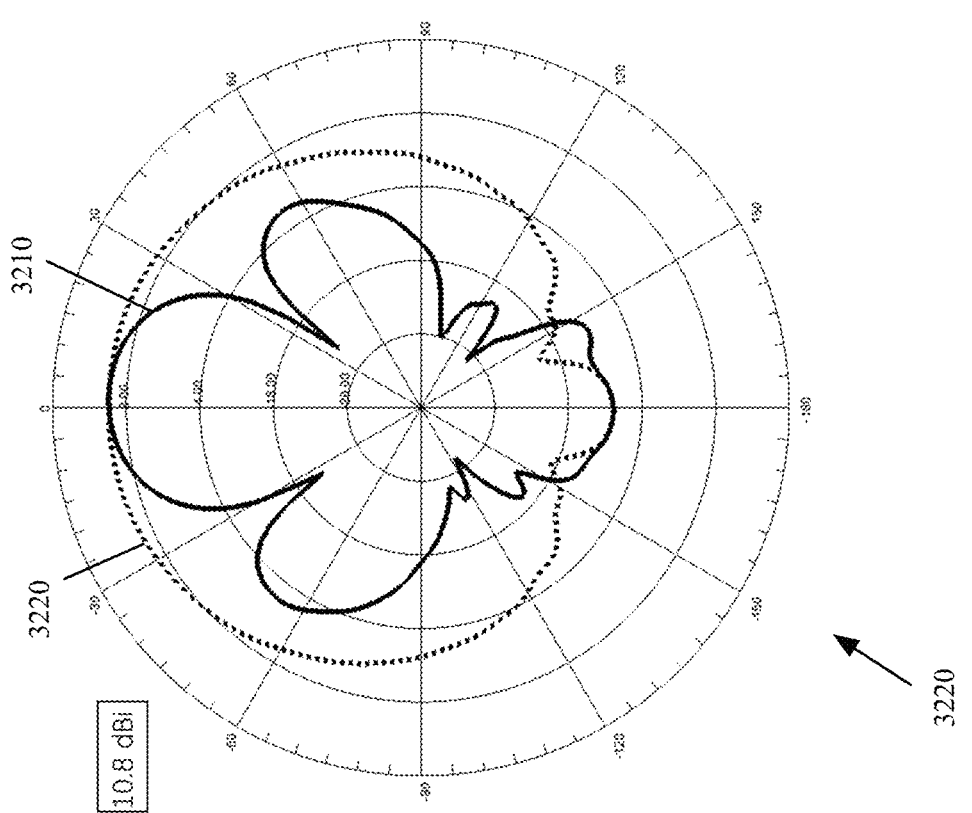

FIG. 32 illustrates the simulation of radiation pattern of a 1×3 antenna array, according to an example implementation of the present application.

Figure 33B:
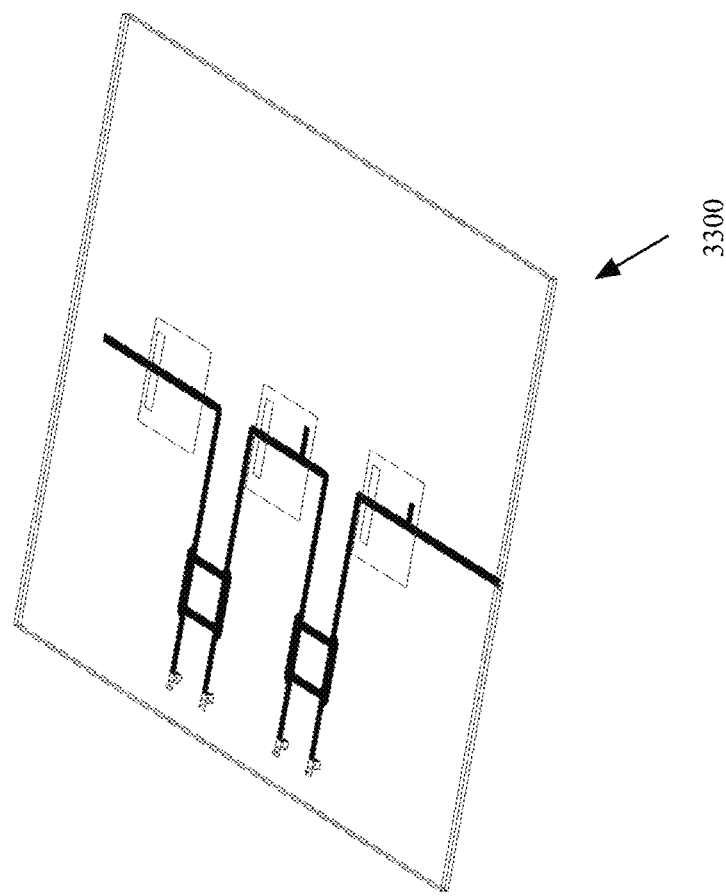
Figure 33A:
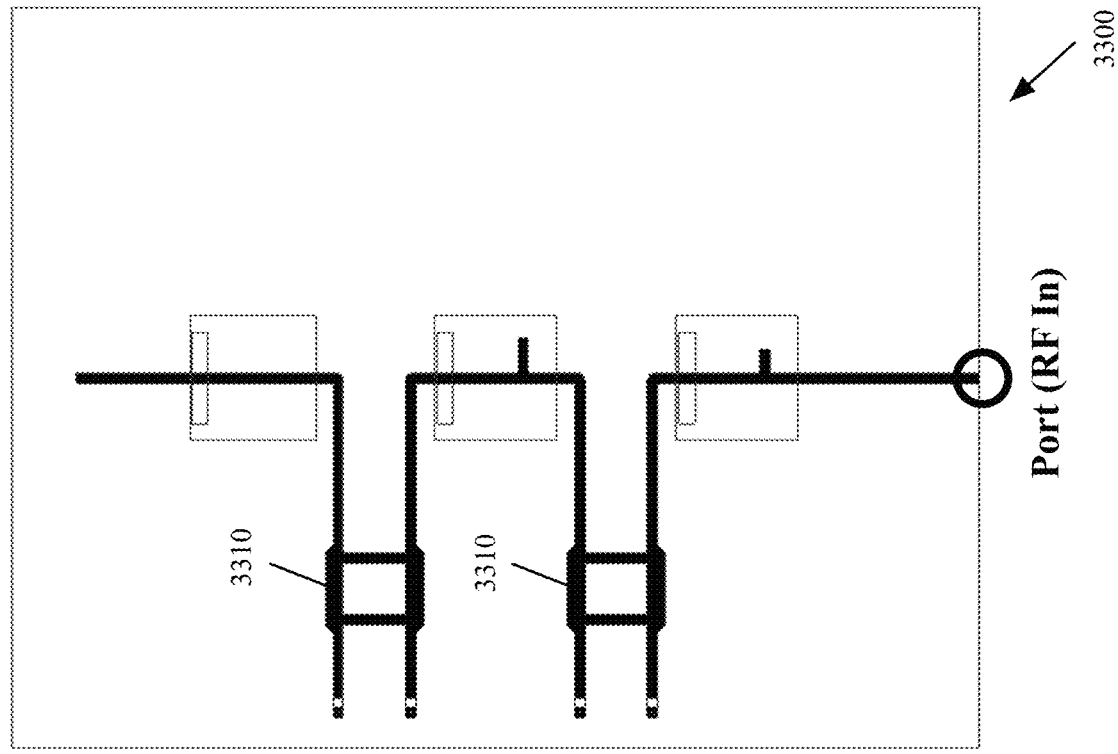
Figure 33C:
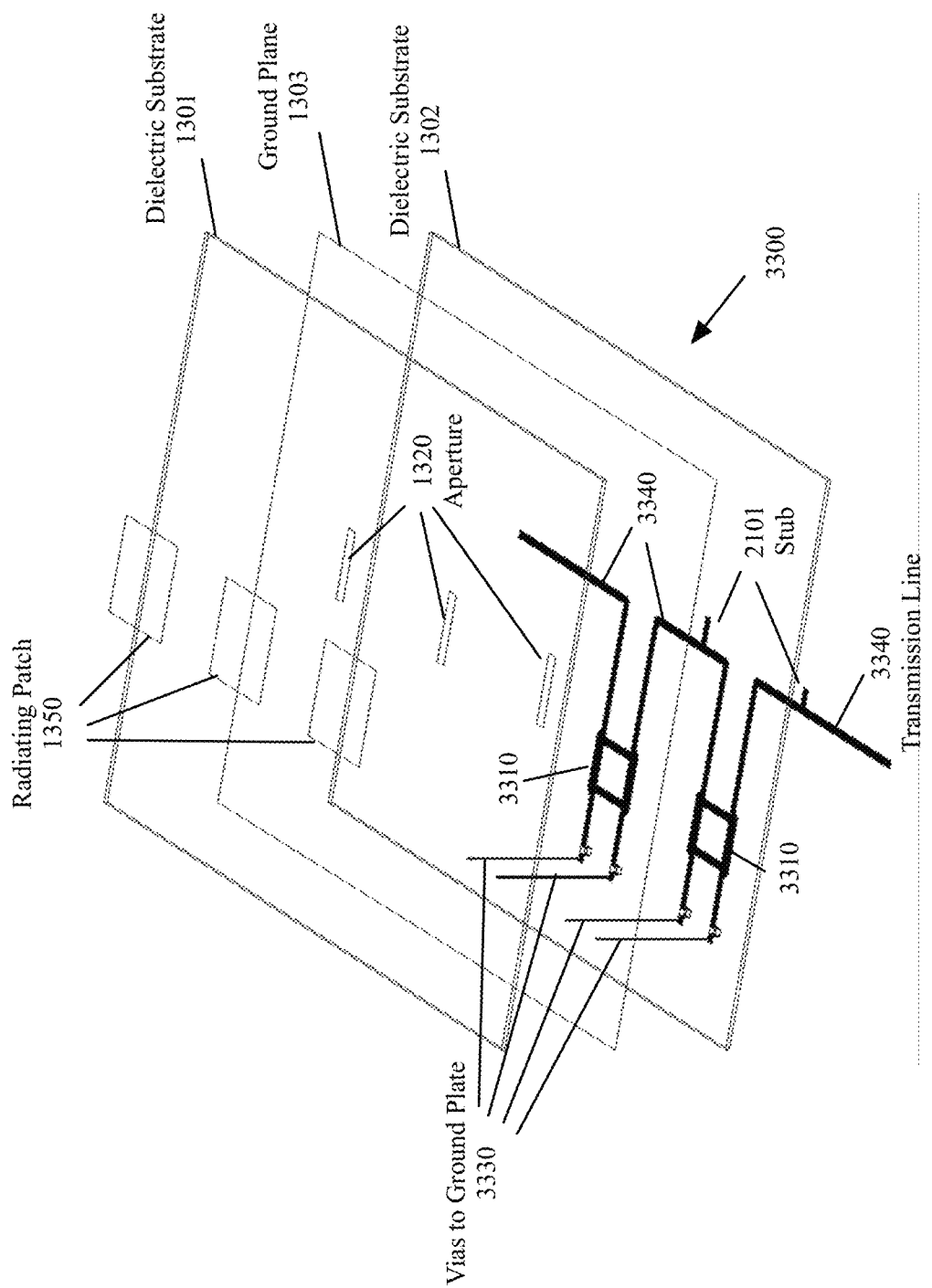

FIG. 33A illustrates the top view, FIG. 33B illustrates a trimetric view, and FIG. 33C illustrates an exploded view of the structure of a 3-element series aperture coupled fed phased array, according to an example implementation of the present application.

Figure 34:
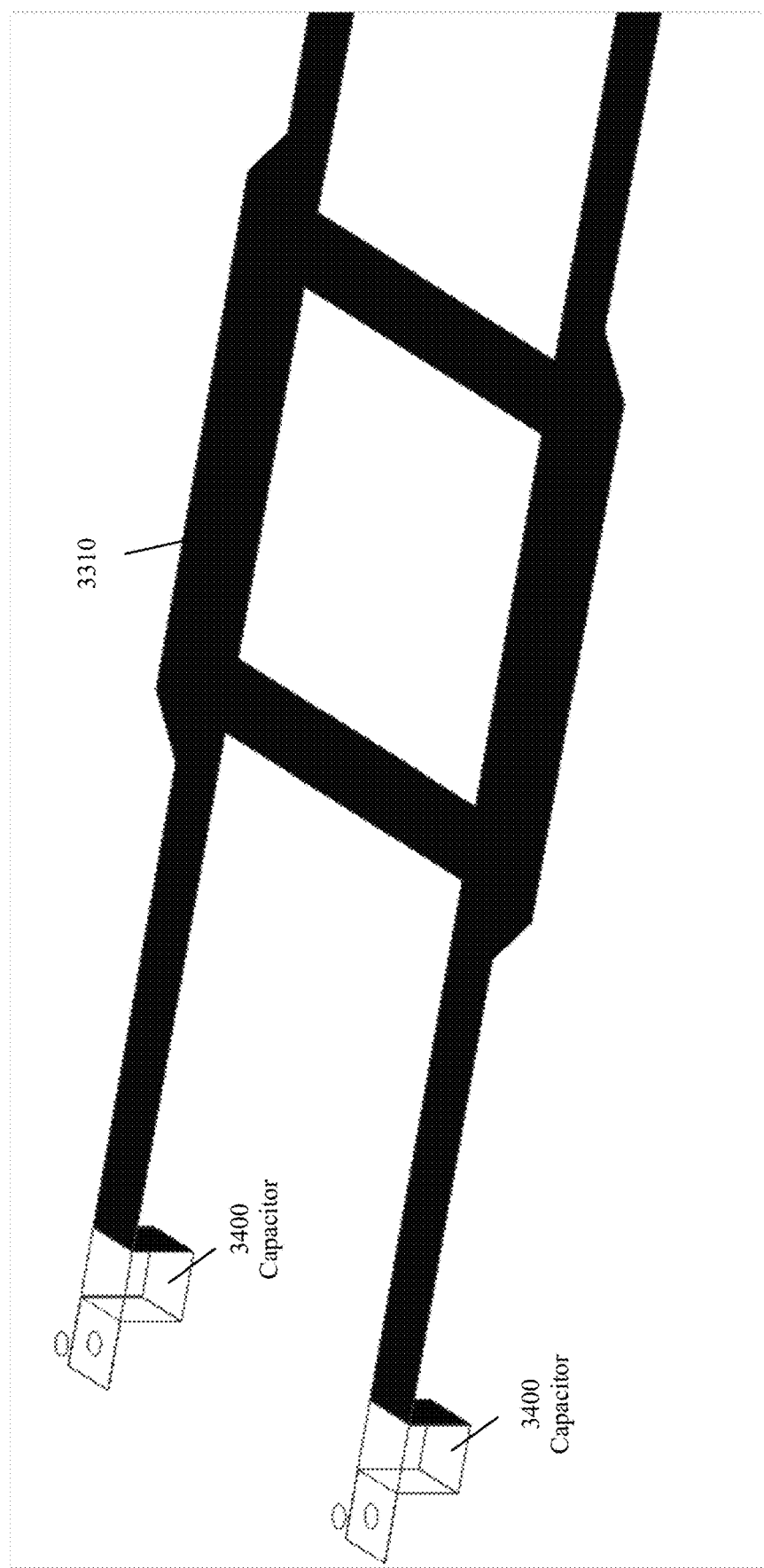

FIG. 34 illustrates each phase shifter unit being tuned by 2 parallel-plate capacitors attached to the end of quadrature hybrid structure, according to an example implementation of the present application.

Figure 35:
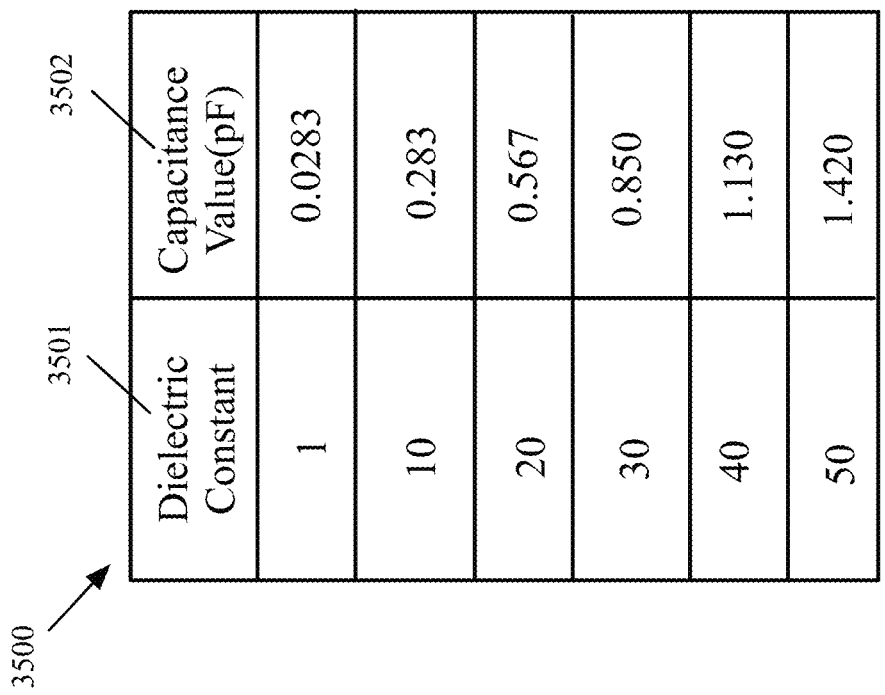

FIG. 35 shows a table for the dielectric constant values and the capacitor values used for the simulation, according to an example implementation of the present application.

FIGS. 36A, 36B, 36C, 36D, 36E, ad 36F illustrate beamforming performances with the capacitance values of 0.0283 pF, 0.283 pF, 0.567 pF, 0.850 pF, 1.130 pF, and 1.420 pF respectively, according to an example implementation of the present application.

FIGS. 37A-37F show the general beamforming performances in polar diagram of radiation pattern in terms of the capacitance value for E-plane (Phi=0 degrees) and H-plane (Phi=90 degrees), according to several example implementations of the present application.

Figure 38:
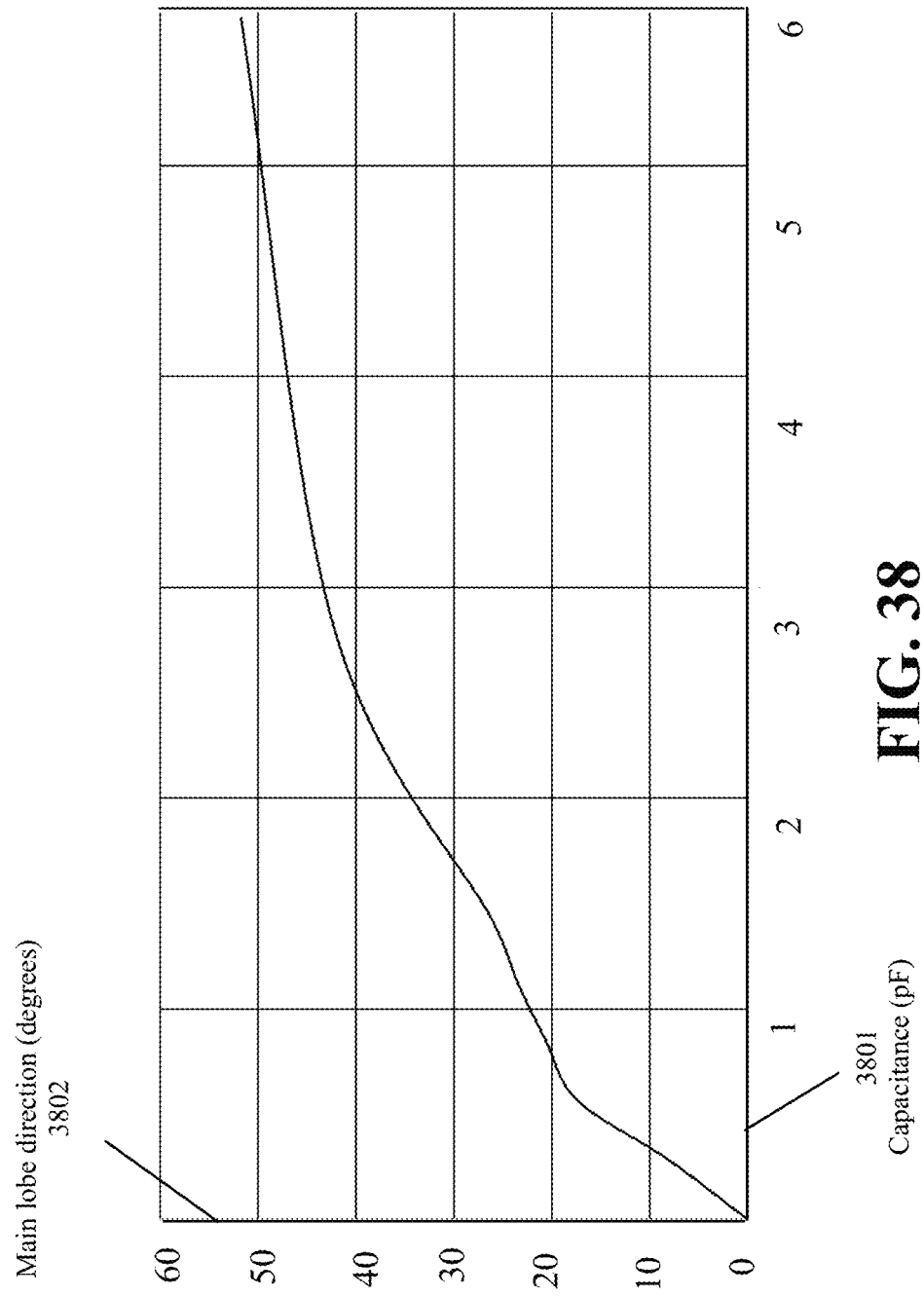

FIG. 38 illustrates the main lobe direction in degrees in terms of the capacitance values in pF, according to an example implementation of the present application.

Figure 39:
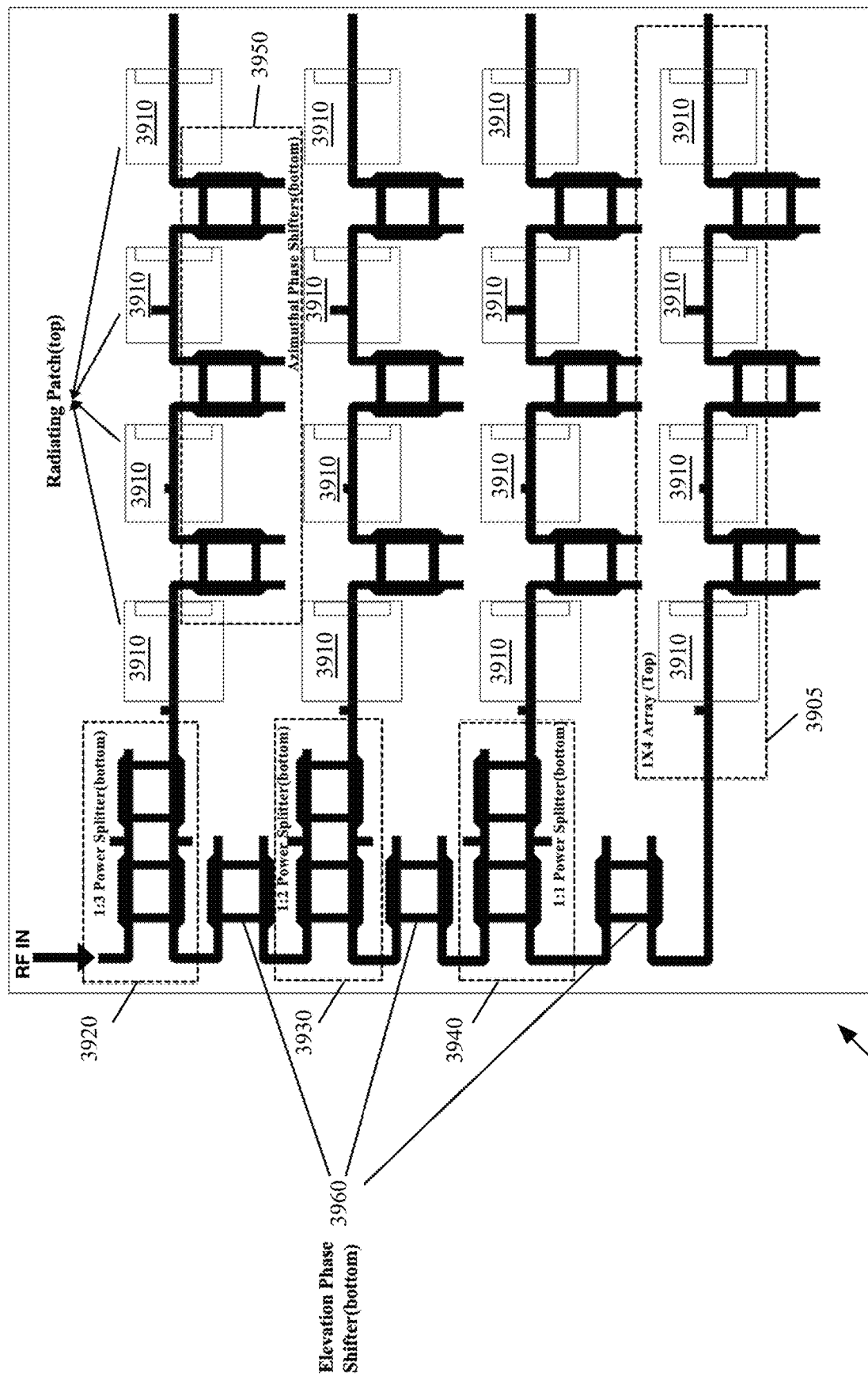

FIG. 39 illustrates the layout of a 4×4 series aperture coupled fed phased array, according to an example implementation of the present application.

Figure 40:
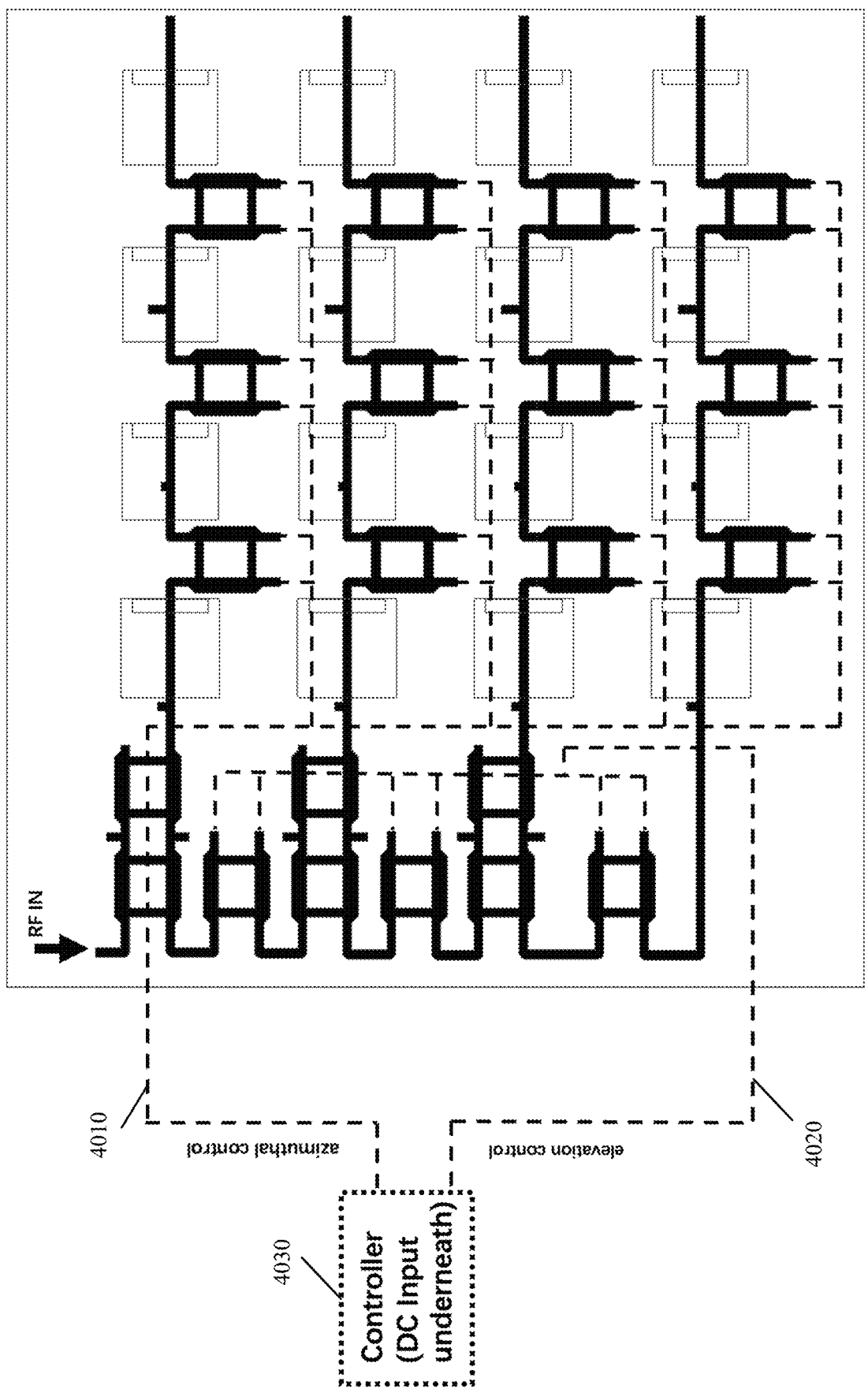

FIG. 40 illustrates the layout of a 4×4 series aperture coupled fed phased array with control system, according to an example implementation of the present application.

DETAILED DESCRIPTION

The following description contains specific information pertaining to example implementations in the present disclosure. The drawings in the present disclosure and their accompanying detailed description are directed to merely example implementations. However, the present disclosure is not limited to merely these example implementations. Other variations and implementations of the present disclosure will occur to those skilled in the art. Unless noted otherwise, like or corresponding elements among the figures may be indicated by like or corresponding reference numerals. Moreover, the drawings and illustrations in the present disclosure are generally not to scale and are not intended to correspond to actual relative dimensions.

For the purpose of consistency and case of understanding, like features may be identified (although, in some examples, not shown) by the same numerals in the example figures. However, the features in different implementations may be differed in other respects, and thus shall not be narrowly confined to what is shown in the figures.

The description uses the phrases "in one implementation," or "in some implementations," which may each refer to one or more of the same or different implementations. The term "coupled" is defined as connected, whether directly or indirectly through intervening components, and is not necessarily limited to physical connections. The term "comprising." when utilized, means "including, but not necessarily limited to"; it specifically indicates open-ended inclusion or membership in the so-described combination, group, series and the equivalent. The expression "at least one of A, B and C" or "at least one of the following: A, B and C" means "only A, or only B, or only C, or any combination of A, B and C."

Furthermore, any two or more of the following paragraphs, (sub)-bullets, points, actions, behaviors, terms, alternatives, examples, or claims in the present disclosure may be combined logically, reasonably, and properly to form a specific method. Any sentence, paragraph, (sub)-bullet, point, action, behaviors, terms, or claims in the present disclosure may be implemented independently and separately to form a specific method. Dependency, e.g., "based on", "more specifically", "preferably", "In one embodiment", "In one implementation", "In one alternative", in the present disclosure may refer to just one possible example that would not restrict the specific method.

Additionally, for the purposes of explanation and non-limitation, specific details, such as functional entities, techniques, protocols, standard, and the like are set forth for providing an understanding of the described technology. In other examples, detailed description of well-known methods, technologies, systems, architectures, and the like are omitted so as not to obscure the description with unnecessary details.

The term "and/or" herein is only an association relationship for describing associated objects, and represents that three relationships may exist. For example, A and/or B may indicate that: A exists alone, A and B exist at the same time, or B exists alone. In addition, the character "/" herein generally represents that the former and latter associated objects are in an "or" relationship.

I. Phase Shifter

Some of the present implementations provide phase shifters that rely on a reflected wave from a load. The load, in some implementations, may include a variable capacitance that may be varied by an external bias voltage. The phase shifters in some of the present implementations may include a directional coupler. The directional coupler, in some implementations, may be a quadrature hybrid. The directional coupler, in some implementations, may be a circulator.

Figure 1:
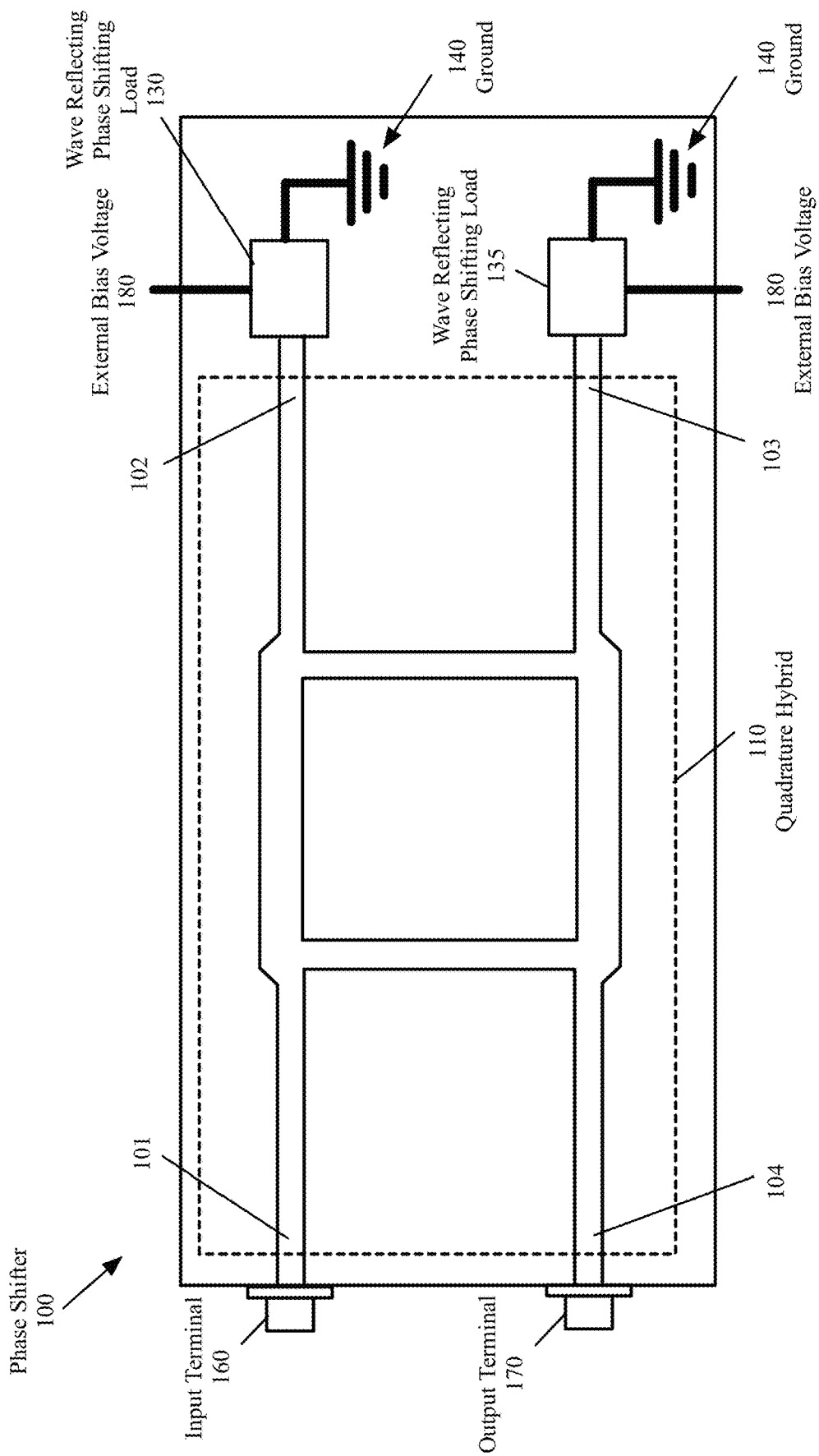
FIG. 1 is a schematic diagram illustrating a phase shifter with a four-port quadrature hybrid where two ports out of the four ports are connected to two shorted loads, and the other two ports are attached to the input and output terminals of the phase shifter, according to an example implementation of the present application.

FIG. 1 is a schematic diagram illustrating a phase shifter 100 with a four-port quadrature hybrid 110 where two ports out of the four ports are connected to two shorted loads 130 and 135, and the other two ports are attached to the input and output terminals of the phase shifter, according to an example implementation of the present application.

Figure 2:
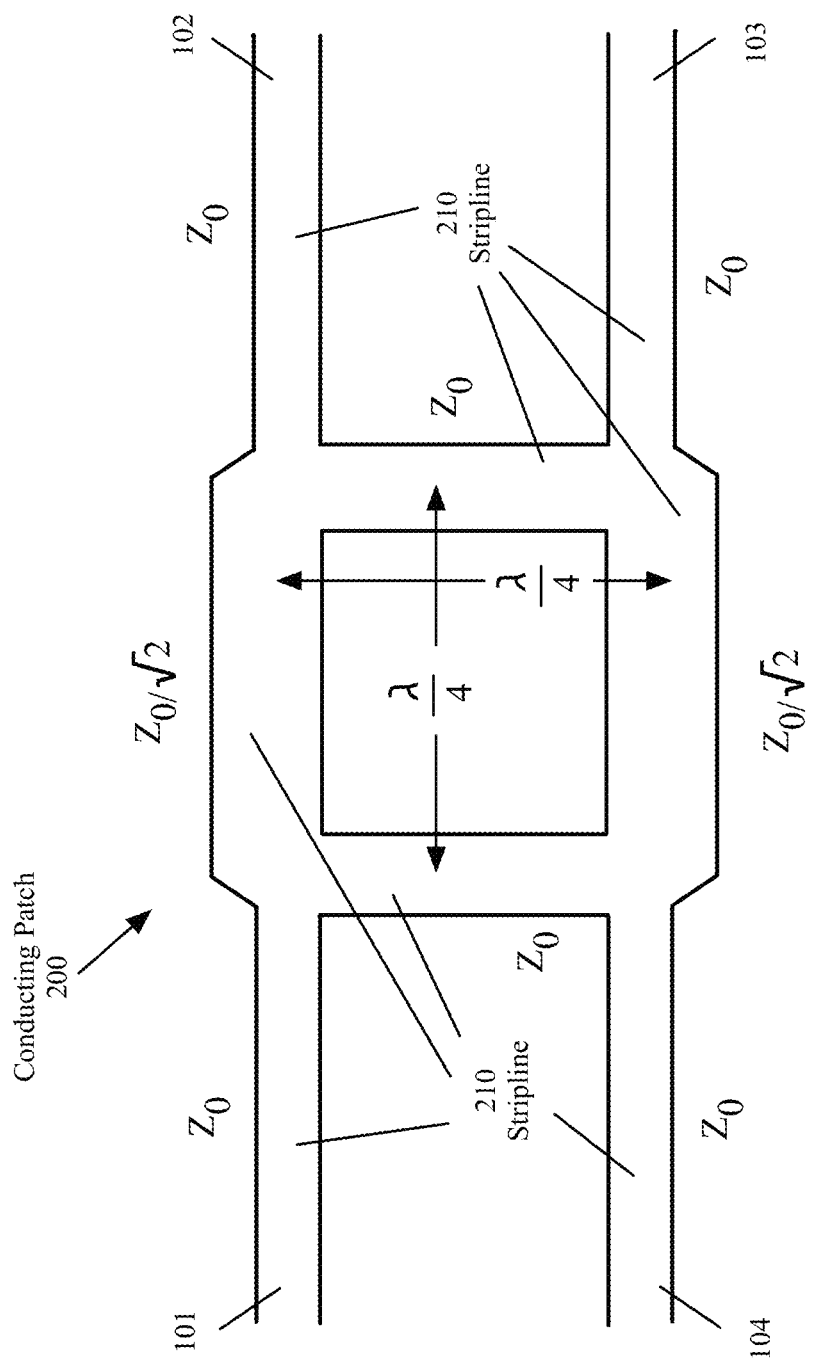
FIG. 2 is a schematic diagram illustrating a quadrature hybrid that includes a conducting surface on the top surface of a substrate backed by a ground plane, according to an example implementation of the present application.

FIG. 2 is a schematic diagram of the conducting surface on the top surface of a substrate backed by a ground plane of an example quadrature hybrid, such as the quadrature hybrid 110 of FIG. 1. With reference to FIG. 2, a conducting patch 200, such as a copper layer, may be placed on the top surface of a substrate. The bottom surface of the substrate may be covered by a ground plane. The conducting patch 200 may include a plurality of striplines 210, each section of the striplines may have a characteristic impedance as specified in the diagram.

The lengths of the segments at the center portion of the conducting patch 200 are ¼ of the wavelength of the operating frequency, λ, of the quadrature hybrid, as shown in FIG. 2. The lengths are measured from the centers of the corresponding striplines. The input RF signals fed at port 101 are split between ports 102 and 103 with −90 degrees and −180 degrees of phase shift while the quadrature hybrid structure isolates port 104 from the input RF signals. The wave reflecting phase shifting loads 130 and 135 (e.g., the variable capacitors 320 and 325 described below with reference to FIG. 3), in some implementations, may also be positioned on the top surface of the substrate.

With reference to FIG. 1, the loads 130 and 135 may include a variable capacitance that may be varied by an external bias voltage 180. The input RF signal from the input terminal 160 may be sent to the variable loadings 130 and 135 and the reflected wave from the loads may be channeled to the output port of the phase shifter via a network that takes the input signal without much reflection to the input terminal 160 but passes most of the power from the variable load to the output terminal 170 with a phase change depending on the variable bias input 180 of the loading. Such network to steer the input to the variable loading and send the signal reflected from the loading to the output port without much reflection may include the quadrature hybrid 110 or a circulator (e.g., as described below with reference to FIGS. 8-10). The resulting devices provide a compact low-loss phase shifter without much power consumption of the control input. Several examples of the phase shifters of the present implementations are described below with reference to FIGS. 3 and 6-10.

Figure 3:
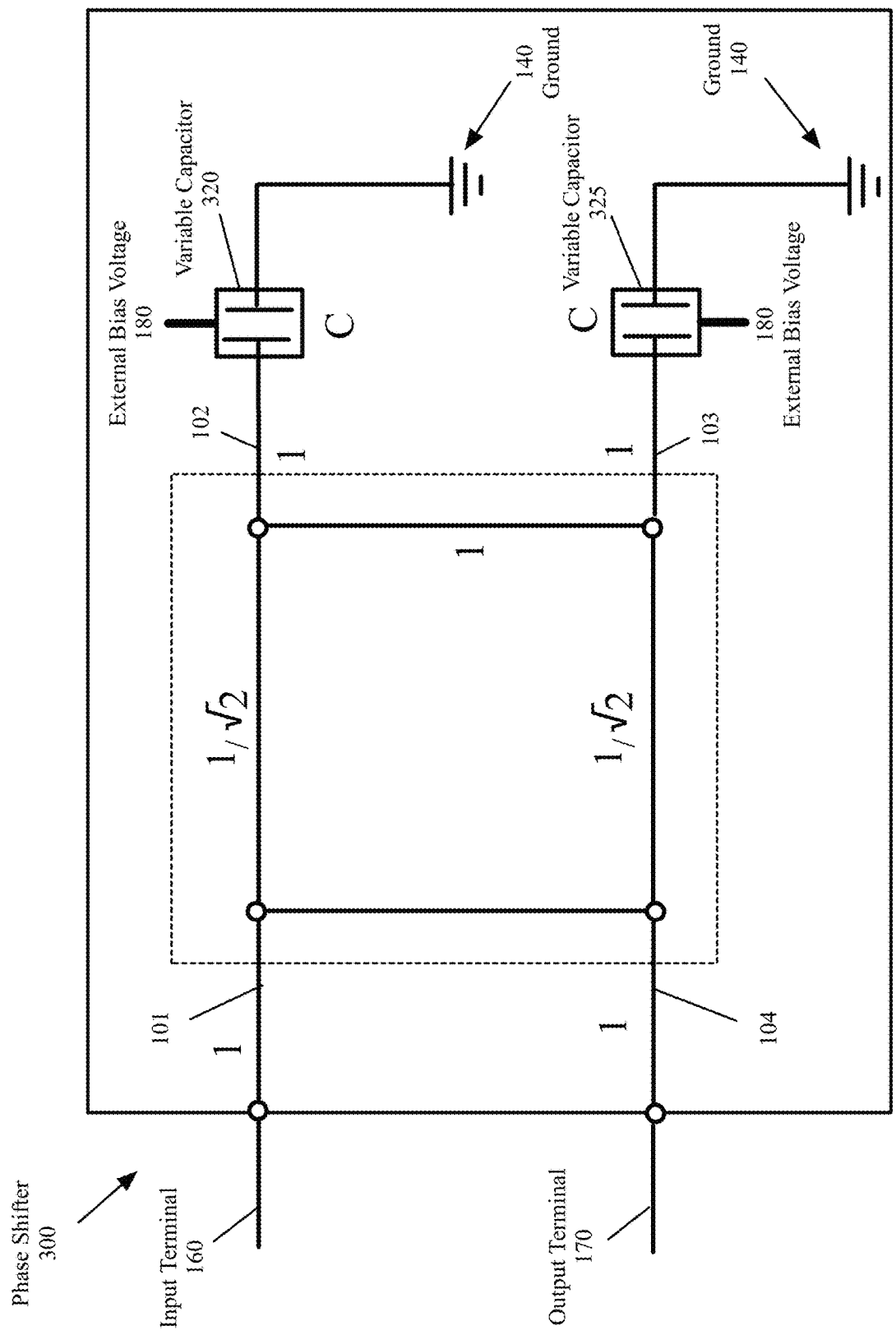
FIG. 3 is a schematic diagram illustrating a phase shifter with a four-port quadrature hybrid where two ports out of the four ports are connected to shorted identical variable capacitors, and the other two ports are attached to the input and output terminals of the phase shifter, according to an example implementation of the present application.

FIG. 3 is a schematic diagram illustrating a phase shifter 300 with a four-port quadrature hybrid where two ports out of the four ports are connected to shorted identical variable capacitors, and the other two ports are attached to the input and output terminals of the phase shifter, according to an example implementation of the present application.

With reference to FIG. 3, the phase shifter 300 may include a quadrature hybrid 110 and two variable capacitors 320 and 325. The variable capacitors' reactance may be changed by changing the external bias voltage 180. As such, the reflection coefficient of the wave reflected from a variable capacitor terminated port may be varied by the bias voltage.

Figure 4A:
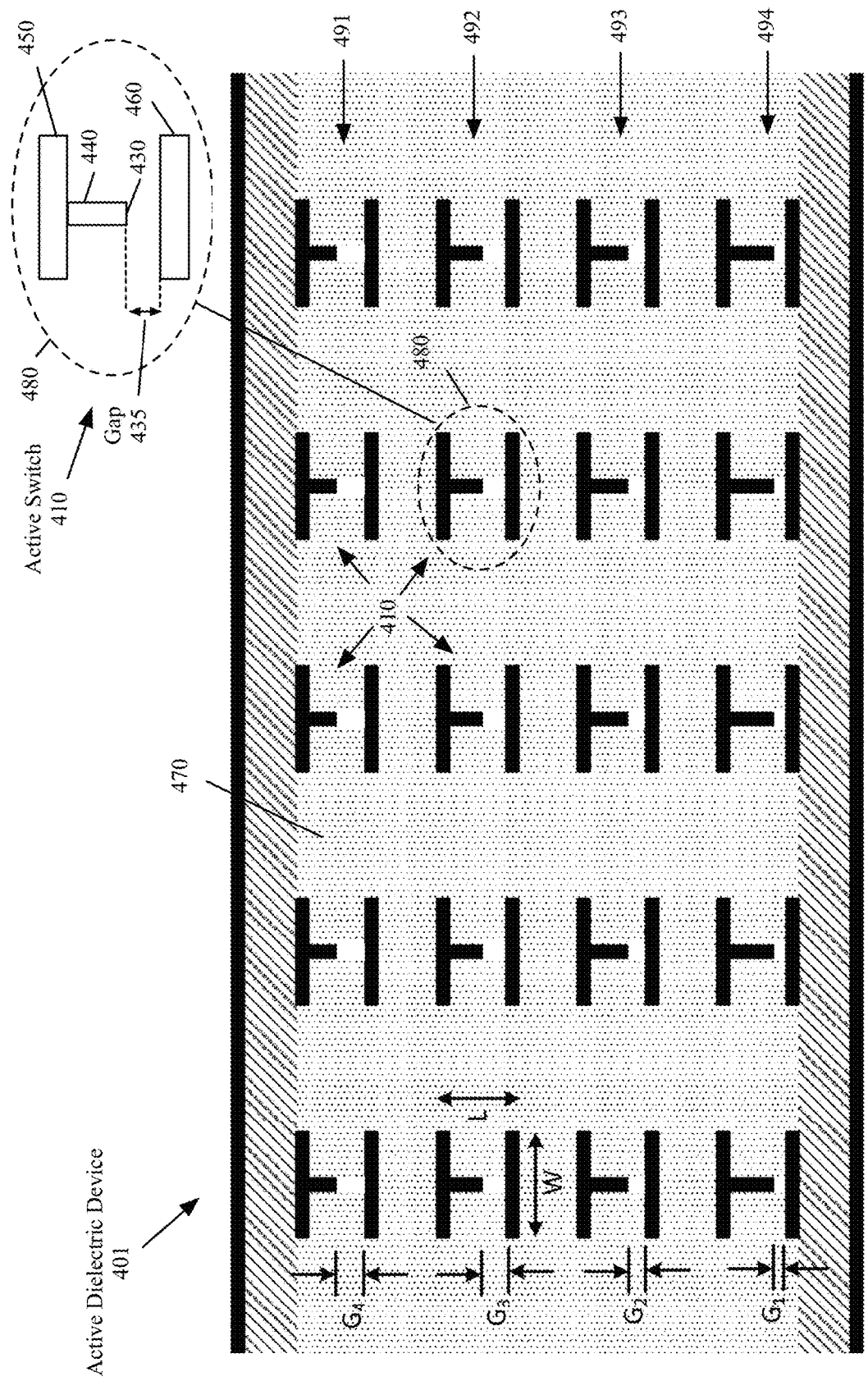
FIG. 4A illustrates an active dielectric device, according to prior art.

The variable capacitors 320 and 325 may be implemented as active dielectric devices. FIG. 4A illustrates an active dielectric device 401, according to prior art. The active dielectric device 401 may include a plurality of active switches 410. As shown by the expanded view 480, each active switch 410 may include a first conducting element 450 and a second conducting element 460. Each active switch 410 may include a conducting pin 440 that may be connected to the conducting element 450. The active dielectric device 401 may include dielectric material 470, such as polyimide and/or polyester.

The active switches 410 may be arranged in the active dielectric device 401 such that the dielectric constant of the active switches 410 may be varied by applying a bias voltage (e.g., to the first conducting element 450 and a second conducting element 460 of the active switches 410). The active dielectric device 401 may include a plurality of layers 491-494. It should be noted that, although FIGS. 4A, 4B, 4D and 4F show active switches with four layers, the active switches may include fewer or more layers than four. The active switches 410 may be arranged in a plurality of rows and columns (e.g., each row may be across one of the layers 491-494 and the columns may be vertical to the rows).

With reference to FIG. 4A, each layer 491-494 may have its own dielectric breakdown and there may be variation of breakdown voltage in the vertical direction (i.e., the direction perpendicular to the conducting elements 450 and 460 of the active switches 410). As the applied bias voltage increases, the number of breakdown layers goes up and the capacitance of the device 401 becomes larger, thus effectively controlling the capacitance by the applied bias voltage. The breakdown voltage of each active switch 410 is determined by the gap 435 (as shown in the expanded view 480) between the tip 430 of the pin 440 and the conducting element 460. Thus, controlling the gap 435 may vary the breakdown field. The active switches have a length (L) and a width (W) and may be evenly spaced throughout the dielectric material 470. In FIG. 4A, the conductive elements 450 and 460 are increasingly spaced apart from bottom to top: $G_1 < G_2 < G_3 < G_4$. Further details of the active dielectric device 401 are described in U.S. Pat. No. 10,854,761, by Choon Sae Lee, et al. The entire contents of U.S. Pat. No. 10,854,761 are hereby incorporated by reference.

Figure 4B:
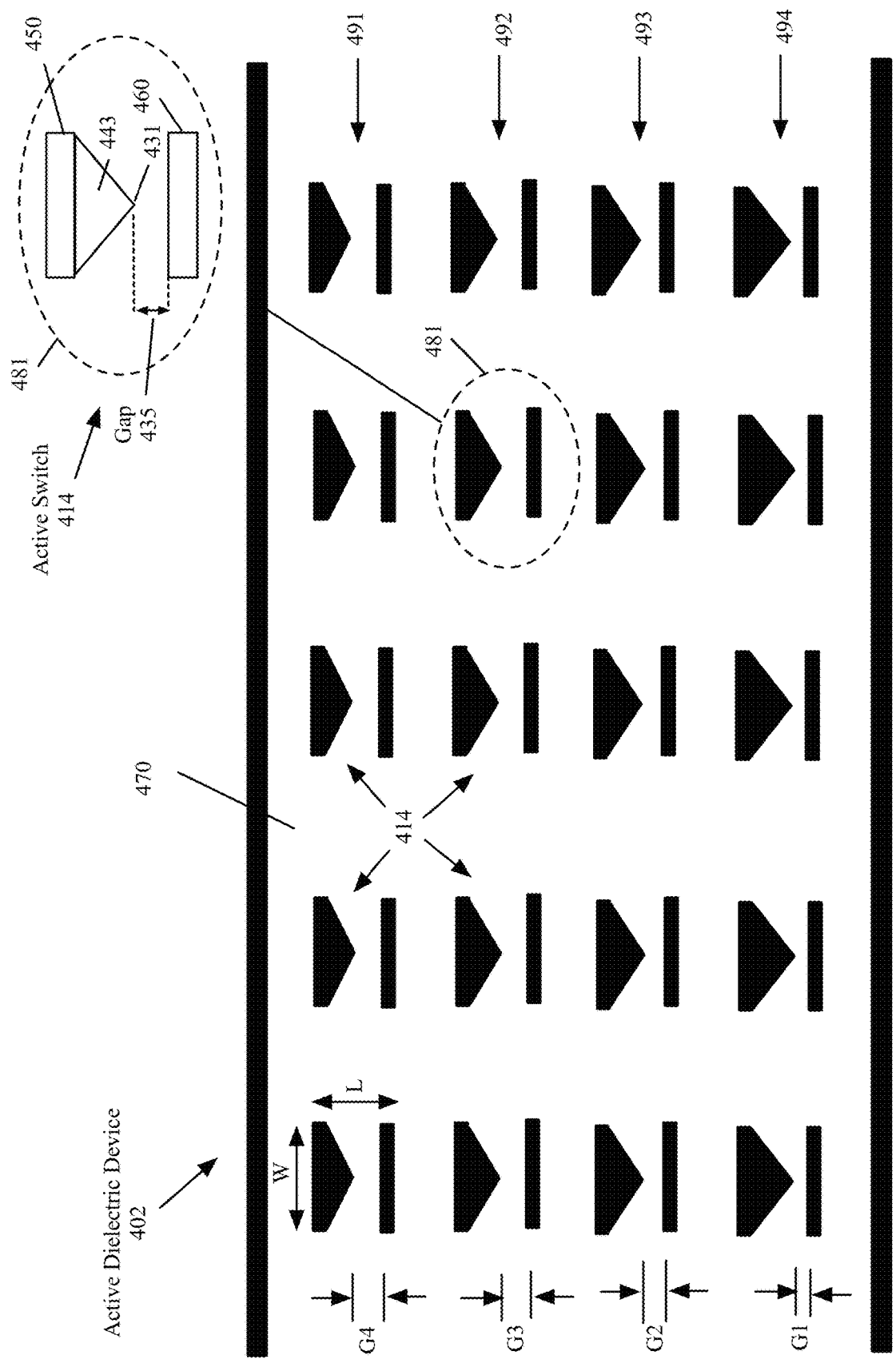
FIG. 4B illustrates an active dielectric device where the active switches include a triangular plate, according to an example implementation of the present application.

FIG. 4B illustrates an active dielectric device 402 where the active switches include a triangular plate 443, according to an example implementation of the present application. The active dielectric device 402 may include dielectric material 470, such as polyimide and/or polyester. The active dielectric device 402 may include a plurality of layers 491-494. Each layer 491-494 may have its own dielectric breakdown and there may be variation of breakdown voltage in the vertical direction (i.e., the direction perpendicular to the conducting elements 450 and 460 of the active switches 414). The active switches 414 may be arranged in a plurality of rows and columns (e.g., each row may be across one of the layers 491-494 and the columns may be vertical to the rows).

The active dielectric device 402 may include a plurality of active switches 414. Each active switch 414 may include two conducting elements 450 and 460. However, unlike the active switches 410 of the prior art active dielectric device 401 (FIG. 4A), the active switches 414 of the active dielectric device 402 may include a conducting triangular plate 441 instead of a conducting pin 440.

As shown in the expanded view 481, the active switch 414 may include a conducting triangular plate 443 that may be connected to the conducting element 450. The active switches 414 may be arranged in the active dielectric device 402 such that the dielectric constant of the active switches 414 may be varied by applying a bias voltage (e.g., to the first conducting element 450 and a second conducting element 460 of the active switches 414). As the applied bias voltage increases, the number of breakdown layers goes up and the capacitance of the device 402 becomes larger, thus effectively controlling the capacitance by the applied bias voltage. The breakdown voltage of each active switch 414 is determined by the gap 435 between the tip 431 of the triangular plate 443 and the conducting element 450. Thus, controlling the gap 435 may vary the breakdown field. The active switches have a length (L) and a width (W) and may be evenly spaced throughout the dielectric material 470. In FIG. 4B, the conductive elements 450 and 460 are increasingly spaced apart from bottom to top such that: $G_1<G_2<G_3<G_4$.

The active dielectric device 402 of FIG. 4B provides the technical advantage over the prior art active dielectric device 401 of FIG. 4A by replacing the pin 440 with the triangular plate 443. In the off state, both active dielectric devices 401 and 402 block the flow of the electromagnetic wave and there is no issue with the wave reflection. In the on state, the conducting pin 440 and the conducting element 450 of the prior art active switches 410 are connected with a close to vertical angle, causing wave reflection, which is undesirable. The conducting triangular plate 443 of FIG. 4B makes a smooth angle with the conducting element 450, which mitigates the wave reflection. It should be noted that any conducting plate that makes a smooth angle with the conducting element 450 and includes a narrow tip may be used instead of a conducting triangular plate 443 without departing from the scope of the disclosure.

The prior art active dielectric device 401 (FIG. 4A) requires a quadrature hybrid, a quarter-wavelength, or a half-wavelength transformer in order to act as a switch. The active dielectric device 402 of FIG. 4B provides the technical advantage of being used as a switch in RF circuits without requiring a quadrature hybrid.

Figure 4C:
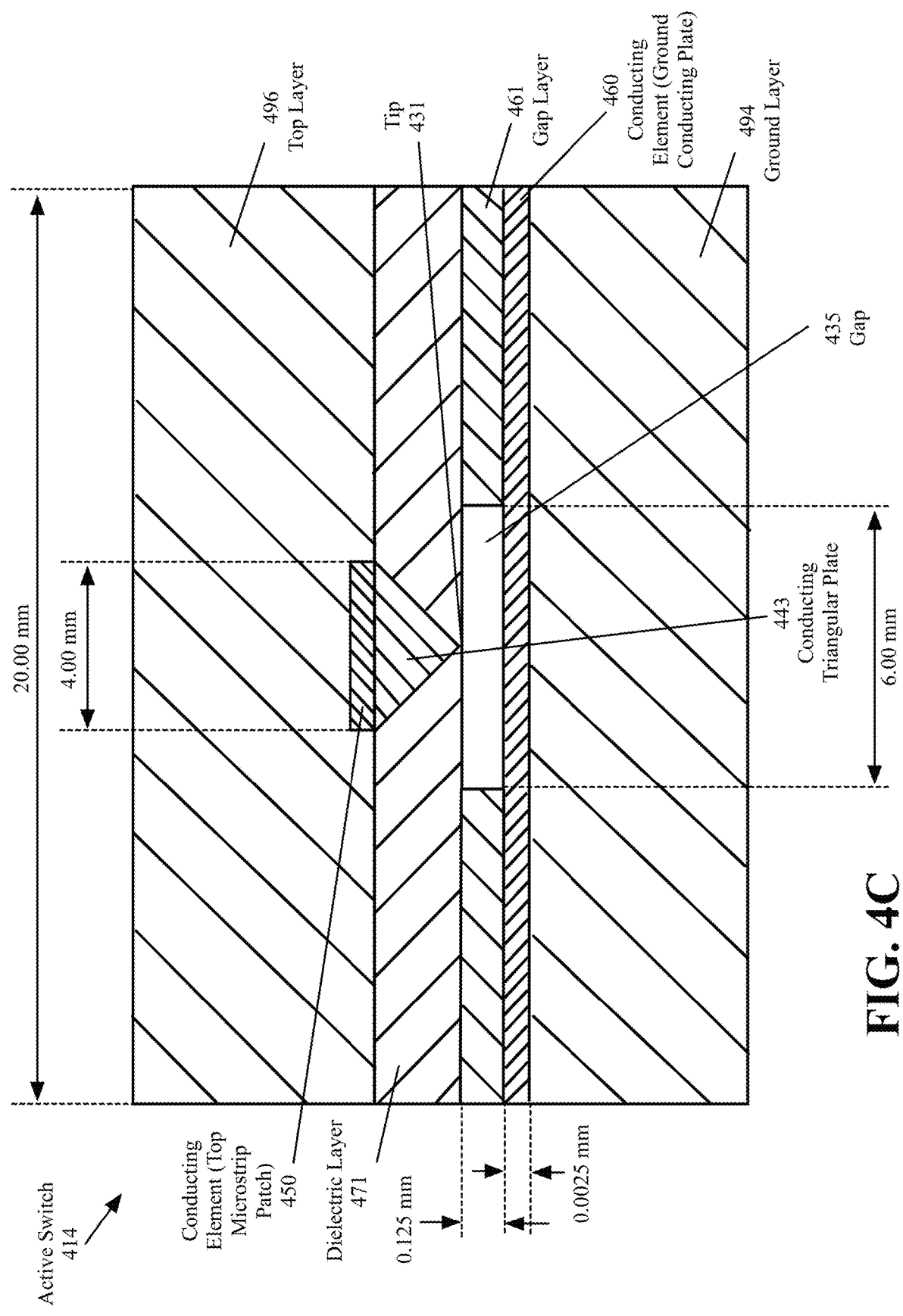
FIG. 4C illustrates an example active switch, according to an example implementation of the present application.

FIG. 4C illustrates an example active switch 414, according to an example implementation of the present application. The active switch 414 may be any of the active switches 414 of FIG. 4B. The active switch 414 may include a conducting element 450 (e.g., a top microstrip patch) and a conducting element 460 (e.g., ground plane). The conducting triangular plate 443 may be connected to the conducting element 450. The tip 431 of the conducting triangular plate 443 is very close to the bottom conducting element 460 to form an gap 435 (e.g., filled with air or one or more gases). When a voltage is applied across the parallel plates of the two conducting elements 450 and 460, the fields become most intense in the gap 435 between the tip 431 of the conducting triangular plate 443 and the conducting element 460. The gap distance should be as small as possible which may result in a low applied voltage for dielectric breakdown.

As a non-limiting example, the dielectric layer 471, in some implementations, may be polyimide (PI) film with a thickness of 0.125 mm. A hole is made and filled with conducting ink before being cured for solidification to form the conducting triangular plate 443. In order to have a gap 435 of consistent separation distance, a thin polyester film (gap layer 461) of 2.5 μm is placed between the dielectric layer 471 (PI film substrate) and the conducting element 460, which may be a copper plate. A portion of the polyester layer 472 is removed to have a gap 435 between the tip 431 of the conducting triangular plate 443 and the conducting plat 460. The size of the conducting element 450 in this example is 4 mm×6 mm. The gap 435 is sufficiently large to cover the entire conducting element 450. The top and bottom substrate layers 496 and 494 (e.g., dielectric layers like Rogers RO4003) provide mechanical support of the active switch 414. Thus, the active switch 414 may be used as a microstrip antenna if the feed line is connected.

Figure 4D:
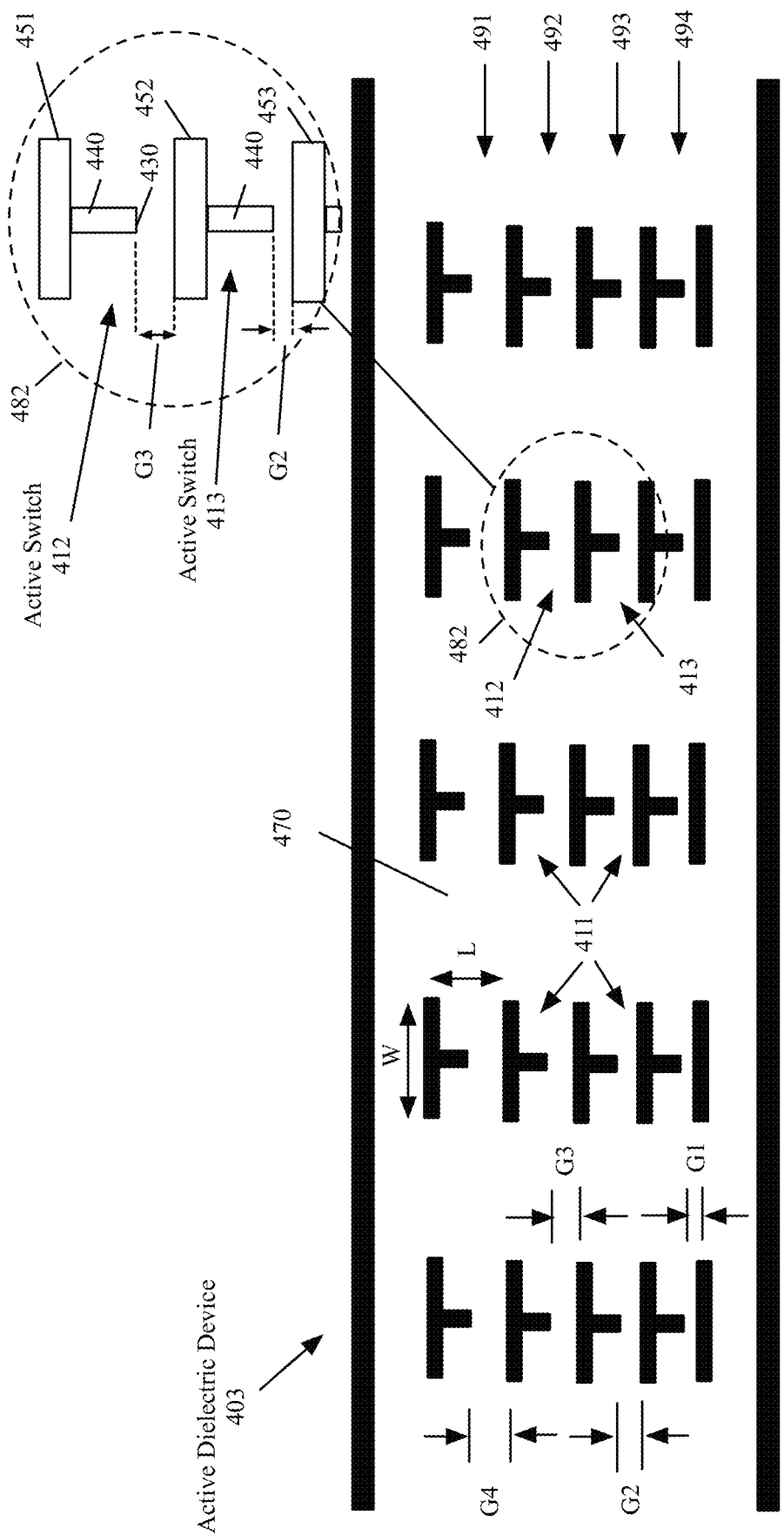
FIG. 4D illustrates an active dielectric device where the conducting elements of the active switches that are stacked on top of each other share conducting elements, according to an example implementation of the present application.

FIG. 4D illustrates an active dielectric device 403 where the conducting elements of the active switches that are stacked on top of each other share conducting elements, according to an example implementation of the present application. The active dielectric device 403 may include dielectric material 470, such as polyimide and/or polyester. The active dielectric device 403 may include a plurality of layers 491-494. Each layer 491-494 may have its own dielectric breakdown and there may be variation of breakdown voltage in the vertical direction (i.e., the direction perpendicular to the conducting elements 451 and 452 of the active switches 412-413). The active switches 411-413 may be arranged in a plurality of rows and columns (e.g., each row may be across one of the layers 491-494 and the columns may be vertical to the rows).

The active dielectric device 403 may include a plurality of active switches 411-413. Each active switch 411-413 may include two conducting elements. However, unlike the active switches 410 of the prior art active dielectric device 401 (FIG. 4A), the active switches 411-413 of the active dielectric device 403 that are stacked above each other may share conducting elements.

For example, the active switch 412 shown in the expanded view 481 may include a first conducting element 451 and a second conducting element 452. The active switch 412 may include a conducting pin 440 that may be connected to the conducting element 451. The conducting element 452 is shared between the active switch 412 and 413. As shown in the expanded view 482, the conducting pin 440 of the active switch 413 is connected to the conducting element 452. The active switch 413 share the conducting element 453 with the active switch that is directly below it. Except for the active switches on the top layer 491, the conducting pin 440 of the active switches in other layers 492-494 is connected to a conducting element that is shared with the active switch that is located in the layer directly above.

The active switches 411-413 may be arranged in the active dielectric device 403 such that the dielectric constant of the active switches 411-413 may be varied by applying a bias voltage (e.g., to the first conducting element 451 and a second conducting element 452 of the active switch 412). As the applied bias voltage increases, the number of breakdown layers goes up and the capacitance of the device 403 becomes larger, thus effectively controlling the capacitance by the applied bias voltage. The breakdown voltage of each active switch 411-413 is determined by the gap 435 between the tip 430 of the pin 440 and the conducting element that is directly below the tip. Thus, controlling the gap 435 may vary the breakdown field. The active switches have a length (L) and a width (W) and may be evenly spaced throughout the dielectric material 470. In FIG. 4D, the conductive elements are increasingly spaced apart from bottom to top such that: $G_1<G_2<G_3<G_4$.

The active dielectric device 403 of FIG. 4D provides the technical advantage over the prior art active dielectric device 401 of FIG. 4A by sharing at least one conducting element by each pair of vertically adjacent active switches, which makes the active dielectric device 403 more compact than a prior art active dielectric device 401 with the same number of layers and active switches.

Figure 4E:
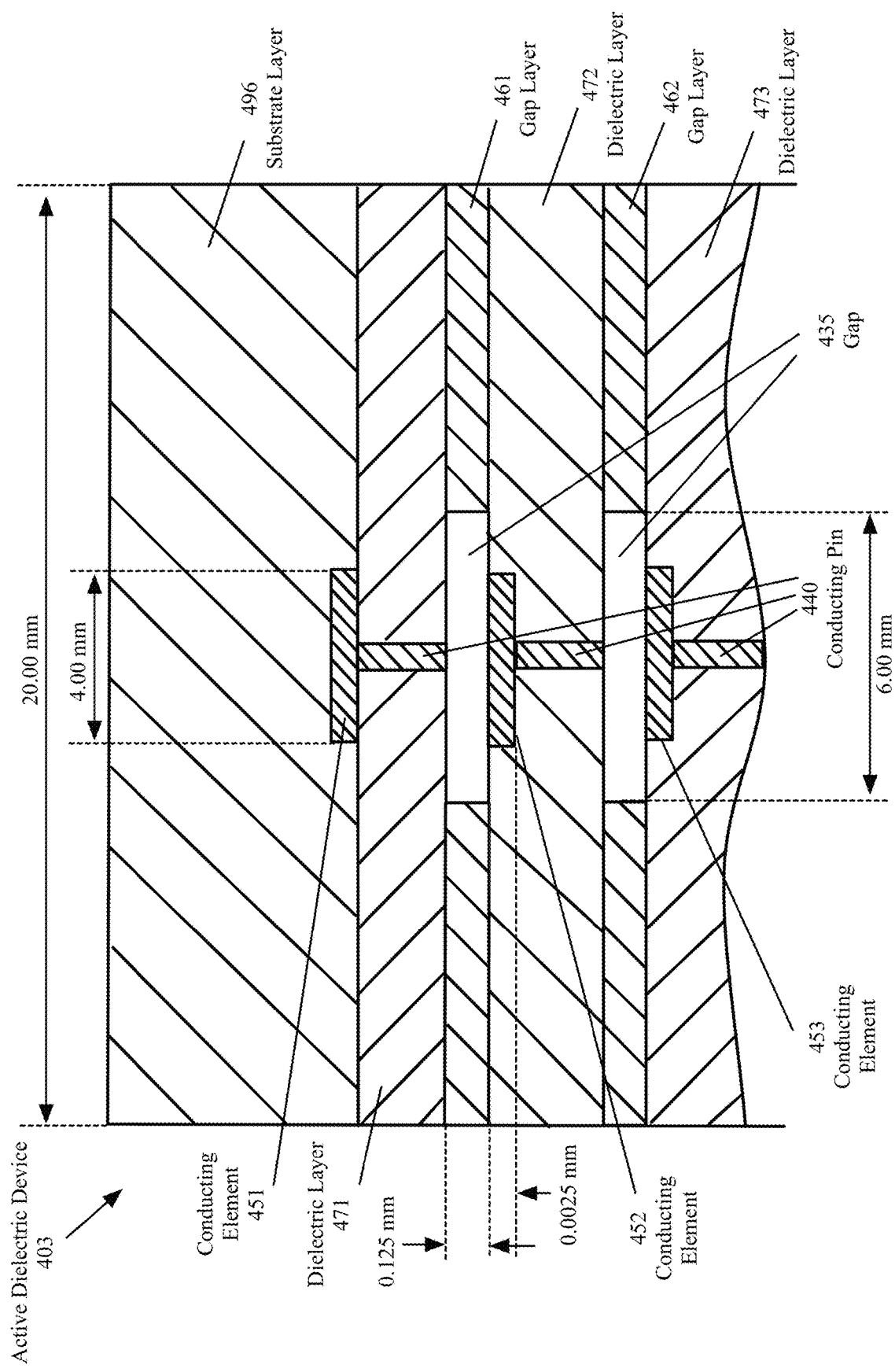
FIG. 4E illustrates a portion of the active dielectric device of FIG. 4D, according to an example implementation of the present application.

FIG. 4E illustrates a portion of the active dielectric device 403 of FIG. 4D, according to an example implementation of the present application. The portion of the active dielectric device 403 shown in FIG. 4D may include the active switches 412 and 413 shown in the expanded view 482 of FIG. 4D.

Each conducting pin 440 may be connected to a conducting element 451-453. The tip of each conducting pin 440 is very close to the bottom conducting element to form a gap 435. When a voltage is applied across the two parallel conducting elements (e.g., the conducting elements 451 and 452), the fields become most intense in the gap 435 between the tip of the conducting pin 440 and the lower conducting element. The gap distance should be as small as possible which may result in a low applied voltage for dielectric breakdown.

As a non-limiting example, the dielectric layers 471-473, in some implementations, may be polyimide (PI) film with a thickness of 0.125 mm. A hole or a via is made and filled with conducting ink before being cured for solidification to form each conducting pins 440. In order to have gaps 435 of consistent separation distance, a thin polyester film (e.g., the gap layer 461) of 2.5 μm is placed between the dielectric layers 471 and 472 (PI film substrate). The conducting elements 451-453 may be copper plates. The size of the conducting elements 451-453 in this example is 4 mm×6 mm. The gap 435 is sufficiently large to cover the entire conducting elements 451-453. The top layer 496 and the bottom substrate layers (not shown in FIG. 4E but is similar to the bottom substrate layer 494 of FIG. 4C) may be, for example, dielectric layers like Rogers RO4003 and may provide mechanical support of the active switches of the active dielectric device 403.

Figure 4F:
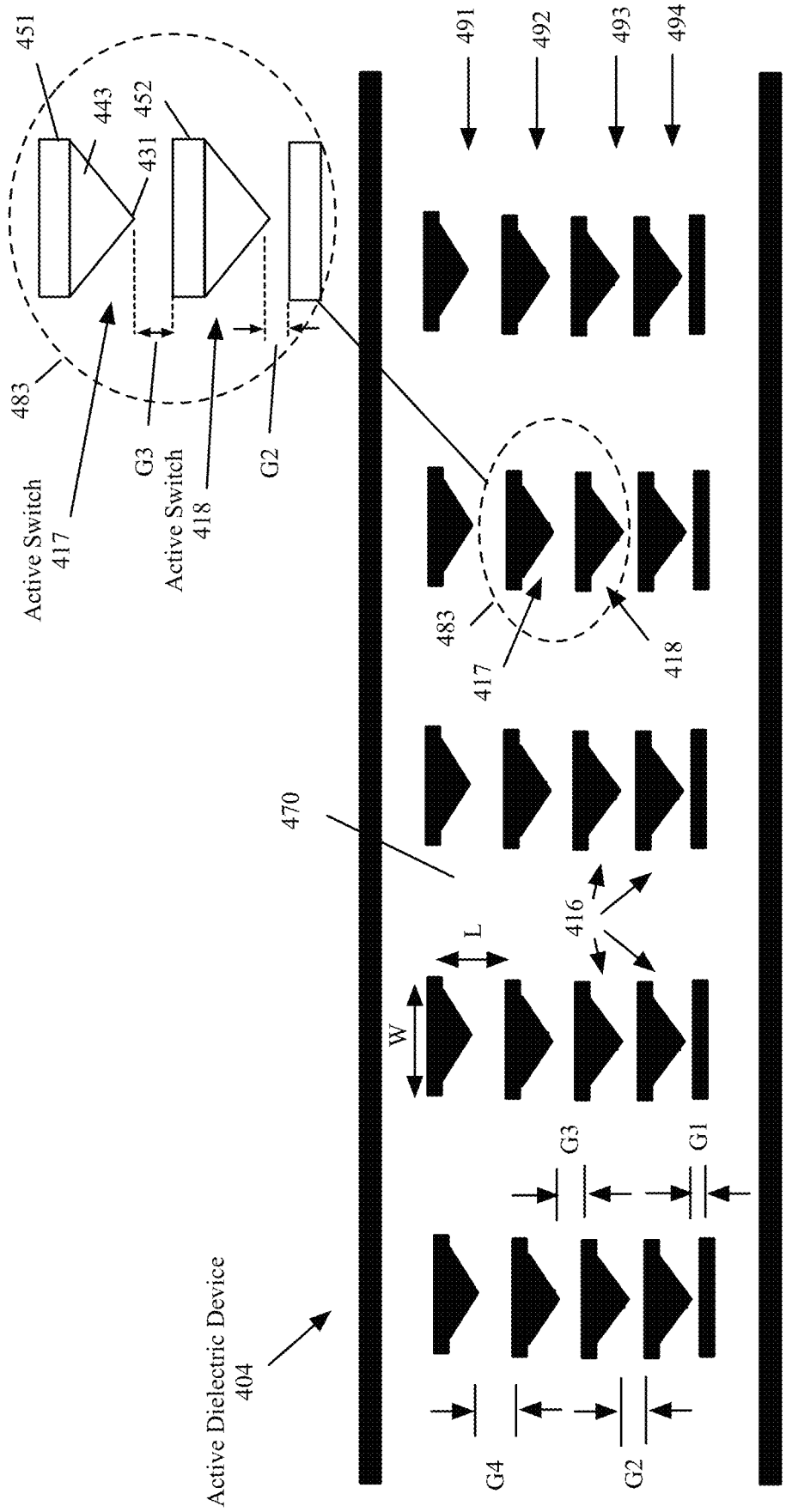
FIG. 4F illustrates an active dielectric device where each active switch includes a triangular plate and vertically stacked active switches share conducting elements, according to an example implementation of the present application.

FIG. 4F illustrates an active dielectric device 404 where each active switch includes a triangular plate 443 and vertically stacked active switches share conducting elements, according to an example implementation of the present application. The active dielectric device 404 may include dielectric material 470, such as polyimide and/or polyester. The active dielectric device 404 may include a plurality of layers 491-494. Each layer 491-494 may have its own dielectric breakdown and there may be variation of breakdown voltage in the vertical direction (e.g., the direction perpendicular to the conducting elements 451 and 442 of the active switch 417).

The active dielectric device 404 may include a plurality of active switches 416-418. Each active switch 416-418 may include two conducting elements. However, unlike the active switches 410 of the prior art active dielectric device 401 (FIG. 4A), the active switches 416-418 of the active dielectric device 404 that are stacked above each other may share conducting elements. The active switches 416-418 may be arranged in a plurality of rows and columns (e.g., each row may be across one of the layers 491-494 and the columns may be vertical to the rows).

For example, the active switch 417 shown in the expanded view 483 may include a first conducting element 451 and a second conducting element 452. The active switch 417 may include a conducting triangular plate 443 that may be connected to the conducting element 451. The conducting element 452 is shared between the active switch 417 and 418. As shown in the expanded view 483, the conducting triangular plate 443 of the active switch 418 is connected to the conducting element 452. Except for the active switches on the first layer 491, the conducting triangular plate 443 of the active switches in other layers 492-494 is connected to a conducting element that is shared with the active switch that is located in the layer directly above.

The active switches 416-418 may be arranged in the active dielectric device 404 such that the dielectric constant of the active switches 416-418 may be varied by applying a bias voltage (e.g., to the first conducting element 451 and a second conducting element 452 of the active switch 417). As the applied bias voltage increases, the number of breakdown layers goes up and the capacitance of the device 404 becomes larger, thus effectively controlling the capacitance by the applied bias voltage. The breakdown voltage of each active switch 416-418 is determined by the gap 435 between the tip 431 of the conducting triangular plate 443 and the conducting element that is directly below the tip. Thus, controlling the gap 435 may vary the breakdown field. The active switches have a length (L) and a width (W) and may be evenly spaced throughout the dielectric material 470. In FIG. 4F, the conductive elements are increasingly spaced apart from bottom to top such that: $G1<G2<G3<G4$. The active dielectric device 404 of FIG. 4F may be implemented as shown in FIG. E, except the active switches may have a conducting triangular plate instead of the conducting pins 440 of FIG. 4E.

The active dielectric device 404 of FIG. 4F provides the technical advantage over the prior art active dielectric device 401 of FIG. 4A by sharing at least one conducting element by each pair of vertically adjacent active switches, which makes the active dielectric device 404 more compact than a prior art active dielectric device 401 with the same number of layers and active switches. The active dielectric device 404 of FIG. 4F provides the technical advantage over the prior art active dielectric device 401 of FIG. 4A by replacing the pin 440 with the triangular plate 443. In the off state, both switches 401 and 404 block the flow of the electromagnetic wave and there is no issue with the wave reflection. In the on state, the conducting pin 440 and the conducting element 450 of the prior art active switches 410 are connected with a close to vertical angle, causing wave reflection, which is undesirable. The conducting triangular plate 443 makes a smooth angle with the conducting element 450, which mitigates the wave reflection. The prior art active dielectric device 401 (FIG. 4A) requires a quadrature hybrid, a quarter-wavelength, or a half-wavelength transformer in order to act as a switch. The active dielectric device 404 of FIG. 4F provides the technical advantage of being used as a switch in RF circuits without requiring a quadrature hybrid. It should be noted that any conducting plate that makes a smooth angle with the attached conducting element and includes a narrow tip may be used instead of a conducting triangular plate 443 without departing from the scope of the disclosure.

Figure 4G:
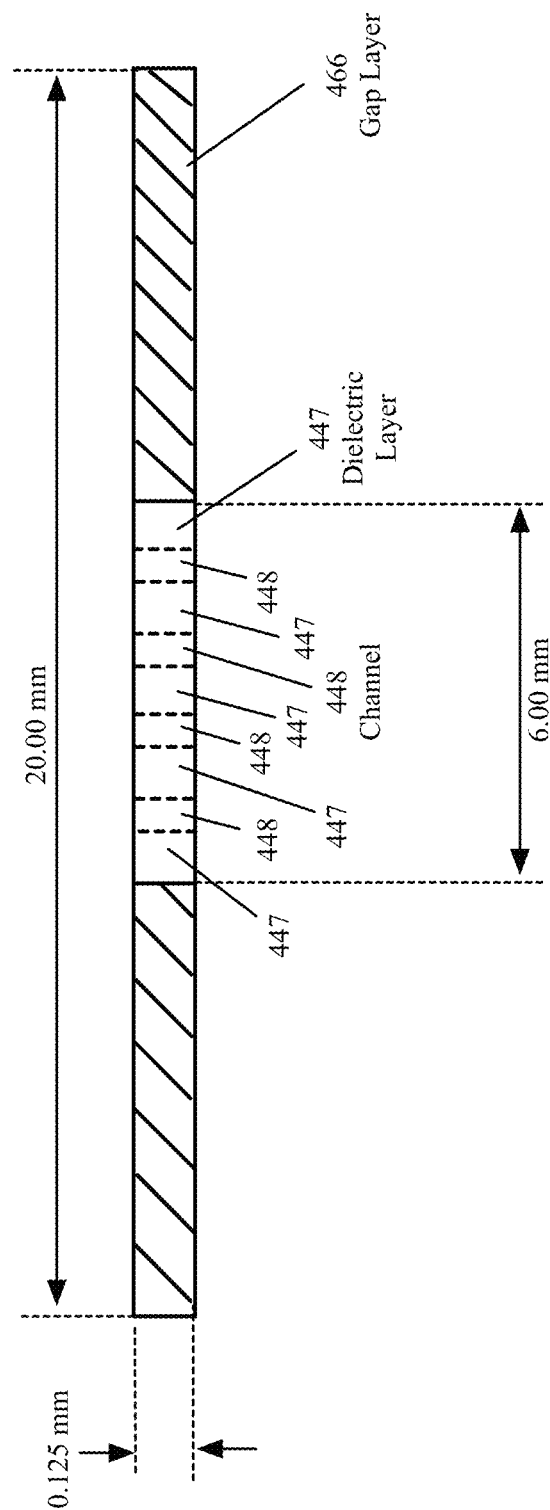
FIG. 4G illustrates a gap layer of an active switch that includes a dielectric layer 447 that includes a plurality of channels.

In some implementations, the gap 435 of the active switches of FIGS. 4A-4E may be replaced with a dielectric layer that includes a plurality of channel elements. FIG. 4G illustrates a gap layer 466 of an active switch that includes a dielectric layer 447 that includes a plurality of channels 448. In comparison, the gap layer 461 of FIG. 4C and the gap layers 461 and 462 of FIG. 4E include gaps 435 that may be vacuum or may be filled with one or more gasses such as air, an inert gas, for example, and without limitations, nitrogen (N2), argon (Ar), etc. The dielectric layer 447 may be polyimide and/or polyester. In some implementations, as the number of channels 448 and/or volume of the channels 448 increase the breakdown voltage may decrease. The channels 448 may be cylindrical or other shapes without departing from the scope of the disclosure. The channels 448 may be vacuum or may be filled with one or more gasses such as air, an inert gas, for example, and without limitations, nitrogen (N2), argon (Ar), etc. The gap layer 466 of FIG. 4G may replace the gap layers of FIGS. 4C and 4E in some implementations.

The gap layer 446 may be placed between the tip of a conducting triangular plate (e.g., the conducting triangular plate 443 of FIG. 4C) and a conducting element (e.g., the conducting element 460 of FIG. 4C). The gap layer 446 may be placed between the tip of a conducting pin (e.g., any of the conducting pins 440 of FIG. 4E) and a conducting element (e.g., any of the conducting elements 461-453 of FIG. 4E). When a voltage is applied across the two parallel conducting elements of an active switch that includes the gap layer 446, the fields become most intense in the channels 448 between the end of the conducting pin 440 and the bottom conducting element (or between the tip of the conducting triangular plate and the bottom conducting element). Smaller gap distances may have lower applied voltage for dielectric breakdown.

The technical advantages of the variable capacitors 320 and 325 that are implemented as active dielectric devices (e.g., as described above with reference to FIGS. 4A-4F) over other types of variable capacitances, such as diode varactors, is providing the low loss and the capability of handling the high signal intensity. The low loss and the capability of handling the high signal intensity makes the variable capacitors 320 and 325 ideal for phase shifters that may be used for phased-array antennas (e.g., as described in Section IV below).

Referring back to FIG. 3, the quadrature hybrid 110 may include fours ports 101-104. Port 101 may be the input port of the quadrature hybrid. One end of the variable capacitor 320 may be connected to the port 102 and one end of the variable capacitor 325 may be connected to the port 103. The other ends of the variable capacitors 320 and 325 may be connected to ground 140 (e.g., to a ground conductor or the ground plate by a via). Port 101 of the quadrature hybrid 110 may be used as the input terminal 160 of the phase shifter 300. Port 104 of the quadrature hybrid 110 may be used as the output terminal 170 of the phase shifter 300.

The RF signals may enter the input terminal 160 and the output may come out from the output terminal 170 of the phase shifter 300. An example use of the phase shifter 300 is in phased-array antenna where a phase shifter, such as the phase shifter 300 may be connected to each array element of the phased-array antenna. Further details of the use of the phase shifter 300 of the present embodiments is described below with reference to FIGS. 33A-33C.

With further reference to FIG. 3, the capacitance of the variable capacitors 320 and 325 may be identical and may be varied by the external bias voltage 180 to produce a variable capacitance to provide a phase shift to the RF signal. The phase shifter 300 may operate as follows. RF signals may be applied through the input terminal 160 of the phase shifter 300. When the input power enters port 101 of the quadrature hybrid 100, the power after the initial transmission through the quadrature hybrid 100 is split between ports 102 and 103 with phase changes of −90 degrees and −180 degrees, respectively. There is no reflection at port 101 and port 104 is isolated without any output power.

The initial transmitted signals at ports 102 and 103 attain the same additional phase change after reflection from the identical variable capacitors 120 and 125 and are transmitted through the quadrature hybrid 100 again to ports 101 and 104 where the power at each of ports 102 and 103 is split between ports 101 and 104.

The power of the reflected signals at each of ports 101 and 104 is sum of the two contributions. The two contributions from ports 102 and 103 are 180 degrees out of phase at port 101 to give no transmitted power, resulting in zero (or negligible) reflection at the input port 101 of the quadrature hybrid 110 and the input terminal 160 of the phase shifter 300.

On the other hand, the two signals from ports 102 and 103 are constructively interfered at port 104 to give a total transmission to port 104 with a phase shift of −270 degrees (or 90 degrees) after passing through the quadrature hybrid 110 twice (after forward transmission and reflection) plus an additional phase shift from the variable capacitors 320 and 325. The resultant phase shifter device 300 is a two-port network with minimal reflection at the input terminal 160 and total transmission at the output terminal 170 where the phase of the output is varied by the external bias voltage 180 to the variable capacitors 320 and 325. The total phase shift achieved at the output terminal 170 includes a fixed component of −270 degrees (or 90 degrees) and a variable component that may be adjusted by changing the external bias voltage 180.

Figure 5A:
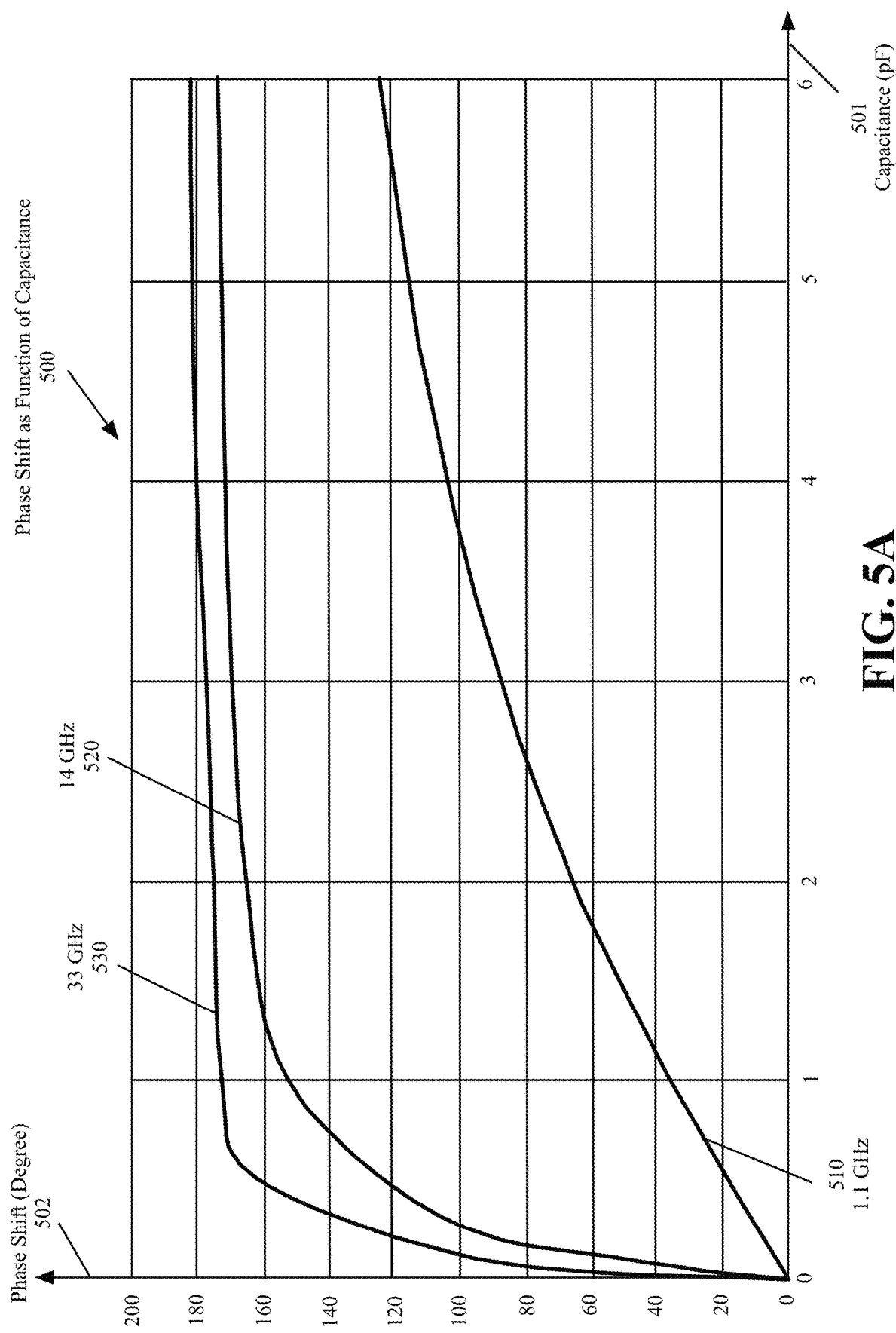
FIG. 5A is a graph depicting the phase shift as a function of the capacitance of the identical varactors of the phase shifter of FIG. 3 at three frequencies of 1.1 GHZ, 14 GHZ, and 33 GHz, according to an example implementation of the present application.

FIG. 5A is a graph depicting the phase shift as a function of the capacitance of the identical variable capacitors of the phase shifter of FIG. 3 at three frequencies of 1.1 GHZ 510, 14 GHz 520, and 33 GHz 530, according to an example implementation of the present application. With reference to FIG. 5A, the phase shift 502 is shown as a function 500 of capacitance 501 of the variable capacitors 320 and 325. As shown by graph 500, the phase changes more rapidly at higher frequencies.

Figure 5B:
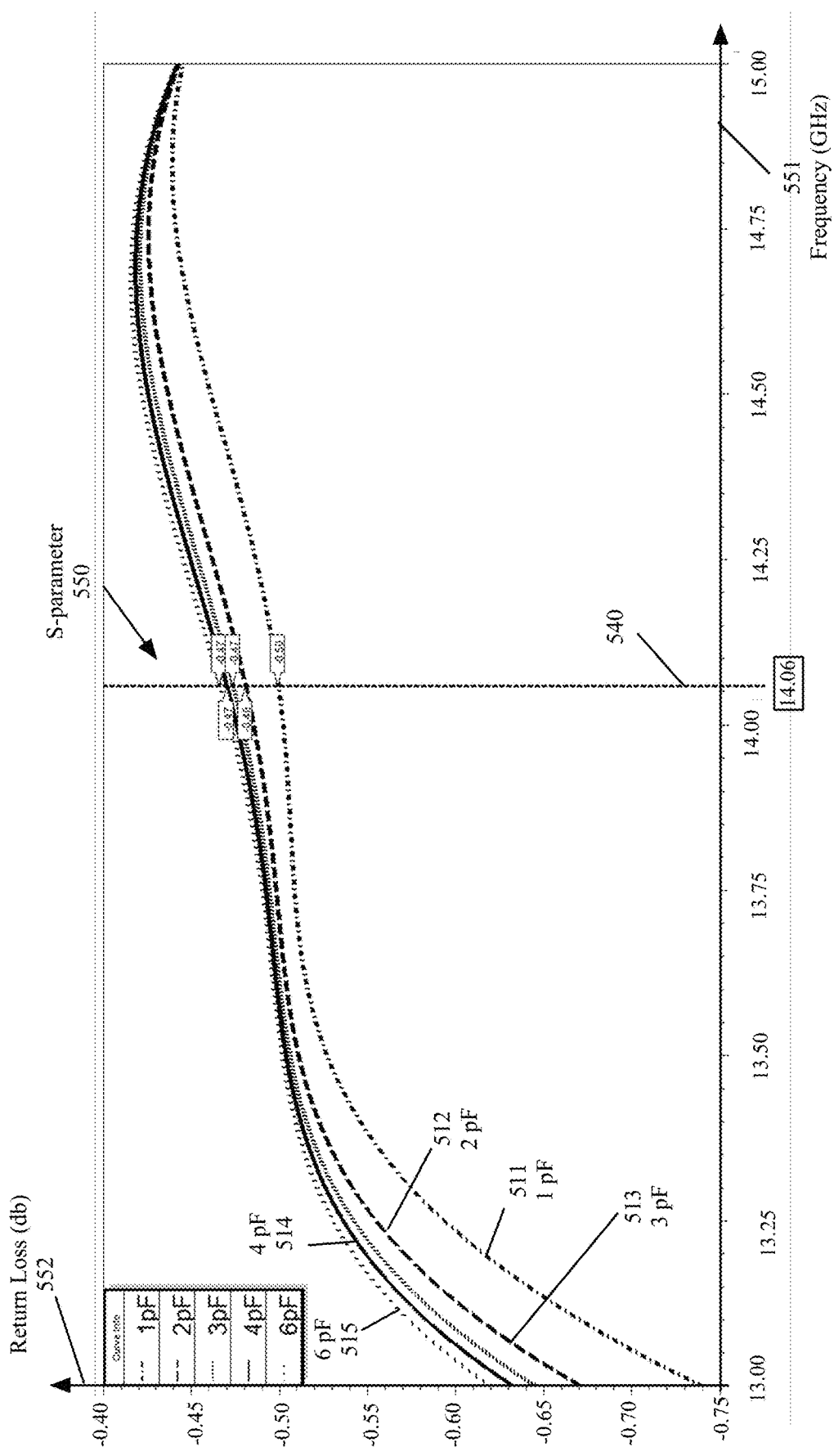
FIG. 5B is a graph depicting the return loss as a function of frequency at 5 capacitance values of 1 pF, 2 pF, 3 pF, 4 pF, and 6 pF of the identical varactors of the phase shifter of FIG. 3, according to an example implementation of the present application.

FIG. 5B is a graph depicting the return loss as a function of frequency at 5 capacitance values of 1 pico farad (pF) 511, 2 pF 512, 3 pF 513, 4 pF 514, and 6 pF 515 of the identical variable capacitors of the phase shifter of FIG. 3, according to an example implementation of the present application. With reference to FIG. 5B, the return loss 552 is shown as a function 550 of frequency 551. As shown, around 14 GHz 540 (e.g., at 14.06 GHZ) at various variable capacitor capacitances of 1 pF-6 pF, the loss is less than 0.5 dB, which is considered minor.

Figure 6:
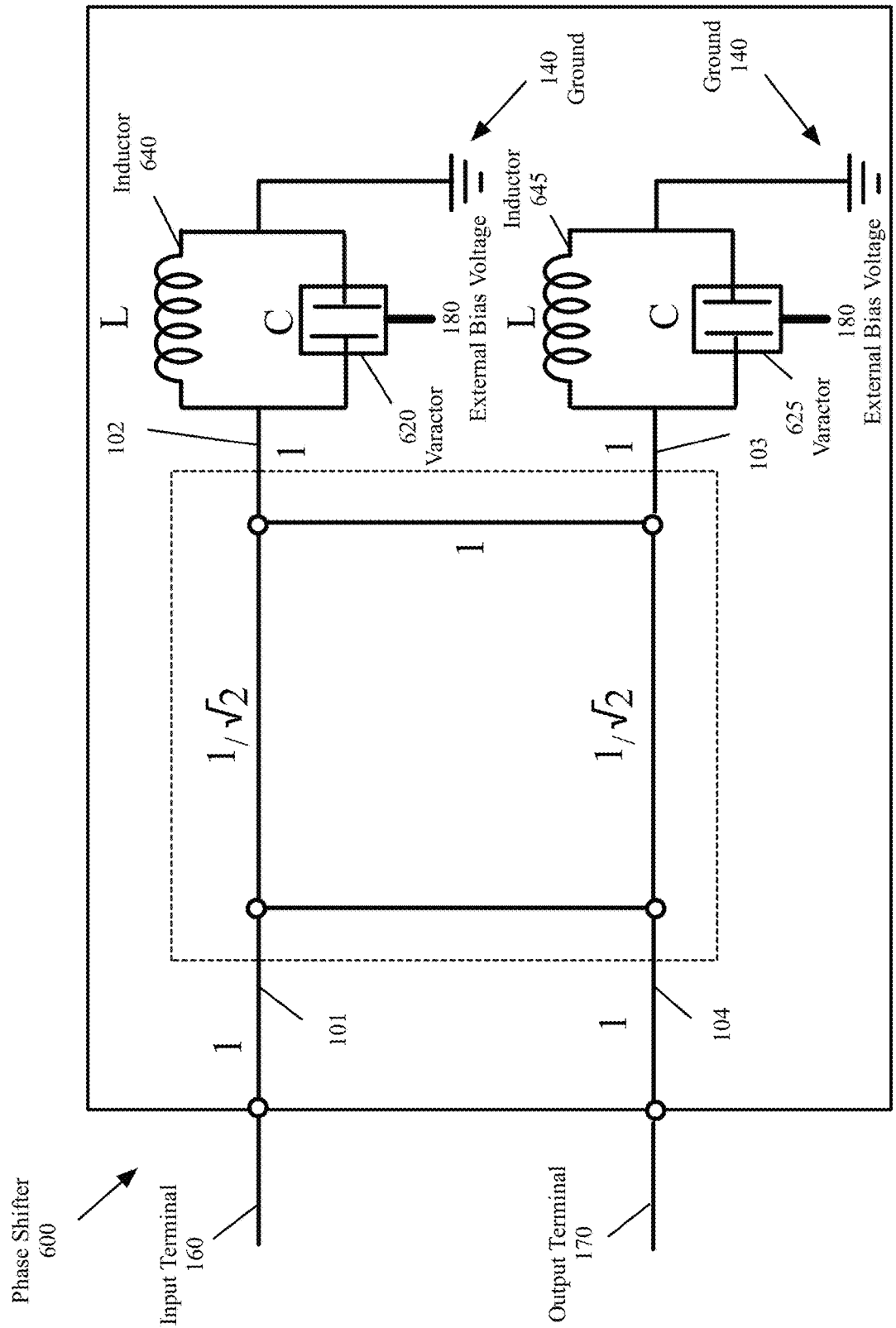
FIG. 6 is a schematic diagram with normalized transmission-line characteristic impedances exemplifying an alternative embodiment of a phase shifter, where each varactor may be replaced by a pair of varactor and inductor in parallel, according to an example implementation of the present application.
Figure 7:
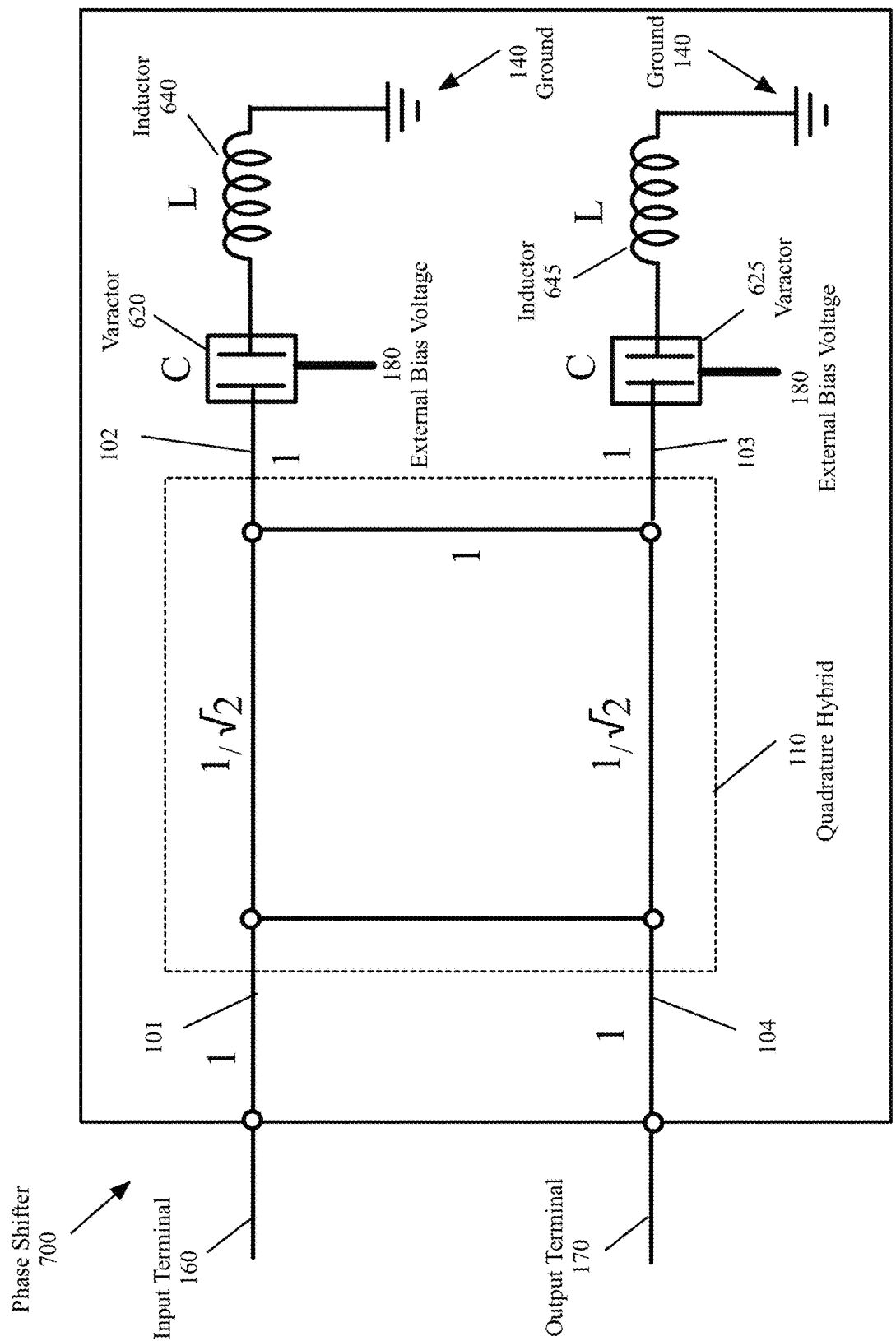
FIG. 7 is a schematic diagram with normalized transmission-line characteristic impedances exemplifying an alternative embodiment of a phase shifter, where each varactor may be replaced by a pair of varactor and inductor in series, according to an example implementation of the present application.

FIG. 6 is a schematic diagram with normalized transmission-line characteristic impedances exemplifying an alternative embodiment of a phase shifter 600, where each variable capacitor may be replaced by a pair of varactor and inductor in parallel, according to an example implementation of the present application. FIG. 7 is a schematic diagram with normalized transmission-line characteristic impedances exemplifying an alternative embodiment of a phase shifter 700, where each variable capacitor may be replaced by a pair of varactor and inductor in series, according to an example implementation of the present application.

With reference to FIG. 6, the first end of the varactor 620 and the first end of the inductor 640 are connected to the port 102. The first end of the varactor 625 and the first end of the inductor 645 are connected to the port 103. The second ends of the varactors 620 and 625 and the second ends of the inductors 640 and 645 are connected to ground 140 (e.g., to a ground conductor or the ground plate by a via). The varactors 620 and 625, in some embodiments, may be implemented as described above with reference to FIGS. 4A-4G.

With reference to FIG. 7, the first end of the varactor 620 is connected to the port 102 and the first end of the varactor 625 is connected to the port 103. The second end of the varactor 620 is connected to the first end of the inductor 640 and the second end of the varactor 625 is connected to first end of the inductor 645. The second ends of the inductors 640 and 645 are connected to ground 140 (e.g., to a ground conductor or the ground plate by a via). It should be noted that the varactor 620 and the inductor 640 are in series and the position of the varactor 620 and the inductor 640 may be changed with respect to the quadrature hybrid 110 and ground 140. Also, the varactor 625 and the inductor 645 are in series and the position of the varactor 625 and the inductor 645 may be changed.

The varactors' reactance may be changed by changing the external bias voltage 180. The phase shifters of FIGS. 6 and 7 provide the technical advantage that at resonance of the LC circuit, a small change of the capacitance value gives a large variation of the impedance of the pairs, resulting in a phase shifter that may be more sensitive to the bias voltage of the varactors 620 and 625 and gives a larger range of phase shift compared to the phase shifter 300 of FIG. 3. The phase shifters of FIGS. 6 and 7 provide more sensitive phase change to the bias voltage of the varactors 620 and 625 and provide a wider range of phase shift.

Similar to the phase shifter of FIG. 3, the input RF signals enter the input terminal 160 of the phase shifter and port 101 of the quadrature hybrid 110, pass through the quadrature hybrid 110, and are reflected at ports 102 and 103 from the pairs of varactor 602 and inductor 603 (in parallel as shown in FIG. 6 and in series as shown in FIG. 7), reflect back to ports 101 and 104 after another pass through the quadrature hybrid 110.

Figure 8:
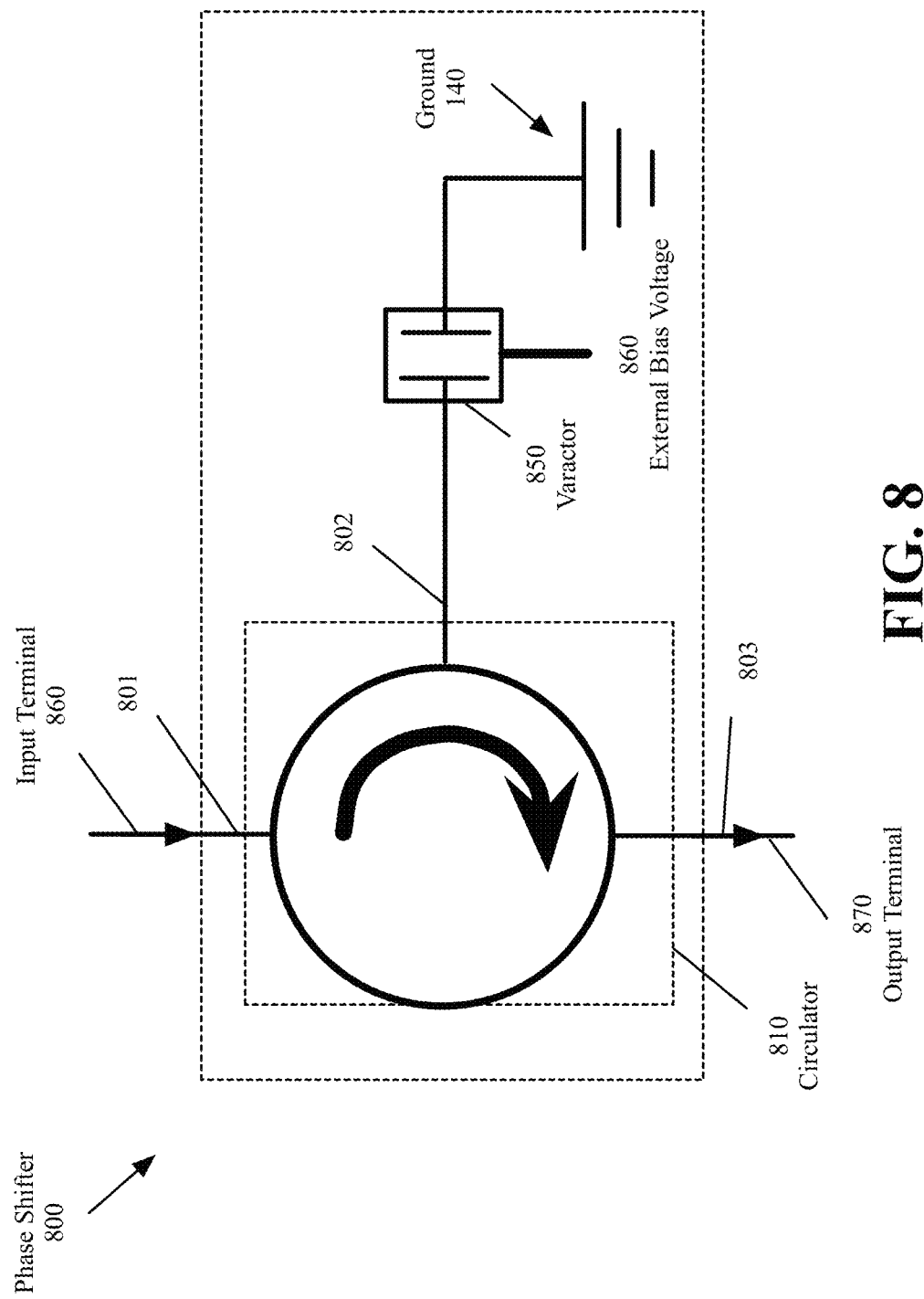
FIG. 8 is a schematic diagram illustrating a phase shifter with a three-port circulator where two ports are attached to the input and output terminals of the phase shifter and the third port may be connected to a shorted varactor, according to an example implementation of the present application.

FIG. 8 is a schematic diagram illustrating a phase shifter 800 with a three-port circulator where two ports are attached to the input and output terminals of the phase shifter and the third port may be connected to a shorted varactor, according to an example implementation of the present application. With reference to FIG. 8, an input RF signal may be fed to the input port 860 of the phase shifter 800, which is connected to port 801 (the input port) of the circulator 810. According to the properties of the circulator 810, the input RF signal is transmitted to the port 802 without any reflection. The transmitted signal at port 802 is reflected from the varactor 850 with a phase change depending on the bias voltage 860 of the varactor 850. The reflected signal at the port 802 enters the circulator 810 again and comes out at port 803 (the output port of the circulator 810) and the output terminal 870 of the phase shifter 800 as an output with a phase shift varied by the external bias voltage 860 of the varactor 850. The varactor 850, in some embodiments, may be implemented as described above with reference to FIGS. 4A-4G.

Figure 9:
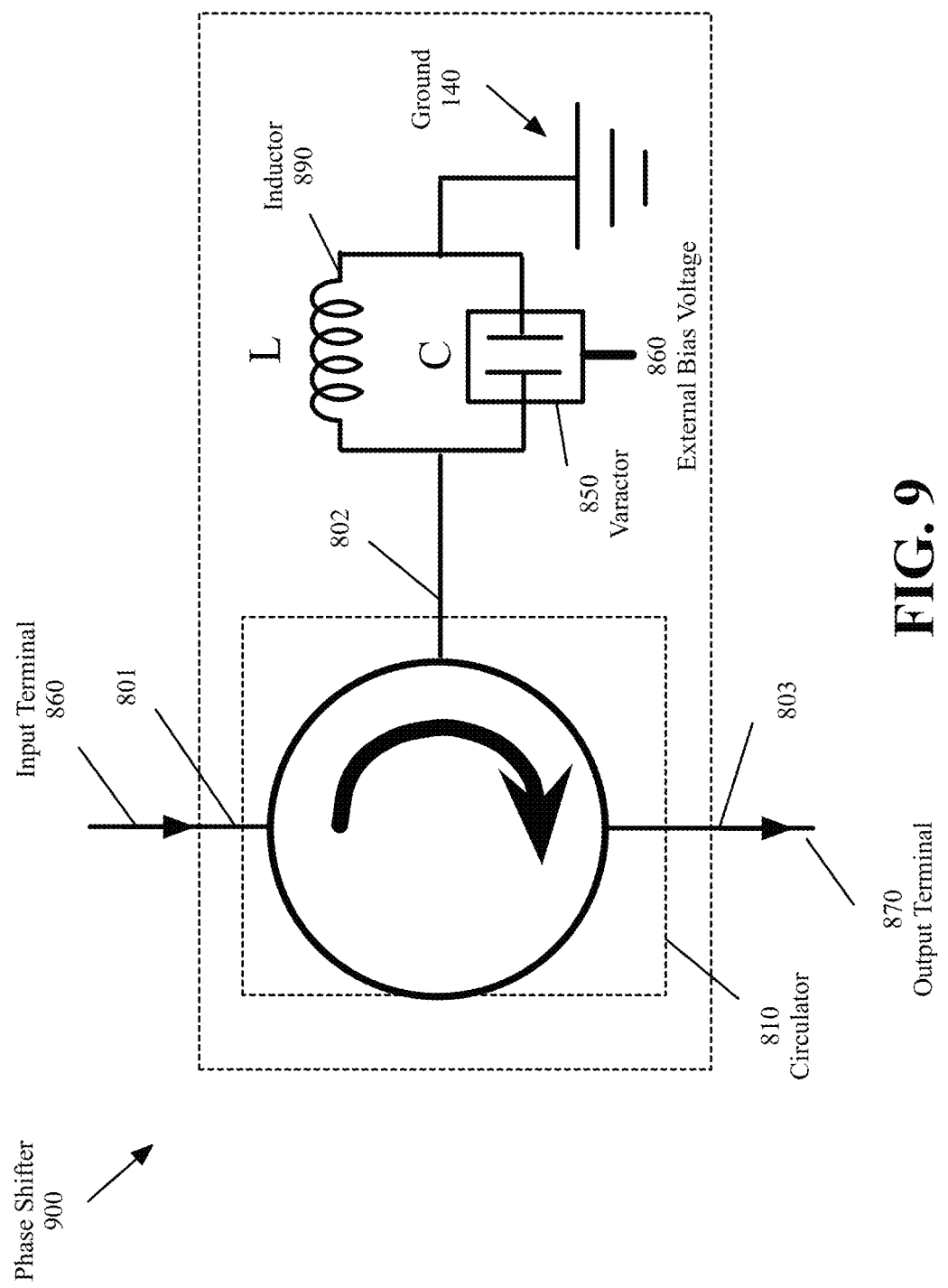
FIG. 9 is a schematic diagram with normalized transmission-line characteristic impedances exemplifying an alternative embodiment of a phase shifter with a circulator, where the varactor of FIG. 8 may be replaced by a pair of varactor and inductor in parallel, according to an example implementation of the present application.
Figure 10:
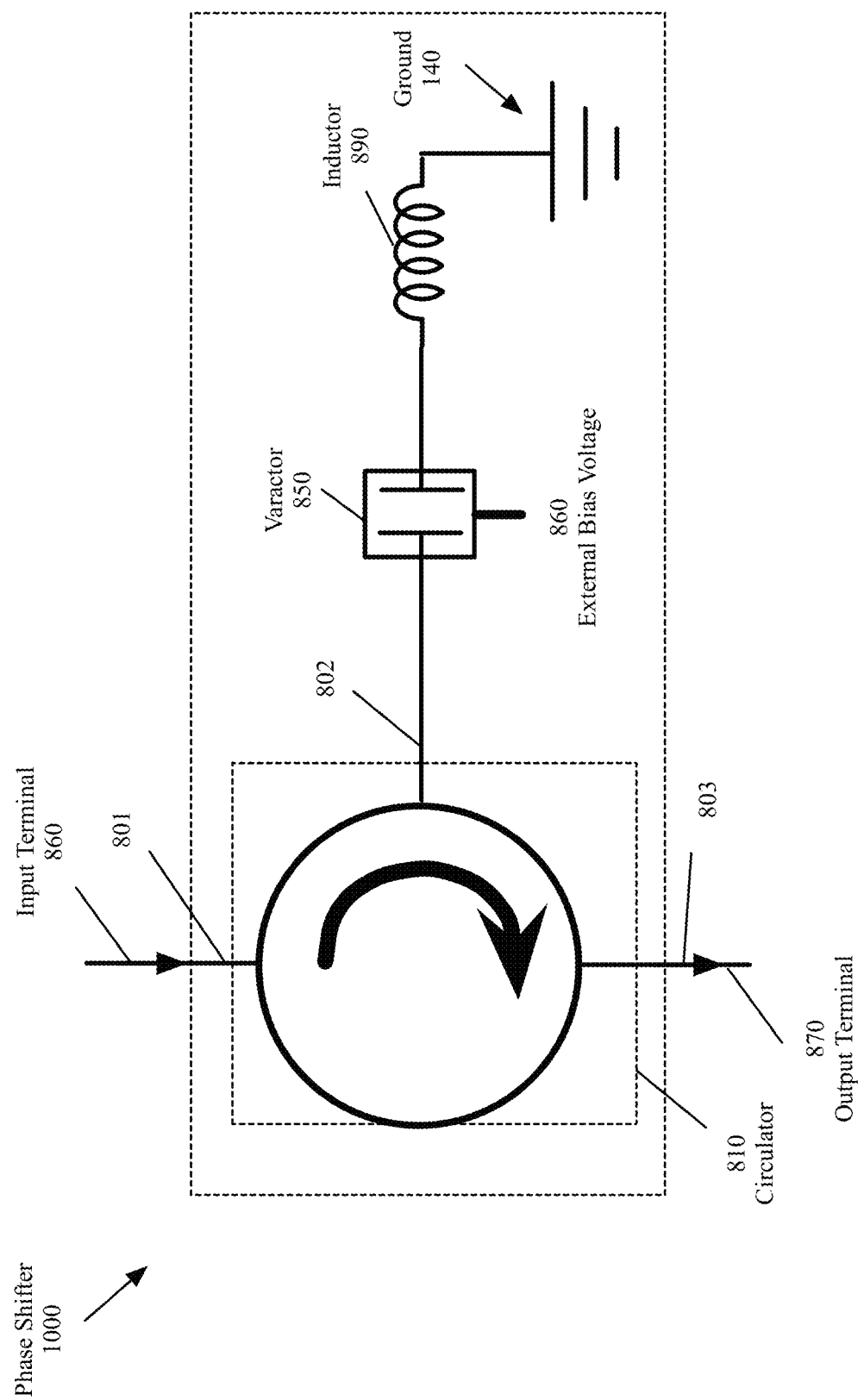
FIG. 10 is a schematic diagram with normalized transmission-line characteristic impedances exemplifying an alternative embodiment of a phase shifter with a circulator, where the varactor of FIG. 8 may be replaced by a pair of varactor and inductor in series, according to an example implementation of the present application.

FIG. 9 is a schematic diagram with normalized transmission-line characteristic impedances exemplifying an alternative embodiment of a phase shifter 900 with a circulator 810, where the varactor of FIG. 8 may be replaced by a pair of varactor and inductor in parallel, according to an example implementation of the present application. FIG. 10 is a schematic diagram with normalized transmission-line characteristic impedances exemplifying an alternative embodiment of a phase shifter 1000 with a circulator 810, where the varactor of FIG. 8 may be replaced by a pair of varactor and inductor in series, according to an example implementation of the present application.

With reference to FIG. 9, the first end of the varactor 850 and the first end of the inductor 890 are connected to the port 802 of the circulator 810. The second end of the varactor 850 and the second end of the inductor 890 are connected to ground 140 (e.g., to a ground conductor or the ground plate by a via).

With reference to FIG. 10, the first end of the varactor 850 may be connected to the port 802 of the circulator 810 and the second end of the varactor 850 may be connected to the first end of the inductor 890. The second ends of the inductor 890 may be connected to ground 140 (e.g., to a ground conductor or the ground plate by a via). It should be noted that the varactor 850 and the inductor 890 are in series and the position of the varactor 850 and the inductor 890 may be changed with respect to the port 802 and ground 140.

The phase shifters of FIGS. 8, 9, and 10 provide the technical advantage of having fewer ports and being more compact and more suitable for printed circuits than the phase shifter 300 of FIG. 3. The phase shifters of FIGS. 9 and 10 provide the technical advantage that at resonance of the LC circuit, a small change of the capacitance value gives a large variation of the impedance of the pairs, resulting in a phase shifter that may be more sensitive to the bias voltage of the varactor 850 and gives a larger range of phase shift compared to the phase shifter 300 of FIG. 3 and the phase shifter 800 of FIG. 8. The phase shifters of FIGS. 9 and 10 provide more sensitive phase change to the bias voltage of the varactor 850 and provide a wider range of phase shift.

The input RF signals enter the input terminal 860 of the phase shifters 800, 900, and 1000 and port 101 of the circulator 810, pass through the circulator 810, and are reflected at port 802 from the varactor 850 or the pair of varactor 850 and inductor 890 (in parallel as shown in FIG. 9 and in series as shown in FIG. 10), reflect back to ports 801 and 803 after another pass through the circulator 810. According to the structure of the circulator 810, the reflected signals are blocked at port 801 and the input terminal 860 while the reflected signals are received at port 803 of the circulator and the terminal output 870 of the phase shifters 800, 900, and 1000 with maximum power. With references to FIGS. 8-10, the varactor 850, in some implementations, may be the active dielectric devices described above with reference to FIGS. 4A-4G.

The resultant phase shifters of the present implementations are inexpensive, compact, and of low power consumption of the bias input. Most available phase shifters rely on materials, the propagation constant of which varies by an external field, as in ferrite phase shifters. On the other hand, the phase shifts of the present implementations do not depend on the wave propagation through an active medium that makes the device large and lossy. Consequently, the present implementations provide inexpensive, compact, and low-loss phase shifters.

II. Electronic Switch

Figure 11:
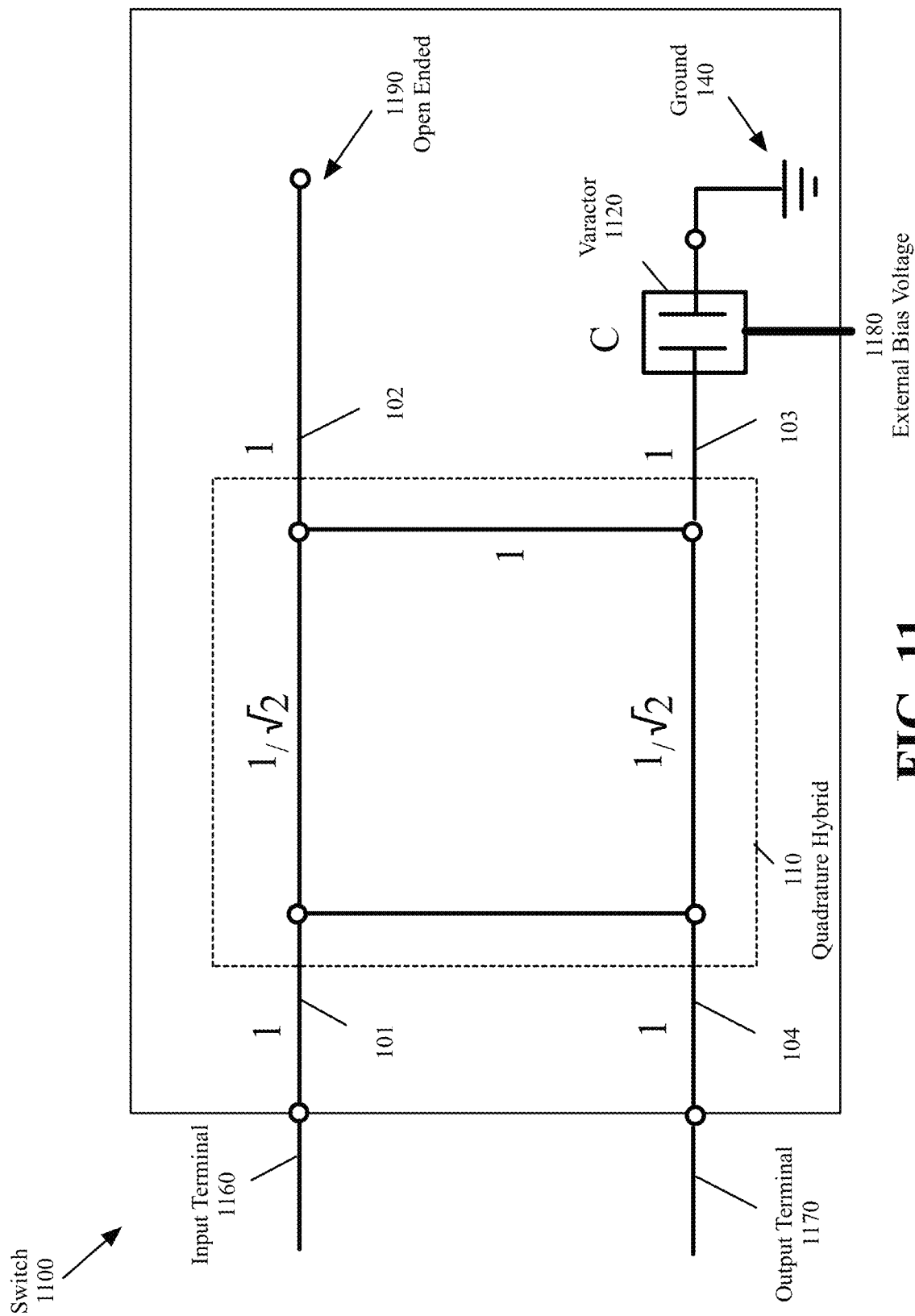
FIG. 11 is a schematic diagram with normalized characteristic impedances of transmission lines exemplifying a switch with a four-port quadrature hybrid, where one port may be connected to an input terminal, one port may be open ended, one port may be attached to a shorted varactor, and one port may be used as the output terminal.

Some of the present implementations provide electronic switches that include a quadrature hybrid. FIG. 11 is a schematic diagram with normalized characteristic impedances of transmission lines exemplifying a switch 1100 with a four-port quadrature hybrid, where one port may be connected to an input terminal, one port may be open ended, one port may be attached to a shorted varactor, and one port may be used as the output terminal.

With reference to FIG. 11, the quadrature hybrid 110 may include fours ports 101-104. Port 101 may be the input port of the quadrature hybrid. Port 102 of the quadrature hybrid may be open (as shown by 1190). One end of the varactor 1120 may be connected to port 103. The other end of the varactor 1120 may be connected to ground 140 (e.g., to a ground conductor or the ground plate by a via). Port 101 of the quadrature hybrid 110 may be used as the input terminal 1160 of the switch 1100. Port 104 of the quadrature hybrid 110 may be used as the output terminal 1170 of the switch 1100. The quadrature hybrid 110 and the varactor 1120, in some implementations, may be positioned on a top surface of the substrate that is backed by a ground plane, as described above with reference to FIG. 2.

In switching operations, there may be two states: on and off. For the on-state, the capacitance of the varactor 1120 may be set to be close to the capacitance at port 102, which is small for the open-ended termination, to make the reflection coefficients of the reflected waves at ports 102 and 103 the same. According to the properties of a quadrature hybrid 110, the reflected signals at ports 102 and 103 after passing through the quadrature hybrid 110 again destructively interfere at port 101 to give a small signal strength for negligible reflection at the input port while constructively interfering at the output port 104, resulting in the on-state.

On the other hand, when the capacitance of the varactor 1120 is very large (e.g., by changing the external bias voltage 1180), the reflection coefficients of the two signals at ports 102 and 103 have a phase difference of 180 degrees, which leads constructive interference of the two signals at port 101 after passing through the quadrature hybrid 110 causing complete reflection at the input port 101 while destructive interference at the output port 104, resulting in the off-state of the network.

Figure 12A:
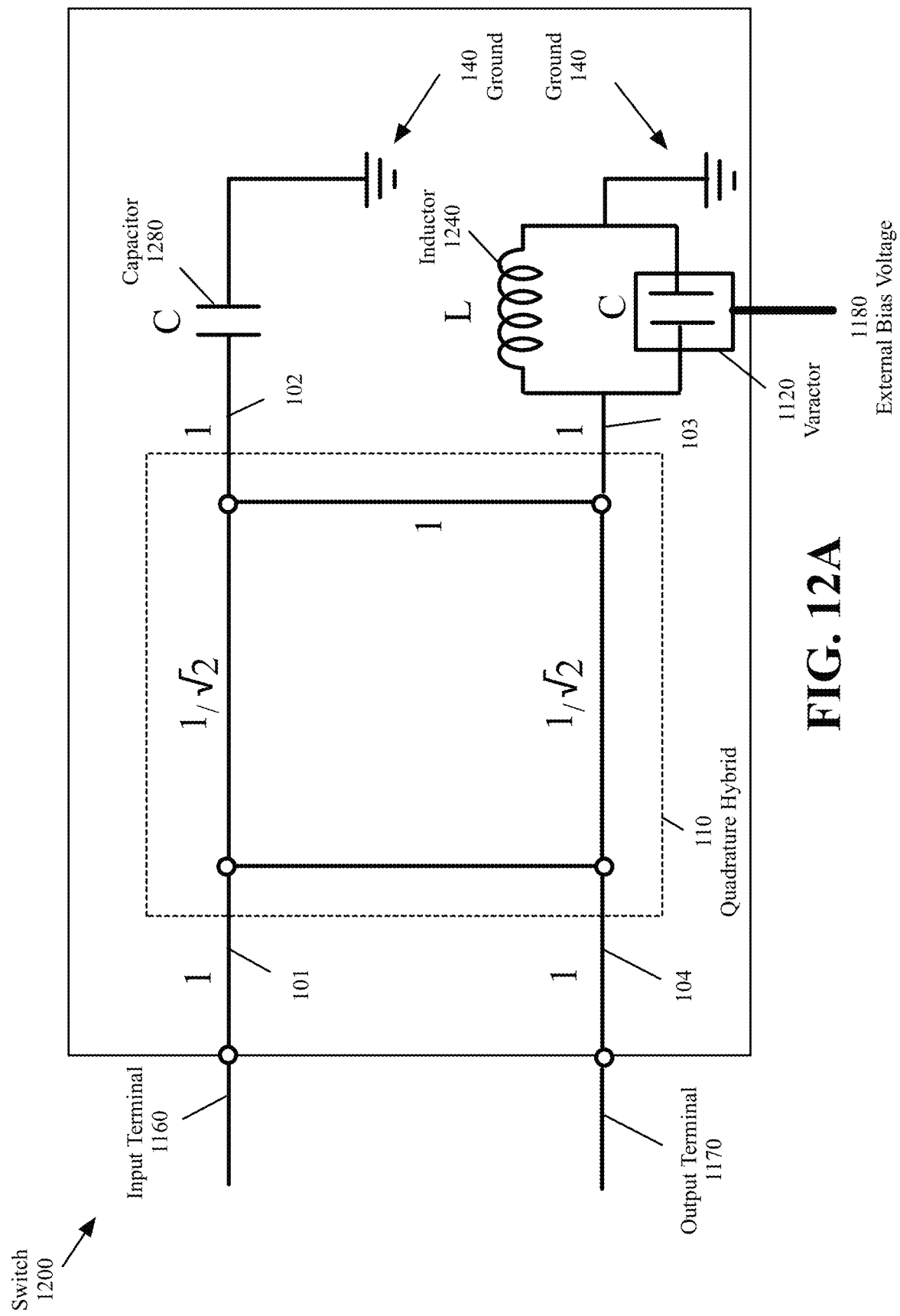
FIG. 12A is a schematic diagram with normalized characteristic impedances of transmission lines exemplifying a switch as an alternative embodiment to the switch of FIG. 11, where a capacitor may be connected to one port of the quadrature hybrid and the varactor may be replaced by a pair of varactor and inductor in parallel to reduce the required capacitance change for the switching operation.
Figure 12B:
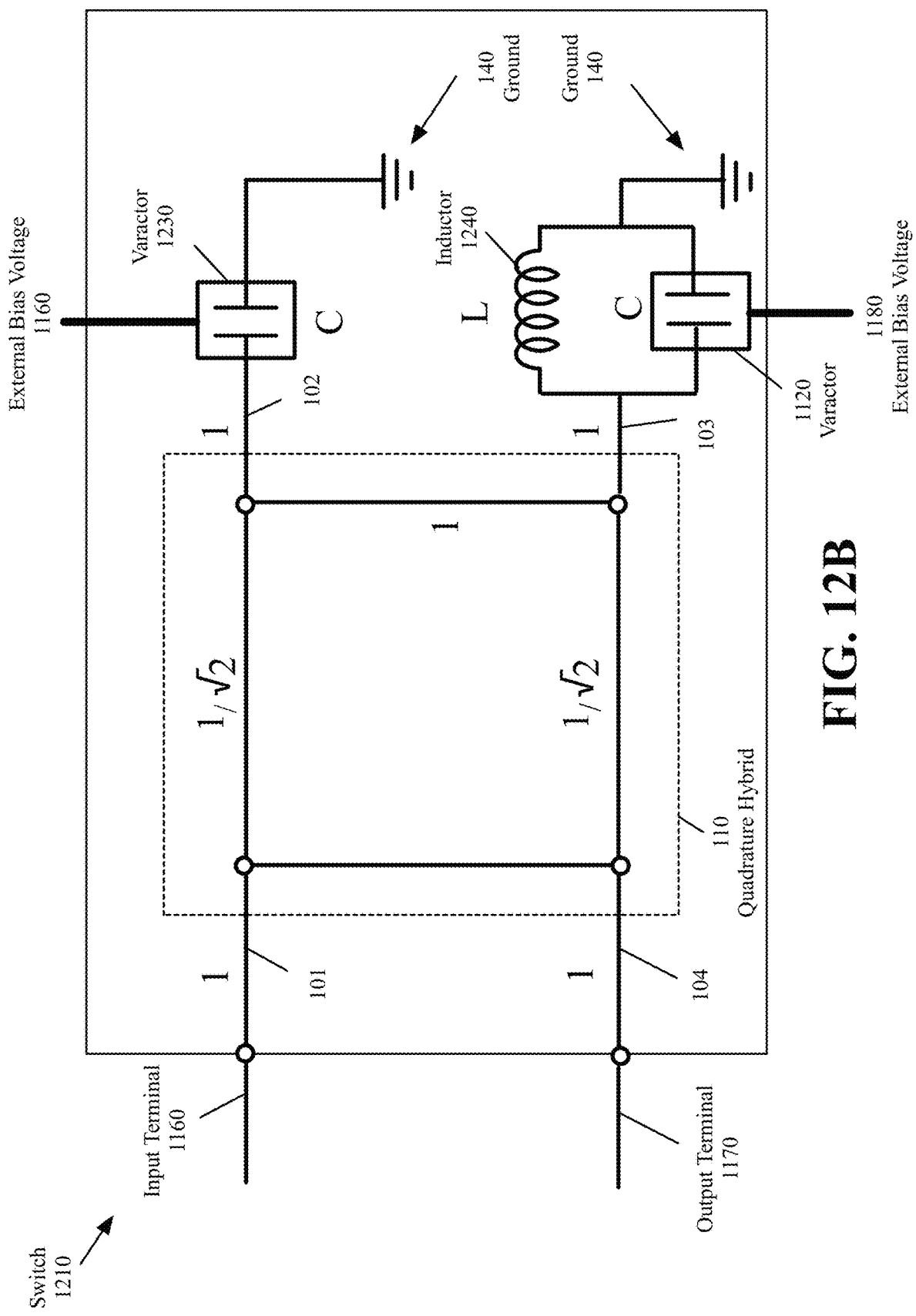
FIG. 12B is a schematic diagram with normalized characteristic impedances of transmission lines exemplifying a switch as an alternative embodiment to the switch of FIG. 12A, where the capacitor may be replaced by a varactor.

FIG. 12A is a schematic diagram with normalized characteristic impedances of transmission lines exemplifying a switch 1200 as an alternative embodiment to the switch of FIG. 11, where a capacitor may be connected to one port of the quadrature hybrid and the varactor may be replaced by a pair of varactor and inductor in parallel to reduce the required capacitance change for the switching operation. FIG. 12B is a schematic diagram with normalized characteristic impedances of transmission lines exemplifying a switch 1210 as an alternative embodiment to the switch of FIG. 12A, where the capacitor may be replaced by a varactor.

Figure 13A:
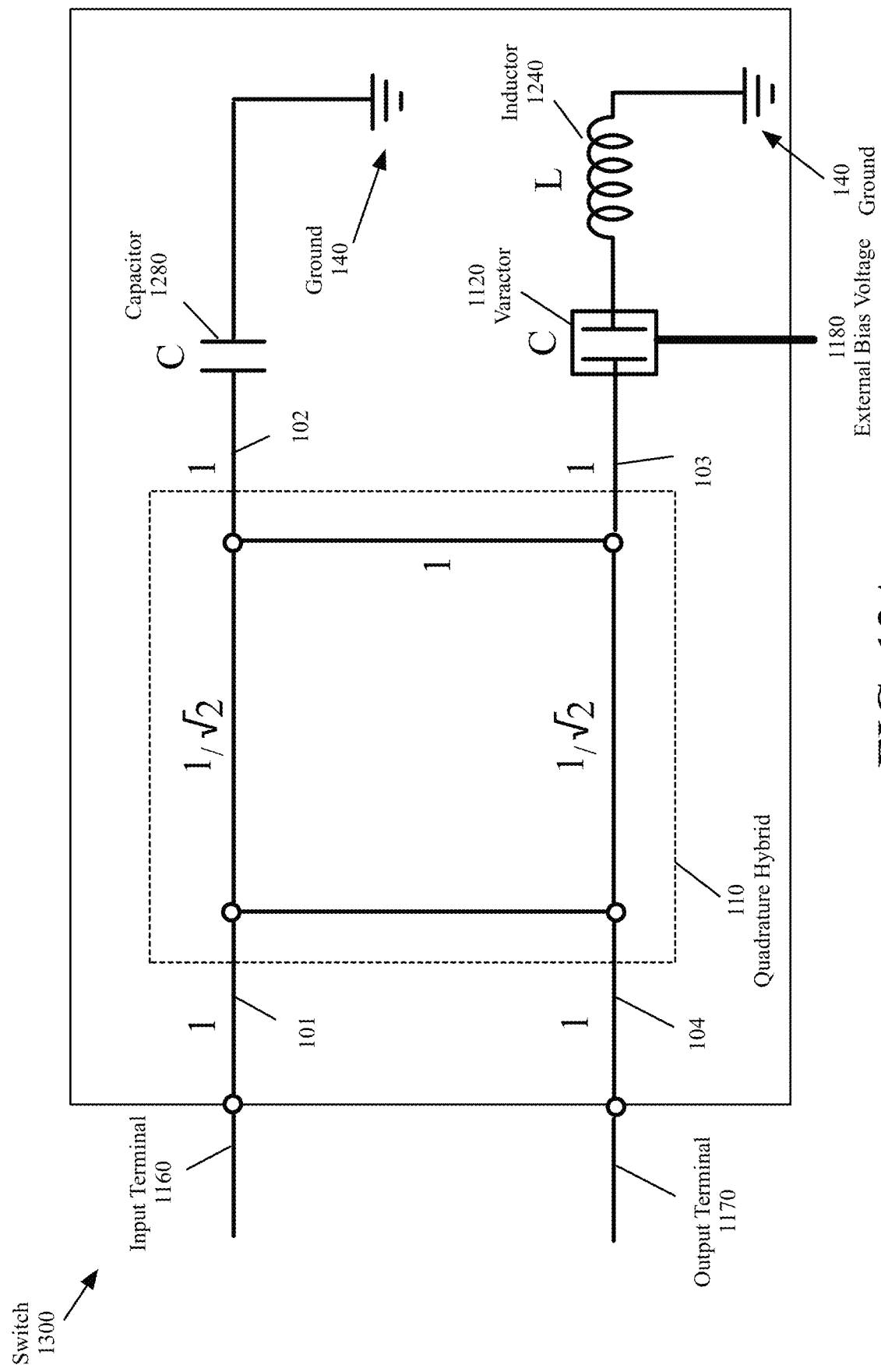
FIG. 13A is a schematic diagram with normalized characteristic impedances of transmission lines exemplifying a switch as an alternative embodiment to the switch of FIG. 11, where a capacitor may be connected to one port of the quadrature hybrid and the varactor may be replaced by a pair of varactor and inductor in series to reduce the required capacitance change for the switching operation.
Figure 13B:
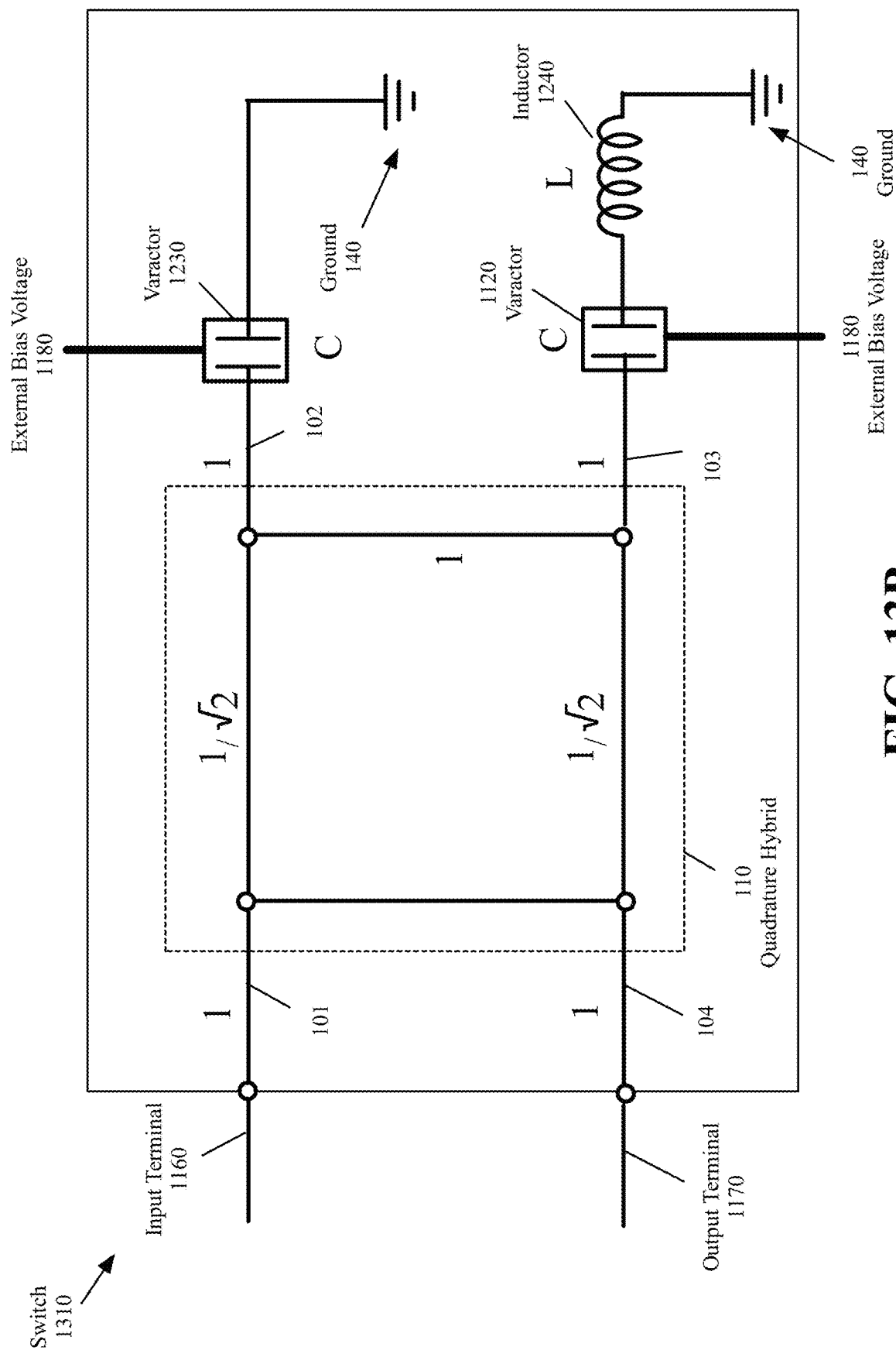
FIG. 13B is a schematic diagram with normalized characteristic impedances of transmission lines exemplifying a switch as an alternative embodiment to the switch of FIG. 13A, where the capacitor may be replaced by a varactor.

FIG. 13A is a schematic diagram with normalized characteristic impedances of transmission lines exemplifying a switch 1300 as an alternative embodiment to the switch of FIG. 11, where a capacitor may be connected to one port of the quadrature hybrid and the varactor may be replaced by a pair of varactor and inductor in series to reduce the required capacitance change for the switching operation. FIG. 13B is a schematic diagram with normalized characteristic impedances of transmission lines exemplifying a switch 1310 as an alternative embodiment to the switch of FIG. 13A, where the capacitor may be replaced by a varactor.

With reference to FIGS. 12A, 12B, 13A, and 13B, the impedance of the pair of varactor 1120 and inductor 1240 (shown in parallel in FIG. 12 and in series in FIG. 13) for the on-state may be set to be close to the impedance of the capacitor 1280 to make the reflection coefficients of the reflected waves at ports 102 and 103 the same. According to the properties of a quadrature hybrid 110, the reflected signals at ports 102 and 103 after passing through the quadrature hybrid 110 destructively interfere at port 101 to give no signal at the input port 101 of the quadrature hybrid and the input terminal of the switch 1200, while constructively interfering at the output port 104 of the quadrature hybrid and the output terminal 1170 of the switch 1200, resulting in the on-state. The quadrature hybrid 110, the capacitor 1280, the varactor 1120, and the inductor 1240, in some implementations, may be positioned on a top surface of the substrate that is backed by a ground plane, as described above with reference to FIG. 2.

On the other hand, when the impedance of the pair of varactor 1120 and inductor 1240 is chosen such that the reflection coefficients of the two signals at ports 102 and 103 have a phase difference of 180 degrees, which leads to constructive interference of the two signals causing complete reflection at the input port 101 of the quadrature hybrid and the input terminal of the switch 1200 after passing through the quadrature hybrid 110 while destructively interference at the output port 104 of the quadrature hybrid and the output terminal 1170 of the switch 1200, resulting in the off-state of the network.

With reference to FIGS. 12B and 13B, the switches 1210 and 1310 provide the technical advantage of allowing both negative reactance and positive reactance, which enables the beam to be steered in both directions while the devices with only one varactor provide only one direction. This is an advantage in addition to a high dynamic range of the reactive value for phase shift after reflection from the loading.

It should be noted that in some implementations of the switches 1200, 1210, 1300, and 1310, the capacitor 1280 may be removed. In these implementations, port 102 of the quadrature hybrid 110 of the switches 1200, 1210, 1300, and 1310 may be open ended. Furthermore, in some implementations of the switch 1100 of FIG. 11, port 102 may include a capacitor such as the capacitor 1280 of FIGS. 12A and 13A instead of being open ended.

The switches 1100, 1200, and 1300 may become a modulator when the capacitance of the varactor 1120 is set between the capacitances for the on- and the off-state. In the modulator state, the varactor bias voltage 1180 may modulate the RF signal, resulting in a simple low-loss amplitude modulator.

III. Series Aperture Coupled Fed Antenna

A. Conventional Aperture Coupled Fed Technique

Figure 14:
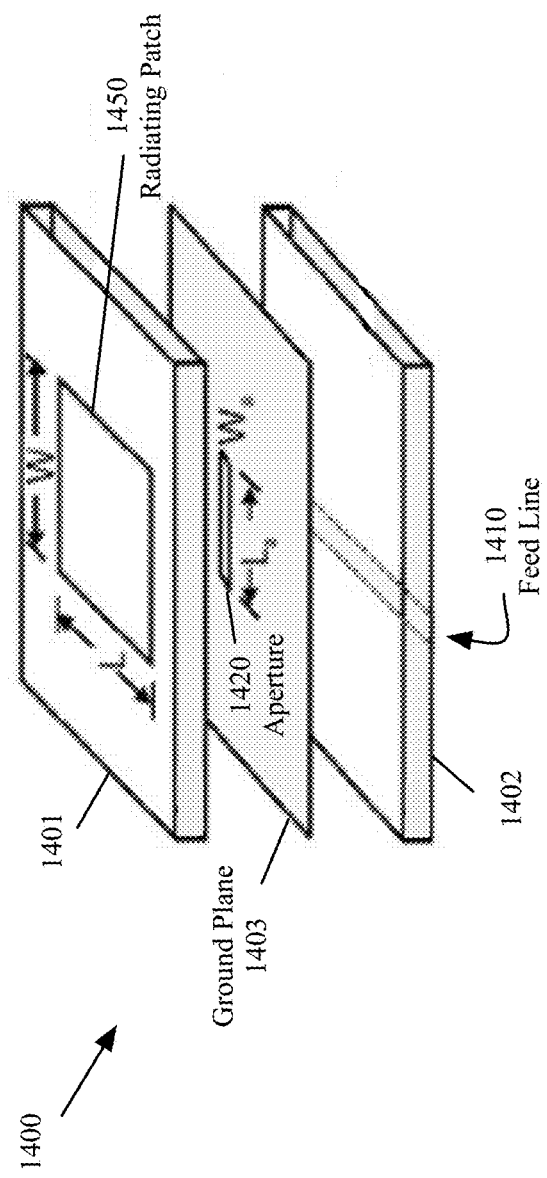
FIG. 14 is a schematic diagram of an aperture-coupled microstrip antenna.

FIG. 14 is a schematic diagram of an aperture-coupled microstrip antenna. With reference to FIG. 14, the basic structure of the aperture-coupled antenna 1400 includes two different substrate materials 1401-1402 on top of each other with a ground plane 1403 situated between the two substrates 1401-1402. Unlike typical RF feeding, the feeding network 1410 for the aperture-coupled antenna 1400 is placed on the bottom of the lower substrate 1402, while the microstrip patch antenna (radiating patch) element 1450 is located on the top of the upper substrate 1401.

The overall antenna element size may be minimized by such vertical arrangement of the radiating elements and the feed network. Electromagnetic power may be coupled to the antenna through the aperture (slot) 1420 in the ground plane 1403. The orientation, the position, and particularly the length, La, of the aperture 1420 have a direct effect on the amount of power coupled to the antenna and back radiation, where typically maximum coupling may be achieved if the aperture 1420 is centred with respect to the microstrip patch antenna element 1450. Thus, the shape, the size (e.g., L and W shown in FIG. 14), and the position of the antenna element as well as the shape, the size (e.g., La and Wa shown in FIG. 14), and the position the aperture may be varied to achieve desired impedance match and directivity. Traditionally, the two dielectric layers may be selected independently to optimize both antenna radiation performance and feed network loss.

B. Aperture-Coupled Fed Power Distribution a. Aperture Length

Figure 15:
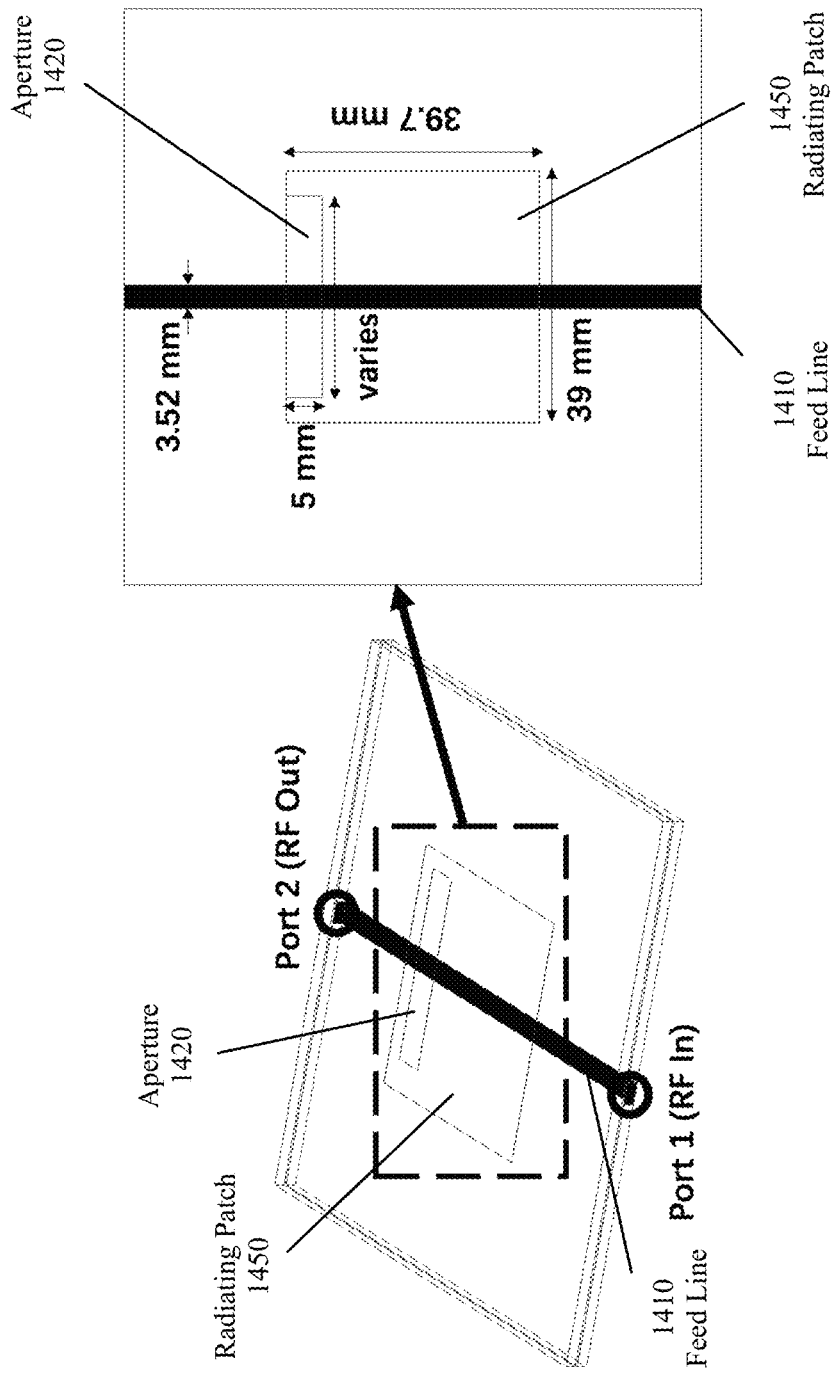
FIG. 15 illustrates the geometry of an aperture-coupled microstrip antenna, according to an example implementation of the present application.

The properties of the aperture 1420 (FIG. 14) play crucial roles for the power distribution. The performance of power flow may be understood by designing a conventional structure that examines how the aperture length affects it. In a non-limiting exemplary implementation, the structure of the top and bottom substrates may have a thickness of approximately 62 mil and a dielectric constant of 3.55. The aperture may be nearly positioned beneath the edge of the element. FIG. 15 illustrates the geometry of an aperture-coupled microstrip antenna, according to an example implementation of the present application.

The sample structure of FIG. 15, in which Port 1 (RF in) and Port 2 RF (out) are well matched in terms of the impedance, may be regarded as one of the radiating elements from a large scale of antenna array. With the variation of the aperture length, the coupled power may be controlled.

Figure 16:
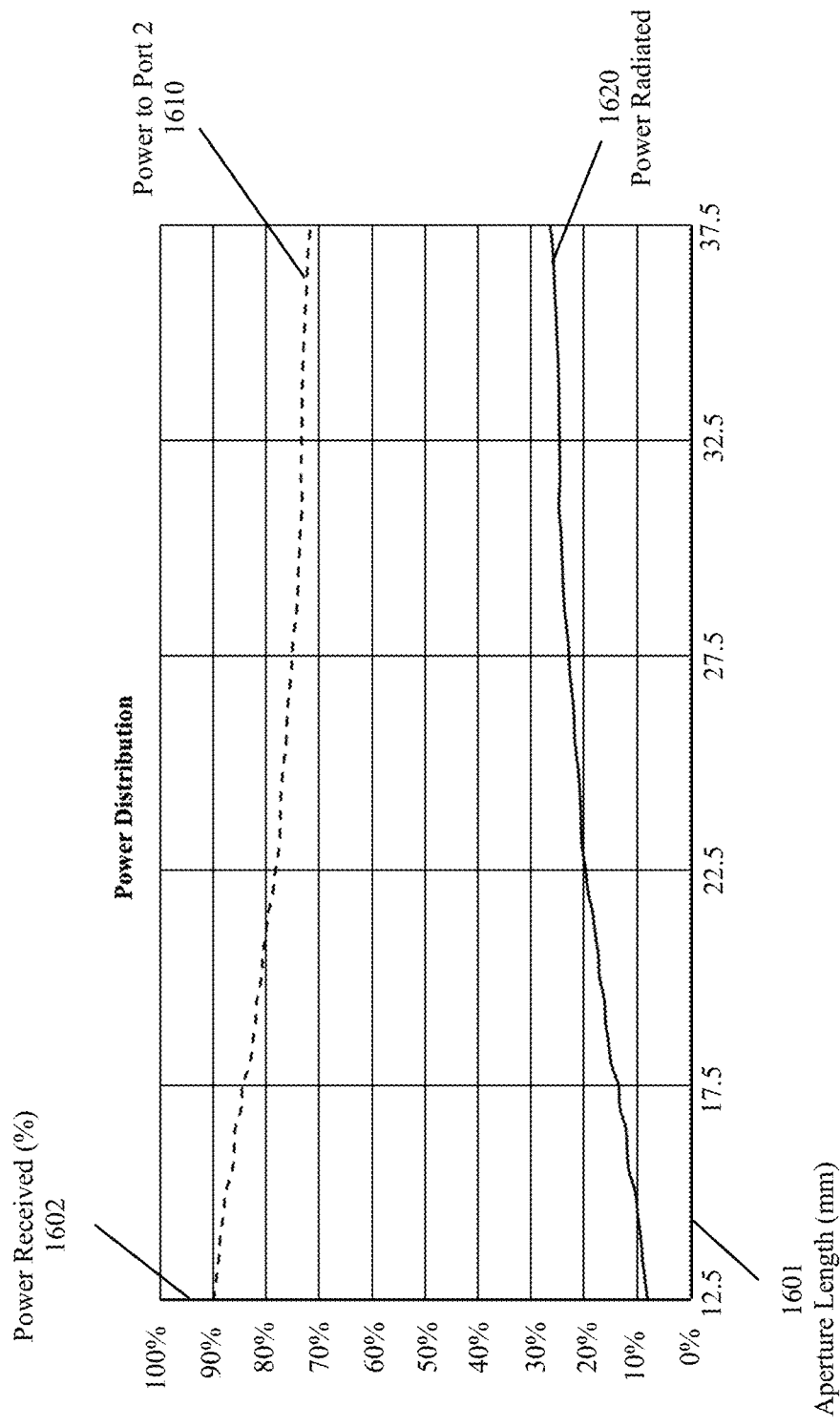
FIG. 16 shows the power distribution in terms of aperture length, according to an example implementation of the present application.

FIG. 16 shows the power distribution 1602 in terms of aperture length 1601. according to an example implementation of the present application. With reference to FIG. 16, the power transmitted to port 2 (graph 1610) and the radiated power 1620 as shown.

As FIG. 16 shows, longer aperture allows antenna to capture more of the incoming signal, providing better coverage over a wider area. It may also be observed that the amount of power that is coupled through the aperture saturates when the aperture length reaches at a certain point, which is approximately 28.5 mm in this case. In other words, power radiated through the aperture is not flexible since only less than 30% at most may be received by top radiating elements which is not ideal for either a 2- or a 3-element array. Therefore, another method should be applied to the structure to achieve the desired power distribution flexibility.

As the aperture length increases, the resonant frequency shifts slightly, while the return loss remains acceptable (e.g., at below −12 dB). This implies that only a small portion of the power (e.g., less than 6%) is returned to port 1, with most of the power either transmitted to port 2 or coupled through the aperture. This phenomenon gives an ideal of tuning aperture length to adjust the power distribution.

b. Radiating Patch Length

The radiating patch length affects the resonant frequency of an aperture coupled antenna by changing the effective length of the antenna. As the length of the radiating patch increases, the resonant frequency of the antenna may decrease due to the shorter radiating patch having a lower electrical length which may cause the antenna to resonate at a higher frequency. Conversely, as the length of the radiating patch decreases, the resonant frequency of the antenna increases. With adjusting the patch length, a desirable value of S11 or S21 may be chosen if the general performance of transmission is known under a certain range of the frequency. S11 is the reflection coefficient and represents the return loss or how much power is reflected from the antenna. S21 is the power transferred from port 1 to port 2.

Figure 17:
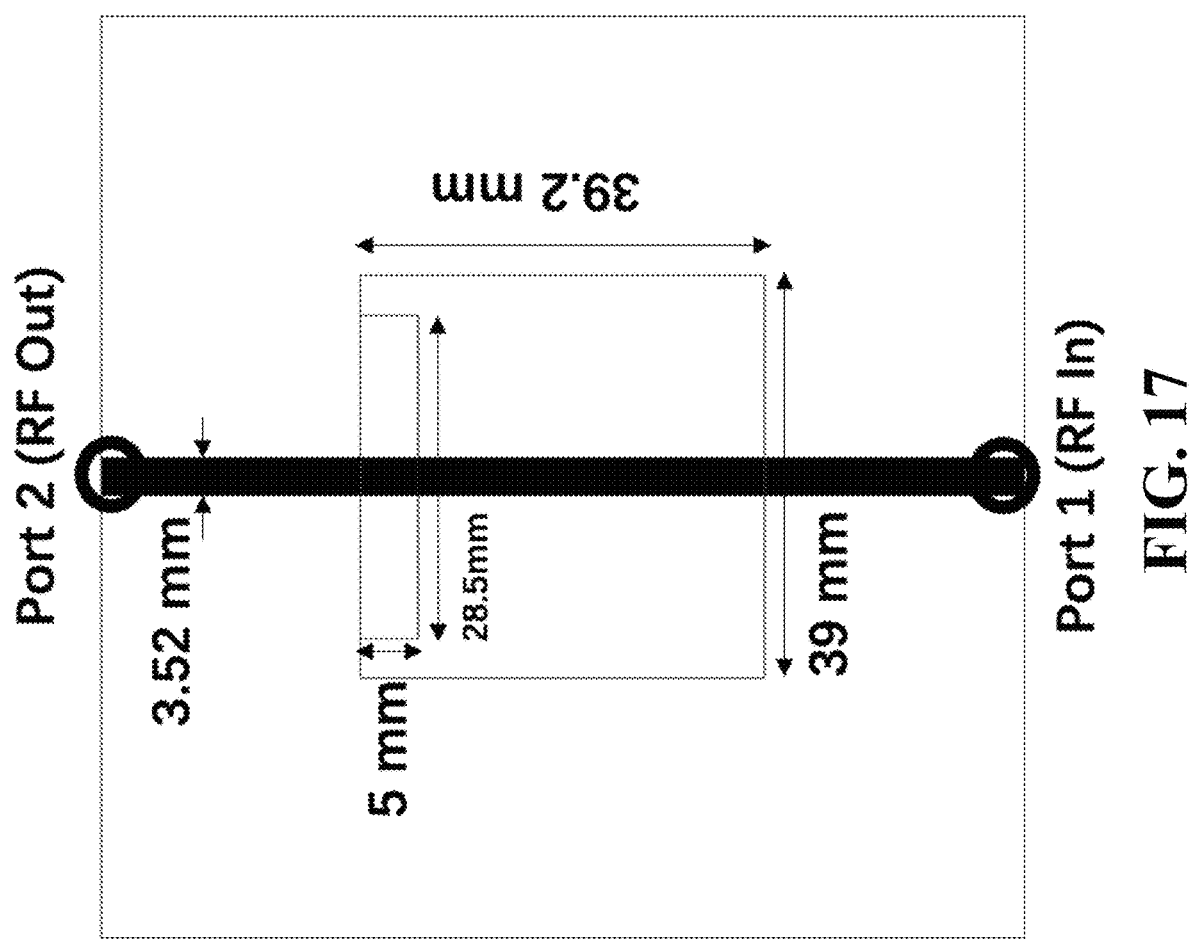
FIG. 17 illustrates the dimensions of an exemplary radiating patch with the size of 39 mm×39.2 mm, and FIG. 18 illustrate the general transmission performance of the radiating patch of FIG. 17, according to an example implementation of the present application.
Figure 18:
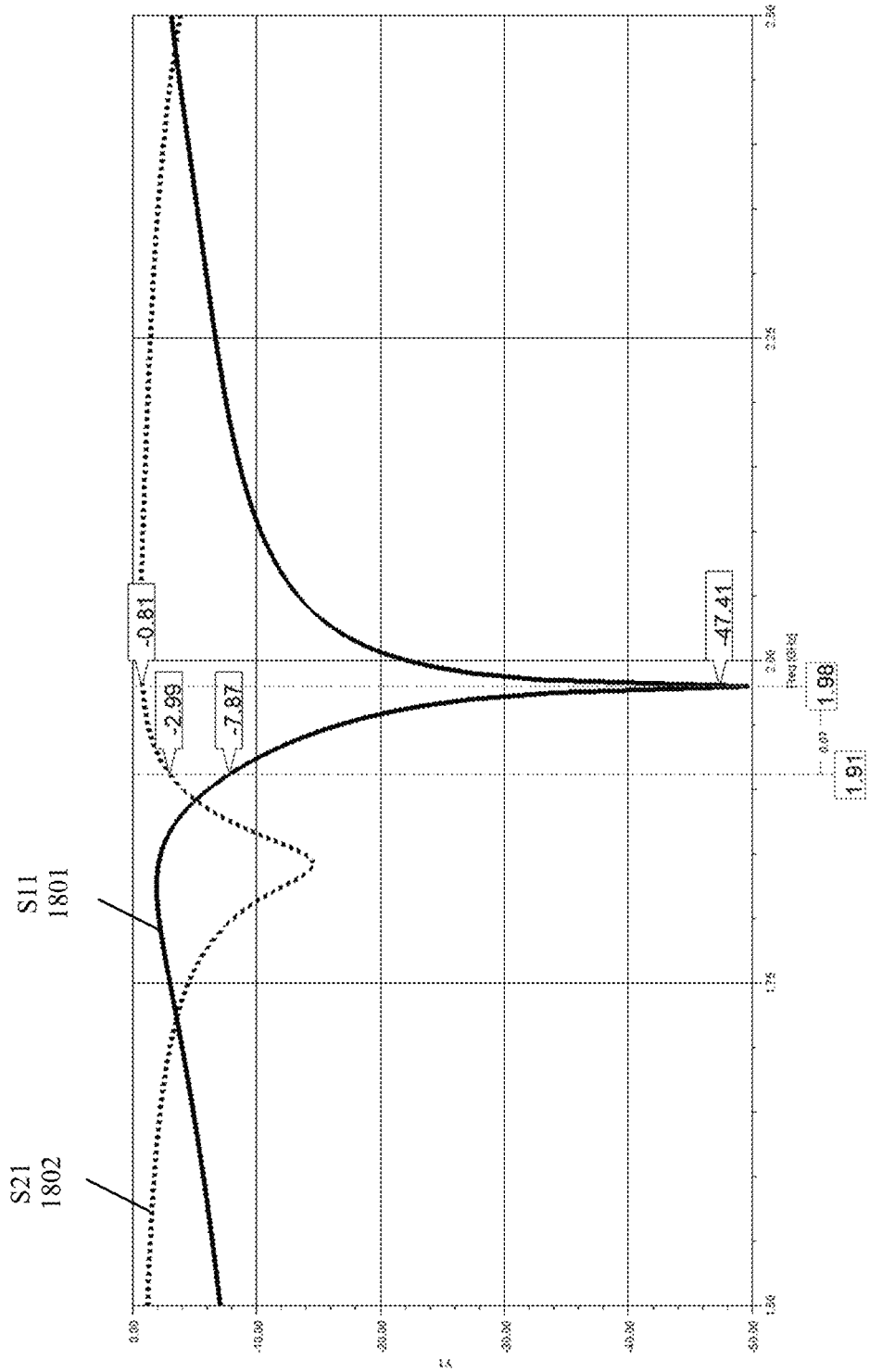

FIG. 17 illustrates the dimensions of an exemplary radiating patch with the size of 39 mm×39.2 mm, and FIG. 18 illustrate the general transmission performance of the radiating patch of FIG. 17, according to an example implementation of the present application. As shown in FIG. 18, the resonant frequency of the structure of FIG. 17 is at 1.98 GHZ. However, it is also noticed that a S21 1802 of −0.91 dB at the resonance, which is not promising since only around 17-18% of the total power is transmitted through the aperture thus makes a bad power splitter.

As the frequency is getting smaller away from the resonance, the S21 1802 is getting lower, indicating that more power transmits to the patch with the sacrifice of the transmission performance (S11 1801). For instance, the S21 1802 is around −3 dB at 1.91 GHZ which makes a relatively good power splitter, only if the S11 1801, which is −7.87 dB, is not taken into the consideration.

Based on the previous structure, the patch length may be decreased to bring up the resonance as well as acquiring a good S21. A design process of an aperture coupled structure with embedded 1:1 power splitter is described below.

c. Aperture Coupled Structure with Embedded 1:1 Power Splitter

FIG. 19 illustrates an example of structure with a reduced length with the patch size of 39 mm×38 mm, with both top and bottom substrates of material having thickness of 62 mil and dielectric constant of 3.55, according to an example implementation of the present application. FIG. 20 illustrates the transmission performance of the structure of FIG. 19 at an operating frequency of 2 GHZ, according to an example implementation of the present application.

As shown in FIG. 20, S21 2002 is −3 dB at 2 GHz, meanwhile S11 2001 needs to be fixed since a legitimate 1:1 power splitter may be attained only if the return loss is as low as possible. Therefore, a match stub is introduced here.

FIG. 21 illustrates a stub 2101 that may be placed before an output connector 2102 to compensate for mismatch, according to an example implementation of the present application. In microwave engineering, a resonant stub 2101 is a length of transmission line that is connected at one end only. Conventionally, stubs may match a load impedance to the transmission line characteristic impedance since the resistive part of the stub's load impedance is made equal to the resistive part of the characteristic impedance of the main transmission line 2103.

Stub tuning involves adjusting the existing length of transmission line by adding another length of line in either series, shunt, open circuit, or short circuit configuration, to ensure the line is properly matched to the load. The Smith chart, conventionally, is a tool for visualizing the impedance of a transmission line and performing the match impedance. Stub impedance matching on a Smith chart is a method of matching the impedance of a transmission line to the impedance of a load. This may be done by moving the stub along the Smith chart until the imaginary part of reactance of the load is cancelled out by the reactance of the stub.

FIG. 22 illustrates the normalized characteristic impedance at 2 GHz labelled on the Smith chart when the information on FIG. 20 is transferred to Smith chart, according to an example implementation of the present application. With the given impedance, an open circuit stub is selected for the match procedure that is performed on the Smith chart. FIG. 23 illustrates the stub matching solution on the Smith chart in terms of the matching stub's length and location, according to an example implementation of the present application.

To eliminate the imaginary part of admittance $Y_A$, let:

$$Y_{add} = +j \cdot 0.8$$

Where, $$Y_{add} = j \cdot \tan\beta l_{Stub\ Length}$$

Thus, $$l_{Stub\ Length} = \arctan(0.8)\frac{\lambda}{2\pi} = 0.107\lambda$$

And the distance $l_D$ between the feeding point and the stub is:

$$l_D = 0.24\lambda + \frac{n\lambda}{2}(n = 0, 1, 2...)$$

Where $\lambda$ is the wavelength of the travelling wave of the dielectric.

For the material of Rogers 4003C, the dielectric constant $\varepsilon_r$ is 3.55 and the dielectric thickness H is 1.575 mm, the transmission line width W is 3.2 mm. Thus, the effective dielectric constant:

$$\varepsilon_{eff} = \frac{\varepsilon_r + 1}{2} + \left[\frac{\varepsilon_r - 1}{2\sqrt{1 + 12\left(\frac{H}{W}\right)}}\right] = 2.76$$

So, wavelength at operating frequency of 2 GHz is:

$$\lambda = \frac{c}{f\sqrt{\varepsilon_{eff}}} = 90\ mm$$

Therefore, the stub length:

$$l_{Stub\ Length} = 0.107 \times 90 = 9.63\ mm$$

And for the stub location, let n=1, so that:

$$l_D = 0.24 \times 90 + \frac{\lambda}{2} = 66.6\ mm\ (n = 1)$$

FIG. 24 illustrates the structure of an aperture coupled antenna element before 2410 and after 2420 a stub is added to the main transmission line underneath the radiating patch, according to an example implementation of the present application. As shown in FIG. 24, a stub 2101 is added to the main transmission line 2103.

FIG. 25, illustrates the comparison of transmission performance at 2 GHZ, according to an example implementation of the present application. With reference to FIG. 25, the plot 2510 (at 2 GHZ) of S11 2501 and S21 2502 of the structure 2410 of FIG. 24 and the plot 2520 (at 2 GHz) of S11 2501 and S21 2502 of the structure 2410 with stub added underneath the patch 2420 of FIG. 24, according to an example implementation of the present application.

Adding the stub may result in the impedance being well-matched. It may also be observed that S21 2502 is increasing, indicating that more power is transmitted to port 2 with the presence of the matching stub. Therefore, a previous structure with relatively lower S21 should be selected to compensate the increasing in transmitted power after the adding of the stub. This may be accomplished by slightly decreasing the patch length. FIG. 26 illustrates the structure 2610 with the patch size of 39 mm×37.84 mm and the corresponding transmission performance 2620 and normalized characteristic impedance 2630, according to an example implementation of the present application. With reference to FIG. 26, the transmission performance 2620 shows the plots of S11 2601 and S21 2602.

The S21 2602 of the adjusted structure may be slightly lower than −3 dB. Similarly, with the given value of the impedance, the matching stub procedure can be carried out on Smith chart. FIG. 27 illustrates the stub matching procedure on the Smith chart, according to an example implementation of the present application.

Therefore, the stub length:

$$l_{Stub\ Length} = \arctan(1.05)\frac{\lambda}{2\pi} = 11.6\ mm$$

And for the stub location, let n=1, so that:

$$l_D = 0.235 \times 90 + \frac{\lambda}{2} = 66.15\ mm\ (n = 1)$$

FIG. 28 illustrates the adjusted structure 2810 with matching stub and the corresponding transmission performance 2820, according to an example implementation of the present application. With reference to FIG. 28, the plots of S11 2801 and S21 2802 are shown in the transmission performance diagram 2820. Based on the S-parameter plot 2820, it may be concluded that the aperture coupled structure of the present implementations contains an embedded 1:1 power splitter with satisfactory transmission performance at 2 GHz.

d. Series Aperture Coupled Fed Technique

The design process of aperture coupled structure with embedded 1:1 power splitter through adjusting the aperture length, patch size and tuning the matching stub was described above. Similarly, a structure with a 2:1 power splitter may be designed. FIG. 29 illustrates an example structure with a 2:1 power splitter working at 2 GHz, according to an example implementation of the present application. With reference to FIG. 29, the sizes of the structure 2910 with embedded 2:1 power splitter, and the plots of S11 2901 and S21 2902 at 2 GHz are shown. Based on the S-parameter plot 2920, it may be concluded that the aperture coupled structure of the present implementations contains an embedded 2:1 power splitter with satisfactory transmission performance at 2 GHz.

By incorporating the use of 1:1 and 2:1 power splitters, designing a 3-element array antenna has become much more straightforward by using the special feeding technique of the present implementations referred to herein as series aperture coupled feeding. This technique provides the technical advantage of simplifying the design of an N-element array antenna which makes easier without clumsy and cumbersome power splitting feeding network, like conventional quarter wavelength or Wilkinson divider. The series aperture coupled feeding method of the present implementation provides the technical advantage of allowing for greater flexibility in the design of the antenna, enabling the antenna to be tailored to meet specific requirements.

FIG. 30A illustrates a 1×3 antenna array 3000 based on the feeding technique of series aperture coupled feeding, according to an example implementation of the present application. The distance between each element 3010-3030 may be precisely adjusted to be slightly greater than one-half of the wavelength, ensuring that all the elements are in phase with one another as well as a conventional inter-element distance. The 2:1 module 3010 may be placed on bottom of the array 3000, the 1:1 module 3020 may be placed in the middle of the array 3000, and the top element 3030 of the array 3000 may be a regular structure of aperture couple fed antenna as shown in FIG. 30A. FIG. 30B illustrates the radiation pattern of the antenna array of FIG. 30A at 2 GHz. With reference to FIG. 30B, the plots of S11 (Phi=0) 3001 and S21 (Phi=90) 3002 at 2 GHz are shown FIG. 31, illustrates a typical aperture coupled fed antenna 3100 with a gain of 5.8 dBi, 3110, according to an example implementation of the present application.

Ideally, for an isotropic N-element array which is composed of identical antenna elements, each separated by a distance d=λ/2, the array factor $F_\alpha$ in terms of degree θ and directivity D can be written as:

$$F_{a(\theta)} = \frac{\sin\left(\frac{N(\pi \cdot \cos\theta + \delta)}{2}\right)}{\sin\left(\frac{\pi \cdot \cos\theta + \delta}{2}\right)}$$

$$D = \frac{\left(\sum_{n=0}^{N} I_n\right)^2}{\sum_{n=0}^{N} I_n^2}$$

where N is the element number, δ is phase difference between elements and $I_n$ is defined as the intensity of each of elements. By using the formula for calculation of gain of a 3-element array, it is possible to estimate the gain of the array if it is designed correctly. Due to the fact that each element has same amplitude, $I_n$ may be set as 1, thus the directivity of an isotropic 3-element array is:

$$Di = \frac{(1+1+1)^2}{1^2+1^2+1^2} = 3 = 4.77\ dBi$$

Therefore, the ideal directivity of the structure is:

$$D = 4.77 + 5.8 = 10.57\ dBi$$

FIG. 32 illustrates the simulation of radiation pattern of a 1×3 antenna array, according to an example implementation of the present application. With reference to FIG. 32, the directivity 3210 and the gain 3220 of the 1×3 antenna array are shown. The plots 3210 represent the gain of the E-plane (Phi=0 degrees) and the plots 3220 represent the gain of the H-plane (Phi=90 degrees). The result is consistent with the theoretical answer, which yields a directivity 3230 of 10.8 dBi, and after accounting for insertion loss, the realized gain 3240 is calculated to be 9.8 dBi.

The radiation pattern demonstrates a suitable candidate of feeding network system for array antenna. With the main beam remaining focused on the antenna boresight and a good antenna directivity and gain, which are legitimate performances for a 3-element array, it may be concluded that the power distribution and impedance match are successfully conducted by the special feeding technique of the present implementations.

It should be noted that the non-limiting example of the three-element linear feeding network for aperture coupled fed structure described in Section III may be applied for any of N-element linear feeding network for aperture coupled fed structure, where N is larger than 1.

IV. Series Aperture Coupled Fed Phased-Array Antenna

A. The Structure of Series Aperture Coupled Fed Phased Array

The novel design method of the present implementations for a linear feeding network for aperture coupled fed structure was discussed above. Beamforming may be accomplished by introducing phase shifters based on quadrature hybrid or circulators placed between transmission line segments of each of the radiating patches.

FIG. 33A illustrates the top view, FIG. 33B illustrates a trimetric view, and FIG. 33C illustrates an exploded view of the structure of a 3-element series aperture coupled fed phased array 3300, according to an example implementation of the present application. With reference to FIGS. 33A-33C, the phase shifters 3310 may be phase shifters that are based on quadrature hybrids, as described above with reference to FIGS. 1-6 and 10-12B. The phase shifters 3310 may be phase shifters that are based on circulators, as described above with reference to FIGS. 7-9. The variable capacitor(s) of each shifter unit 3310 may be tuned to create a phase shift, allowing this topology to provide the technical advantage of enhancing beamforming even with a small shift caused by each shifter unit due to the cascade structure. The exploded view of FIG. 33C shows the radiating patch of each antenna element, the aperture of each antenna element, the dielectric substrates 1301-1302, the ground plane 1330 with the apertures 1320, the transmission lines 3340 with the phase shifter units 3310 and stubs 2101, and the vias 1330 to the ground plate 1303 to ground one or more ports of the phase shifters as described above with reference to FIGS. 1 and 5-8. Several non-limiting examples of phased array antennas using the series aperture coupled fed antenna of the present embodiments are described below that use phase shifters based on quadrature hybrid placed between transmission line segments of each of the radiating patches. It should be noted that the similar phased array antennas may be implemented based on circulators placed between transmission line segments of each of the radiating patches.

The effects of changing capacitance values may be determined by simulation. The parallel-plate capacitors may be used to tune the quadrature hybrid phase shifters by varying the dielectric constant to alter the capacitance value. FIG. 34 illustrates each phase shifter unit 3310 being tuned by 2 parallel-plate capacitors 3400 attached to the end of quadrature hybrid structure, according to an example implementation of the present application.

B. The Simulation Results

The simulation testing of the 3-element series aperture coupled fed phased array is performed with a plate size of 3 mm×3.2 mm and an inter-plate distance of 3 mm, operating at 2 GHz. FIG. 35 shows a table 3500 for the dielectric constant values 3501 and the capacitor values 3500 used for the simulation, according to an example implementation of the present application.

FIGS. 36A, 36B, 36C, 36D, 36E, ad 36F illustrate beamforming performances with the capacitance values of 0.0283 pF, 0.283 pF, 0.567 pF, 0.850 pF, 1.130 pF, and 1.420 pF respectively, according to an example implementation of the present application. With reference to FIGS. 36A-36F, the antenna gain values found by simulation testing of the 3-element series aperture coupled fed phased array are shown. The plots 3610 represent the gain of the E-plane (Phi=0 degrees) and the plots 3620 represent the gain of the H-plane (Phi=90 degrees).

Figure 36A:
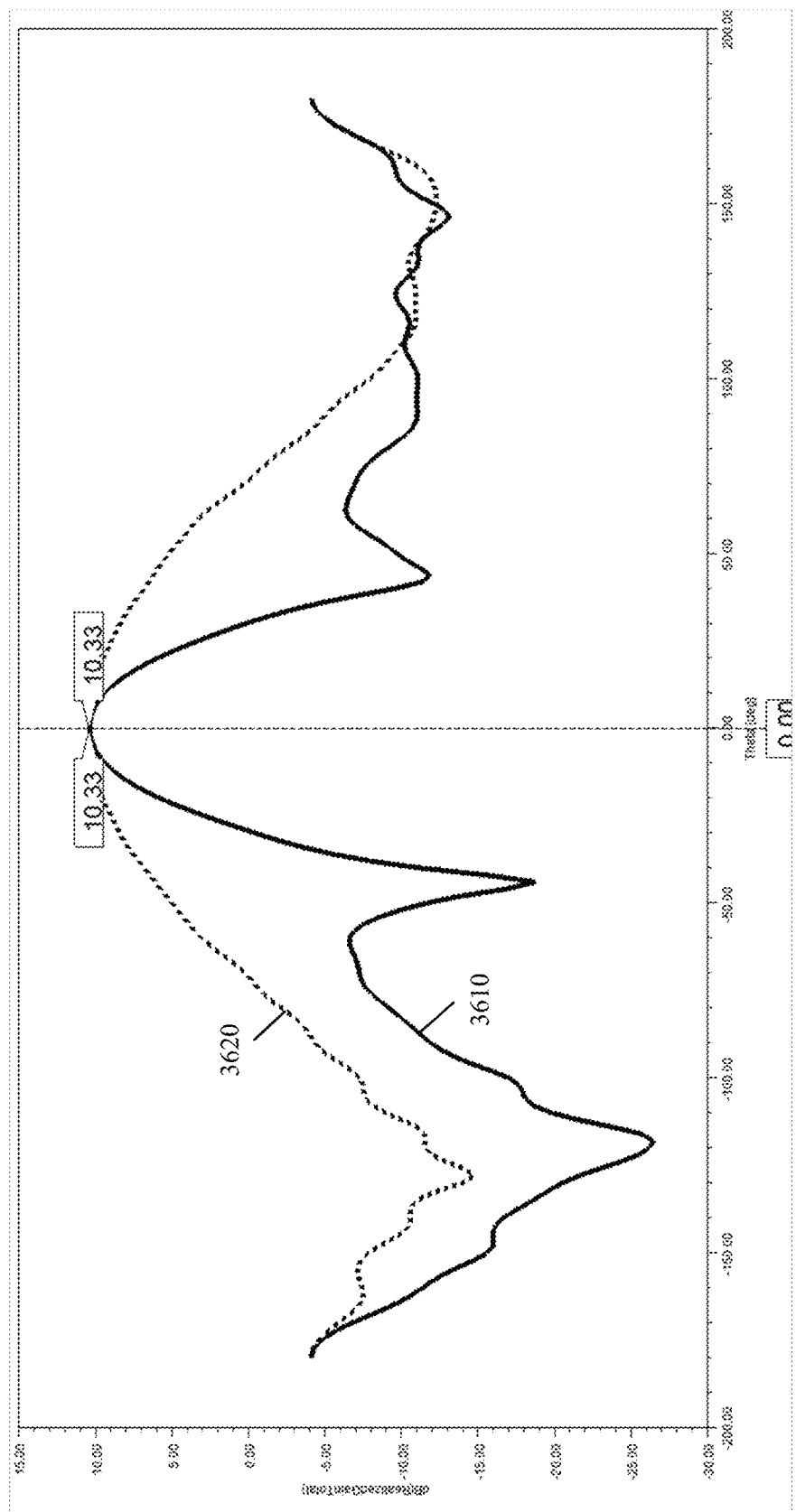
Figure 36B:
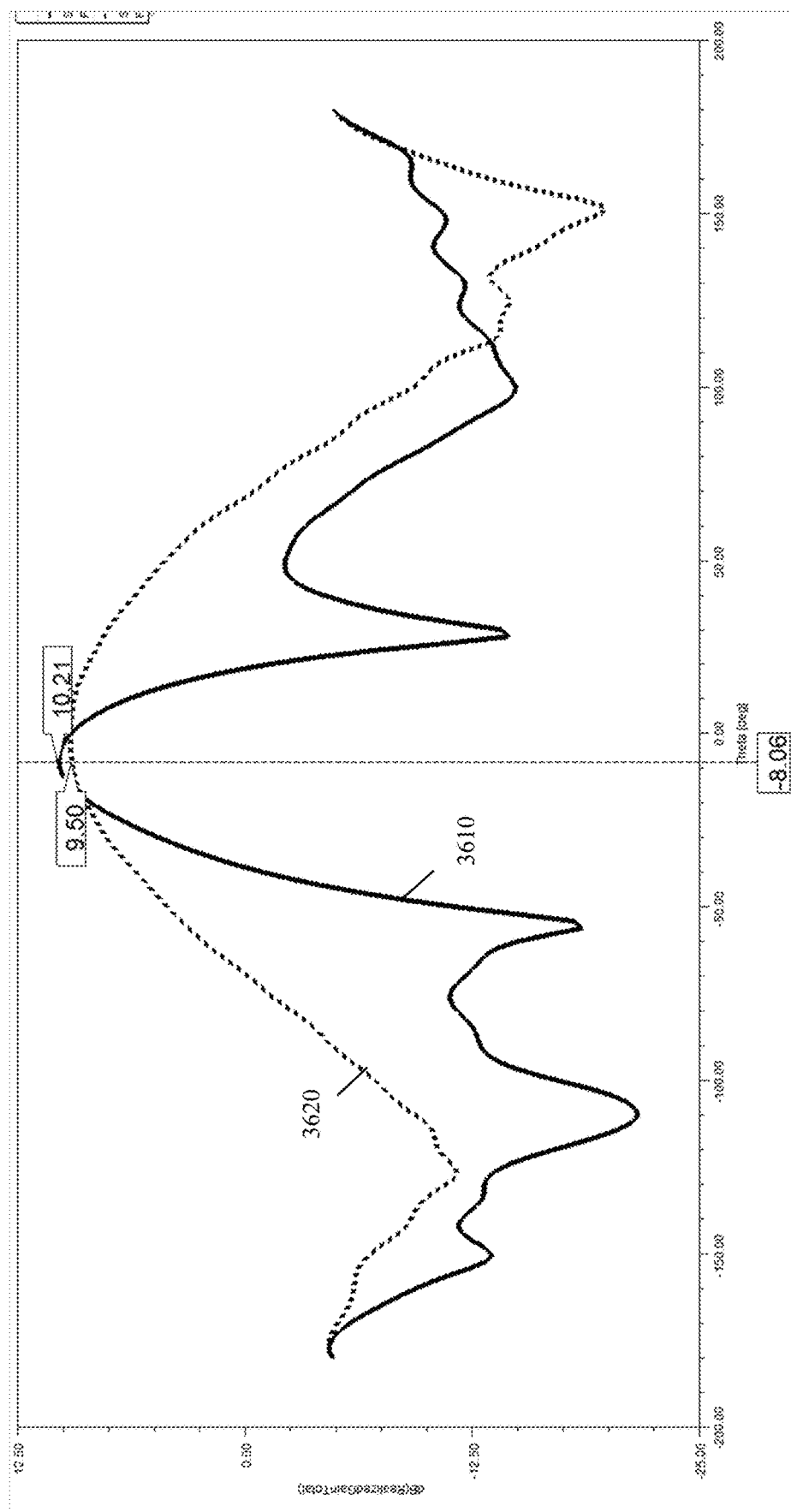
Figure 36C:
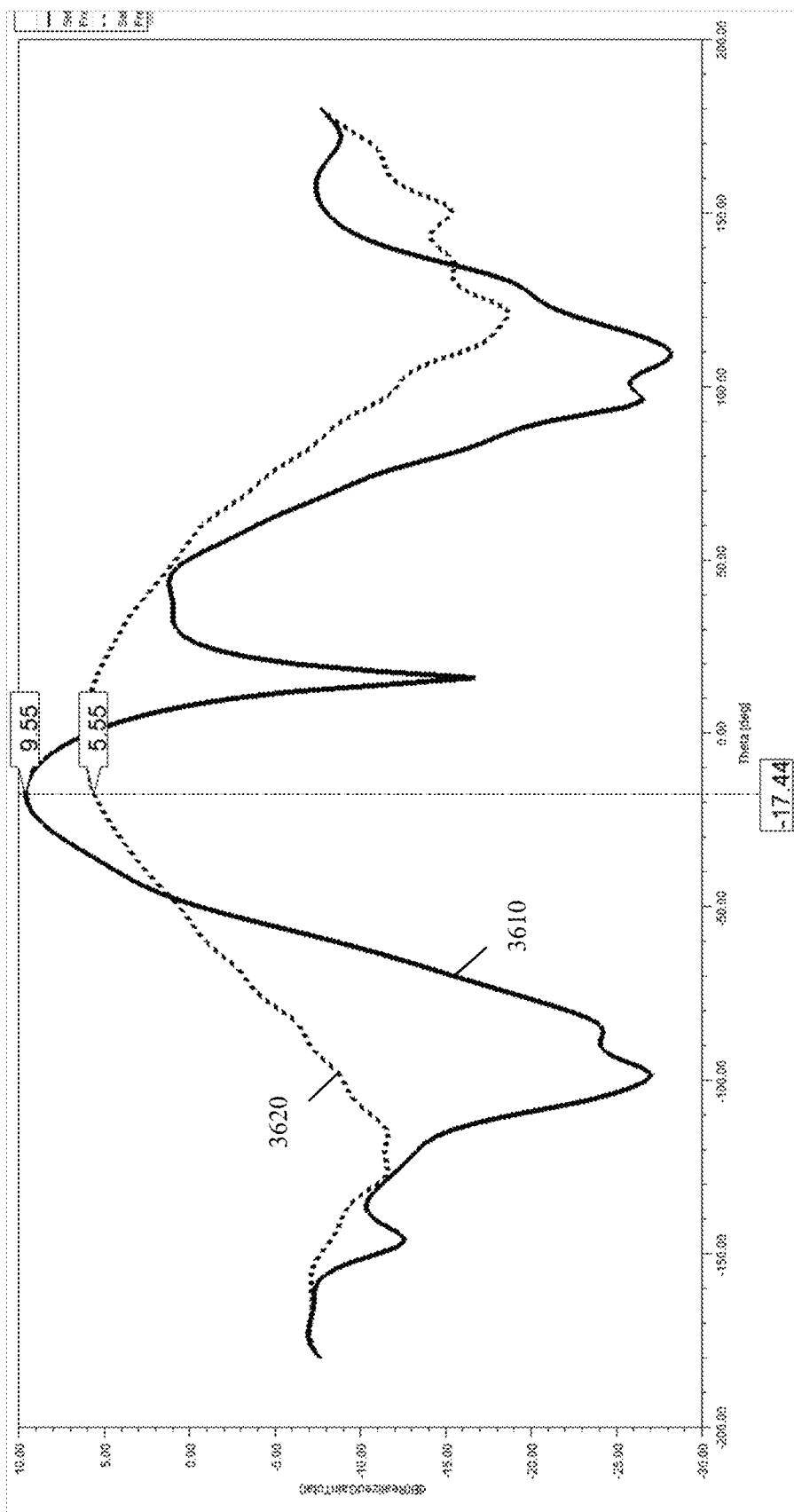
Figure 36D:
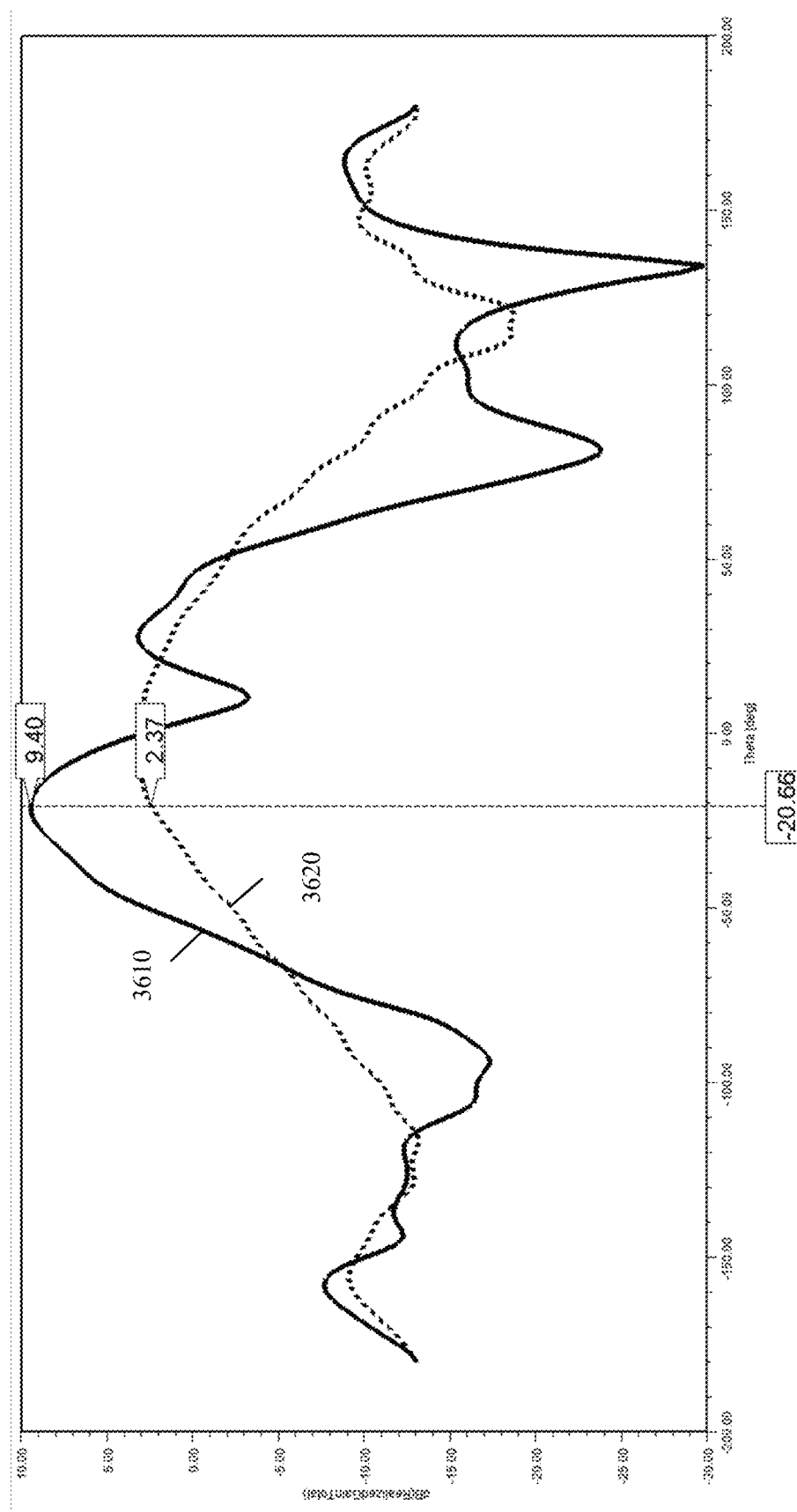
Figure 36E:
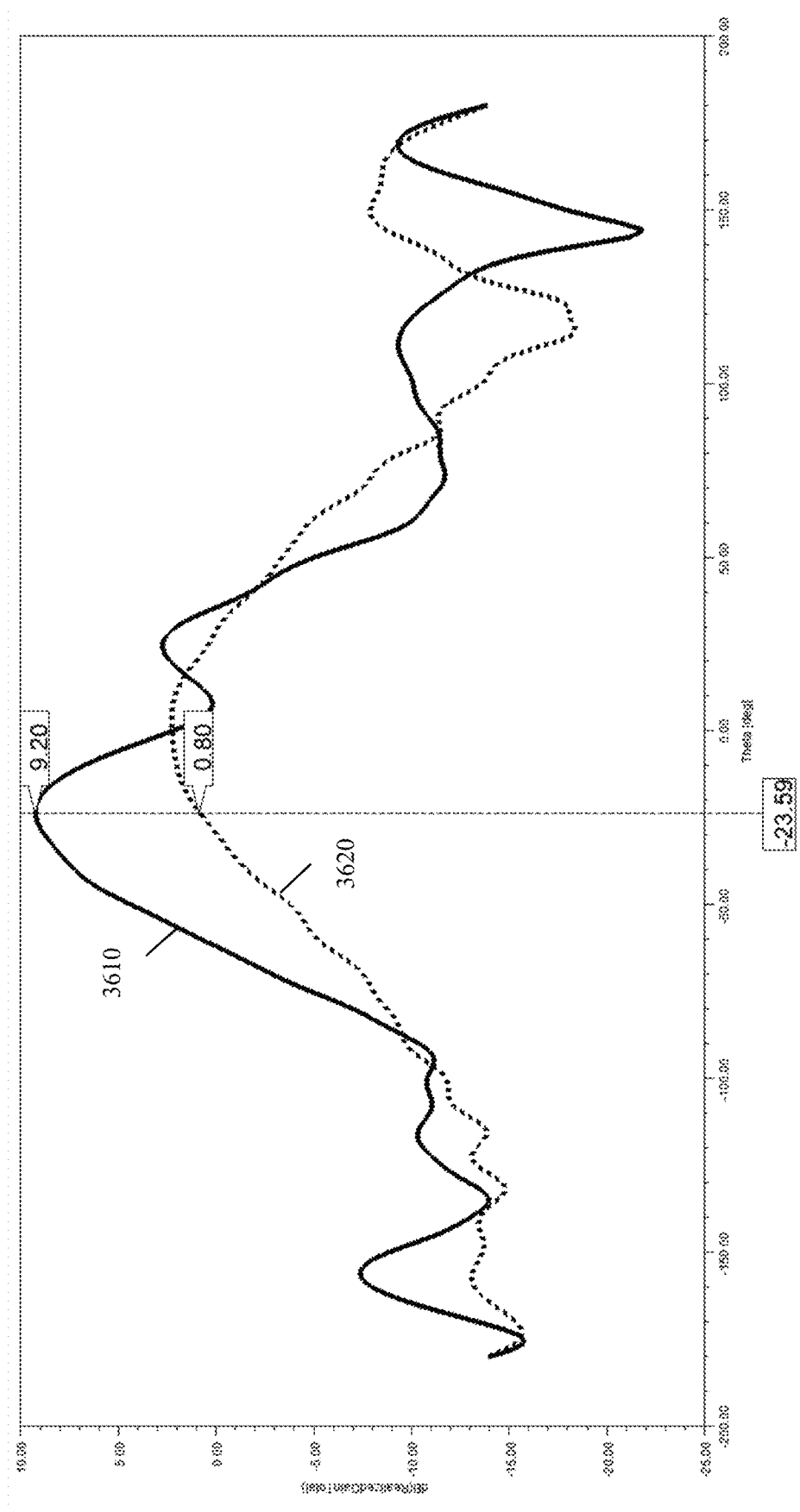
Figure 36F:
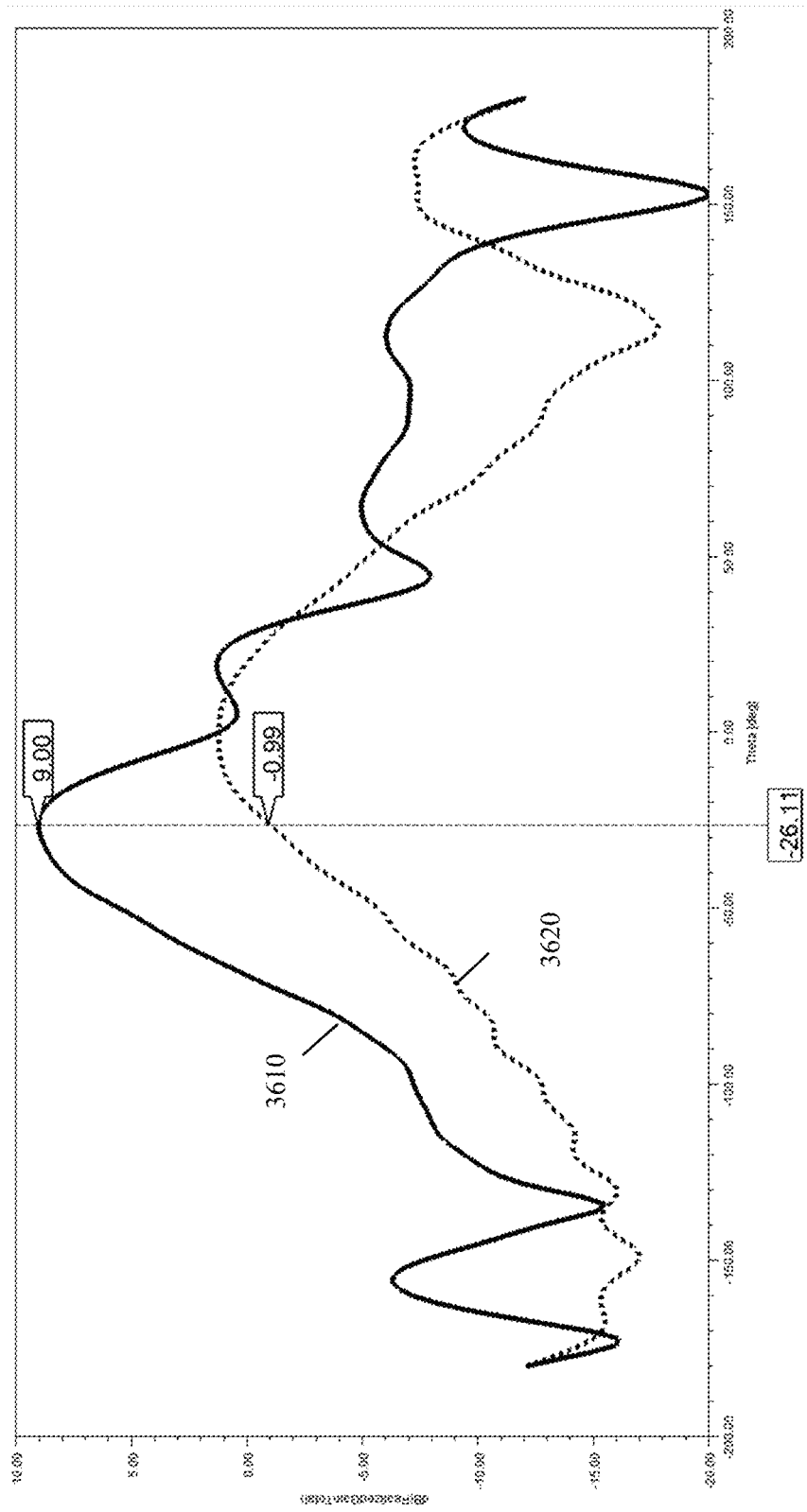
Figure 37B:
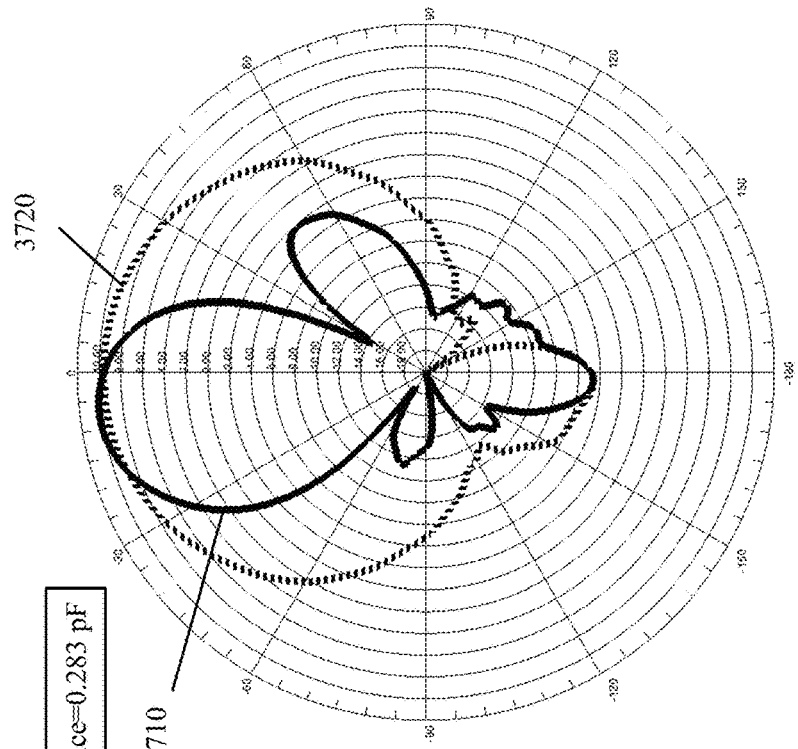
Figure 37A:
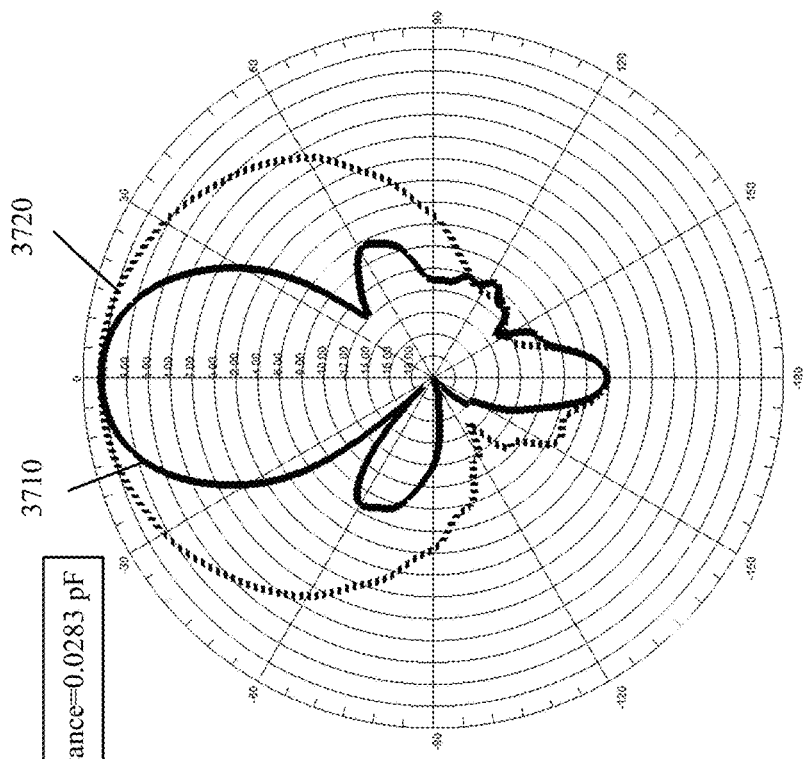
Figure 37D:
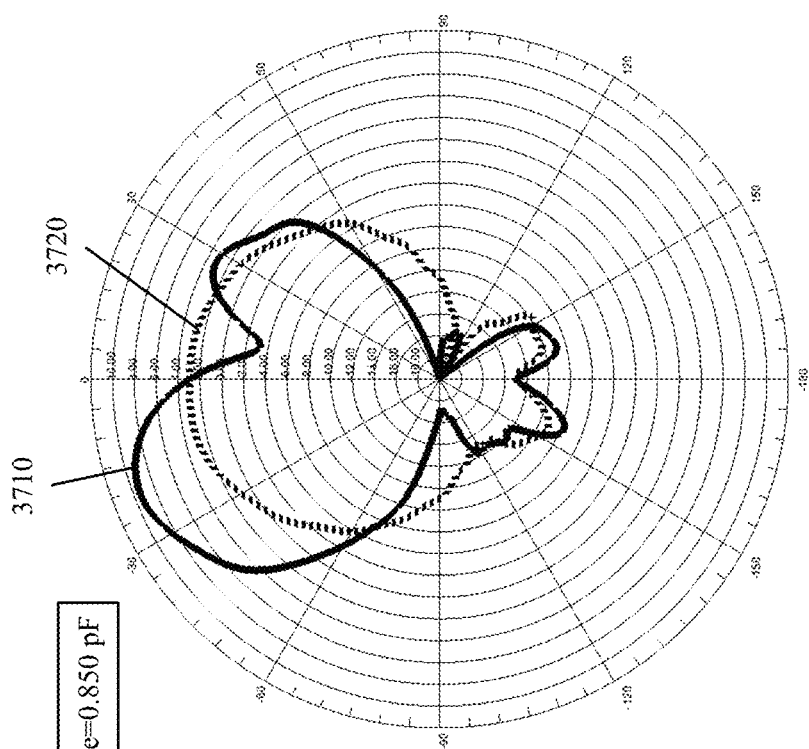
Figure 37C:
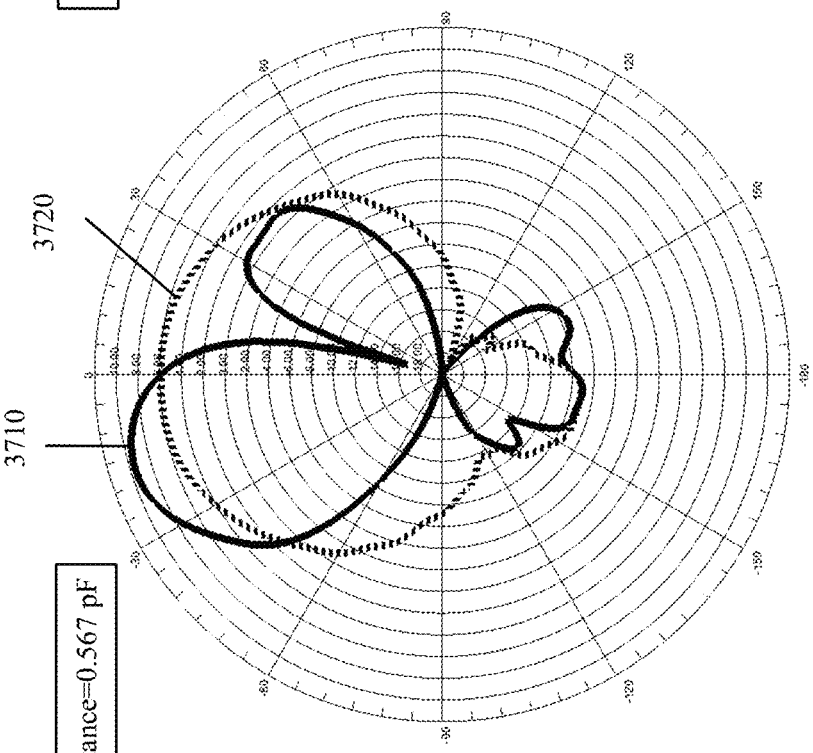
Figure 37F:
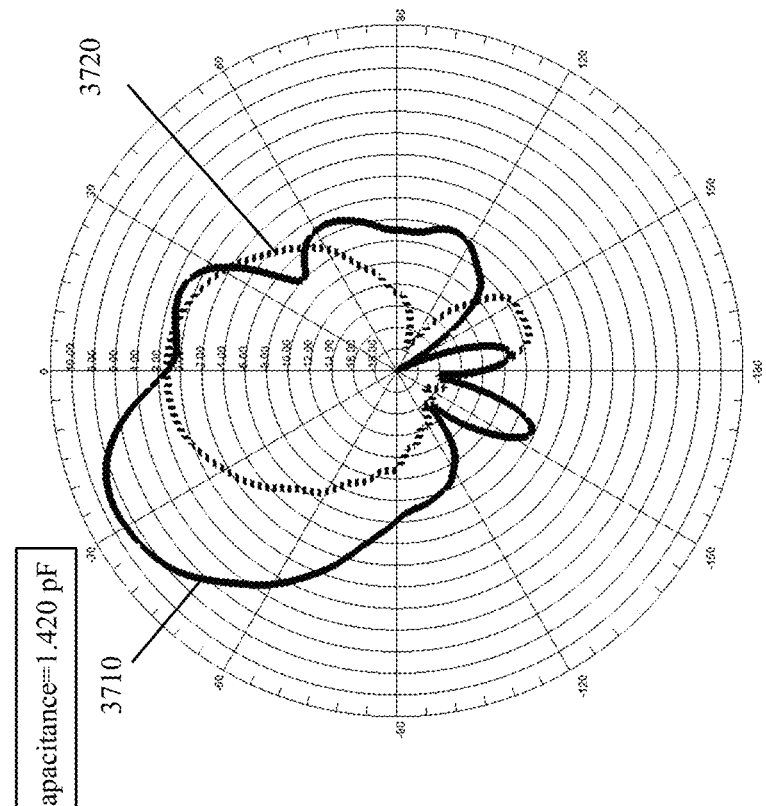
Figure 37E:
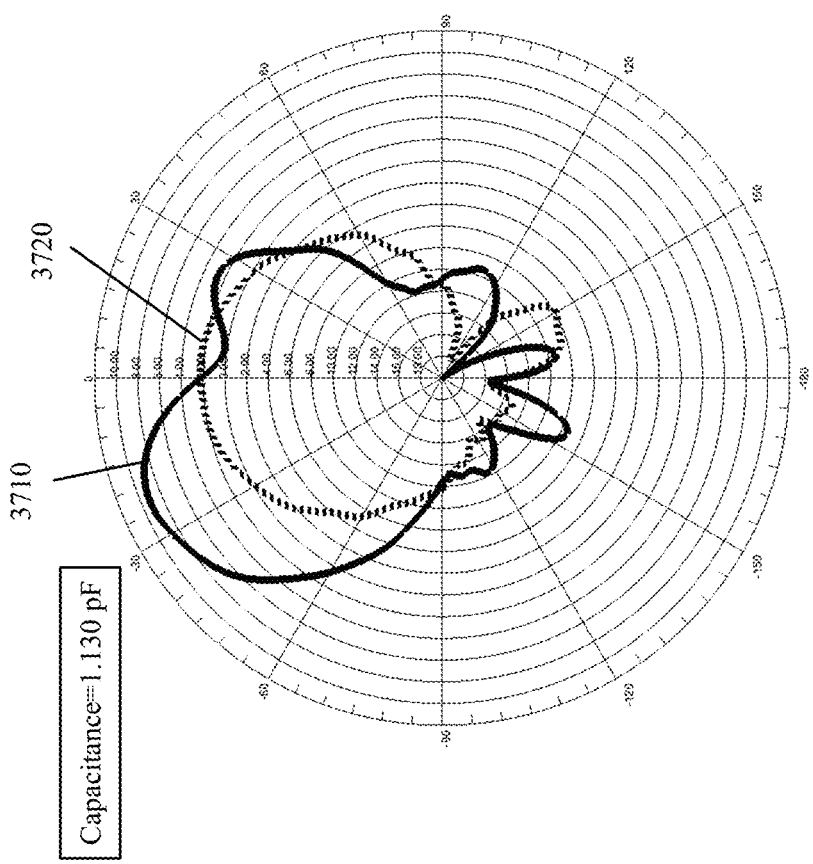

FIG. 36A shows that when capacitance value is very small (0.0283 pF), the main lobe (maximum gain) remains at 0 degree with a realized gain of 10.33 dBi. FIG. 36B shows that the main lobe is at −8.06 degree with a gain of 10.21 dBi when capacitance value is 0.283 pF. FIG. 36C shows that the main lobe is at −17.44 degree with a gain of 9.55 dBi when capacitance value is 0.567 pF. FIG. 36D shows that main lobe is at −20.66 degree with a gain of 9.40 dBi when capacitance value is 0.850 pF. FIG. 36E shows that the main lobe is at −23.59 degree with a gain of 9.20 dBi when capacitance value is 1.130 pF. FIG. 36F shows that the main lobe is at −26.11 degree with a gain of 9.00 dBi when capacitance value is 1.420 pF.

The examples of FIGS. 36A-36F show that the phased array structure of the present implementations is highly sensitive to changes in the beamforming angle, as the capacitance value does not vary significantly within a range of 1.5 pF. FIGS. 37A-37F show the general beamforming performances in polar diagram of radiation pattern in terms of the capacitance value for E-plane (Phi=0 degrees) 3710 and H-plane (Phi=90 degrees) 3720, according to several example implementations of the present application.

By manipulating the capacitance values, the beamforming angle may be optimized to direct the signal in the desired direction. The maximum radiation direction may rotate counterclockwise with the capacitance variation steering until the beamforming angle is at 51 degrees, with a main lobe gain of 7.69 dBi, which is almost 3 dBi less than the gain when the capacitance value is zero (zero phase shift). This is considered a good beamforming performance and may be made more sensitive to the capacitance variation if more elements are added. FIG. 38 illustrates the main lobe direction in degrees 3802 in terms of the capacitance values 3801 in pF, according to an example implementation of the present application. The figure shows how the main lobe degree changes as the capacitance values are adjusted, allowing for precision control of the beamforming angle.

C. 4×4 Planar Array

Another non-limiting example of a phased array antenna using the series aperture coupled fed antenna of the present embodiments are described below. The 1×3 array described above be extended to, for example, and without limitations, to a 4×4 planar array. An elevation phase shifter may be positioned between each pair of 1×4 linear arrays.

FIG. 39 illustrates the layout of a 4×4 series aperture coupled fed phased array 3900, according to an example implementation of the present application. FIG. 40 illustrates the layout of a 4×4 series aperture coupled fed phased array with control system, according to an example implementation of the present application.

With reference to FIGS. 39 and 40, each 1×4 array may include 4 radiating patches 3910 (only one of the four 1×4 arrays is identified by the dashed line 3905 to maintain clarity). To ensure each 1×4 array receives the same amount of RF power, the total power may be split into four portions. The total power may be split into 4 portions and one fourth of the total power may pass to the first 1×4 linear array and three quarters may pass to the next stage by a 1:3 power splitter 3920. After the first phase shifter, the remaining ¾ power may be split into 3 portions and one third of which may pass to the second linear array and two thirds may pass to the next stage by a 1:2 power splitter 3930. After the second phase shifter, the remaining ½ power may be split into 2 portions and half of which may pass to the third linear array and half may pass to the next stage by a 1:1 power splitter 3940. There may be 4×3 azimuthal phase shifters (only one group of 1×3 azimuthal phase shifters is identified by the dashed line 3950 to maintain clarity), tuning by the DC azimuthal control 4010 (FIG. 40) and 3 elevation phase shifters 3960, tuning by the DC elevation control 4020 (FIG. 40). The DC azimuthal control 4010 and the DC elevation control 4020 may be provided by the DC controller 4030.

It should be noted that the non-limiting example of the phased array antenna described in Section IV may be applied to implement a phased array antenna that uses N 1×M linear feeding aperture coupled fed structures, where M is larger than 1.

In a first aspect, a radio frequency (RF) phase shifter comprises an input terminal; an output terminal; a quadrature hybrid comprising first, second, third, and fourth ports; and first and second varactors. Each varactor comprises first and second ends. A capacitance of each varactor changes by changing an external bias voltage applied to the varactors. The input terminal of the RF phase shifter is connected to the first port of the quadrature hybrid. The output port of the RF phase shifter is connected to the fourth port of the quadrature hybrid. The first end of the first varactor is connected to the second port of the quadrature hybrid. The first end of the second varactor is connected to the third port of the quadrature hybrid. The second ends of the first and second varactors are connected to a ground conductor. The RF phase shifter is configured to receive RF signals through the input terminal, pass the RF signals through the quadrature hybrid to the second and third ports of the quadrature hybrid, and reflect the RF signals from the first and second varactors into the quadrature hybrid. The RF signals reflected from the second and third ports reach the first port with 180 degrees phase difference, resulting in no reflection at the first port of the quadrature hybrid and the input terminal of the phase shifter. The RF signals reflected from the second and third ports reach the fourth port of the quadrature hybrid and the output terminal of the phase shifter with a same phase shift, resulting in a constructive interference at the fourth port. The phase shift of the RF signals at the fourth port of the quadrature hybrid and the output terminal of the phase shifter is equal to −270 degrees plus a phase shift that is a function of the bias voltage applied to the first and second varactors.

In an embodiment of the first aspect, the quadrature hybrid is positioned on a top surface of a substrate. Each of the first and second varactors comprises a plurality of active switches inside the substrate. Each active switch comprises first and second conducting elements; a conducting triangular plate, wherein a first side of the conducting triangular plate is connected to the first conducting element of the active switch; and a gap layer between the second conducting element and a tip of the conducting triangular plate that is opposite to the first side. The external bias voltage is applied between the first and second conducting elements of the active switches of each varactor.

In another embodiment of the first aspect, the active switches of each varactor are arranged in a plurality rows and columns. At least some of the active switches share a conducting element with another active switch in a same column.

In another embodiment of the first aspect, the gap layer defines a cavity. The cavity is filled with air or one or more inert gases.

In another embodiment of the first aspect, the gap layer defines a cavity, and inside the cavity is vacuum.

In another embodiment of the first aspect, the gap layer is a dielectric layer comprising a plurality of channels.

In another embodiment of the first aspect, the dielectric layer comprises one of polyimide and polyester.

In another embodiment of the first aspect, the plurality of channels is filled with air or one or more inert gases.

In another embodiment of the first aspect, inside the plurality of channels is vacuum.

In another embodiment of the first aspect, the quadrature hybrid is positioned on a top surface of a substrate. Each of the first and second varactors comprises a plurality of active switches inside the substrate. Each active switch comprises first and second conducting elements; a conducting pin connected to the first conducting element of the active switch; and a gap layer between the second conducting element and a tip of the conducting pin. The external bias voltage is applied between the first and second conducting elements of the active switches of each varactor.

In another embodiment of the first aspect, the active switches of each varactor are arranged in a plurality rows and columns. At least some of the active switches share a conducting element with another active switch in a same column.

In another embodiment of the first aspect, the gap layer defines a cavity, and wherein the cavity is filled with air or one or more inert gases.

In another embodiment of the first aspect, the gap layer defines a cavity, and wherein inside the cavity is vacuum.

In another embodiment of the first aspect, the gap layer is a dielectric layer comprising a plurality of channels.

In another embodiment of the first aspect, the dielectric layer comprises one of polyimide and polyester.

In another embodiment of the first aspect, the plurality of channels is filled with air or one or more inert gases.

In another embodiment of the first aspect, inside the plurality of channels is vacuum.

An embodiment of the first aspect further comprises a first inductor connected in parallel with the first varactor; and a second inductor connected in parallel with the second varactor.

Another embodiment of the first aspect further comprises a first inductor connected in series with the first varactor; and a second inductor connected in series with the second varactor.

In another embodiment of the first aspect, the first and second varactors have substantially identical characteristics.

In another embodiment of the first aspect, the quadrature hybrid and the varactors are positioned on a top surface of a substrate, wherein the substrate is backed by a ground plane, and wherein the ground conductor is connected to the ground plane.

In a second aspect, a radio frequency (RF) phase shifter comprises an input terminal; an output terminal; a circulator comprising first, second, and third ports; and a varactor having first and second ends. A capacitance of the varactor changes by changing an external bias voltage applied to the varactor. The input terminal of the RF phase shifter is connected to the first port of the circulator. The output terminal of the RF phase shifter is connected to the third port of the circulator. The first end of the varactor is connected to the second port of the circulator. The second end of the varactor is connected to a ground conductor. The RF phase shifter is configured to receive RF signals through the input terminal, pass the RF signals through the circulator to the second port of the circulator, reflect the RF signals from the varactor into the circulator with a phase shift that is a function of the bias voltage applied to the varactor, and output the phase shifted RF signals from the third port of the circulator and the output terminal of the phase shifter.

In an embodiment of the second aspect, the varactor comprises a plurality of active switches inside a substrate, each active switch comprising first and second conducting elements; a conducting triangular plate, wherein a first side of the conducting triangular plate is connected to the first conducting element of the active switch; and a gap layer between the second conducting element and a tip of the conducting triangular plate that is opposite to the first side. The external bias voltage is applied between the first and second conducting elements of the active switches of the varactor.

In another embodiment of the second aspect, the active switches of the varactor are arranged in a plurality rows and columns, wherein at least some of the active switches share a conducting element with another active switch in a same column.

In another embodiment of the second aspect, the gap layer defines a cavity, and wherein the cavity is filled with air or one or more gases.

In another embodiment of the second aspect, the gap layer is a dielectric layer comprising a plurality of channels.

In another embodiment of the second aspect, the dielectric layer comprises one of polyimide and polyester.

In another embodiment of the second aspect, the varactor comprises a plurality of active switches inside the substrate. Each active switch comprises first and second conducting elements; a conducting pin connected to the first conducting element of the active switch; and a gap layer between the second conducting element and a tip of the conducting pin. The external bias voltage is applied between the first and second conducting elements of the active switches of the varactor.

In another embodiment of the second aspect, the active switches of the varactor are arranged in a plurality rows and columns, wherein at least some of the active switches share a conducting element with another active switch in a same column.

In another embodiment of the second aspect, the gap layer defines a cavity, and wherein the cavity is filled with air or one or more gases.

In another embodiment of the second aspect, the gap layer is a dielectric layer comprising a plurality of channels.

In another embodiment of the second aspect, the dielectric layer comprises one of polyimide and polyester.

An embodiment of the second aspect further comprises an inductor connected in parallel with the varactor.

An embodiment of the second aspect further comprises an inductor connected in series with the varactor.

In a third aspect, an electronic switch comprises an input terminal; an output terminal; a quadrature hybrid comprising first, second, third, and fourth ports; and a varactor having first and second ends, wherein a capacitance of the varactor changes by changing an external bias voltage applied to the varactor. The input terminal of the electronic switch is connected to the first port of the quadrature hybrid. The output port of the electronic switch is connected to the fourth port of the quadrature hybrid. The second port of the quadrature hybrid is open ended. The first end of the varactor is connected to the third port of the quadrature hybrid. The second end of the varactor is connected to a ground conductor. The electronic switch is configured to receive radio frequency (RF) signals through the input terminal, pass the RF signals through the quadrature hybrid to the second and third ports of the quadrature hybrid, and reflect the RF signals from the varactor at the third port of the quadrature hybrid and the open at the second port of the quadrature hybrid into the quadrature hybrid. In an on state of the electronic switch, the bias voltage applied to the varactor is selected such that a capacitance of the varactor is within a first threshold of a capacitance at the second port of quadrature hybrid. In the on state, the RF signals reflected from the second and third ports reach the first port with 180 degrees phase difference, resulting in a reflection at the first port of the quadrature hybrid and the input terminal of the electronic switch that is smaller than a third threshold, and wherein the RF signals reflected from the second and third ports reach the fourth port of the quadrature hybrid and the output terminal of the electronic switch with a same phase shift, resulting in a constructive interference at the fourth port. The phase shift of the RF signals at the fourth port of the quadrature hybrid and the output terminal of the electronic switch is equal to −270 degrees plus a phase shift that is a function of the bias voltage applied to the varactors.

In an embodiment of the third aspect, in an off state of the electronic switch, the bias voltage applied to the varactor is selected such that a difference between the capacitance of the varactor and the capacitance at the second port of the quadrature hybrid is larger than a second threshold. In the off state, the RF signals reflected from the second and third ports reach the first port with a same phase difference, resulting in a constructive interference at the first port of the quadrature hybrid and the input terminal of the electronic switch. In the off state, the RF signals reflected from the second and third ports reach the first port with 180 degrees phase difference, resulting in a reflection at the fourth port of the quadrature hybrid and the output terminal of the electronic switch that is smaller than a fourth threshold.

In another embodiment of the third aspect, in a modulation state of the electronic switch, the bias voltage applied to the varactor is selected such that a difference between the capacitance of the varactor and the capacitance at the second port of the quadrature hybrid is smaller than the second threshold and larger than the first threshold. In the modulation state, the RF signals reflected from the second and third ports are modulated by the capacitance of the varactor.

In another embodiment of the third aspect, the quadrature hybrid and the varactor are positioned on a top surface of a substrate, wherein the substrate is backed by a ground plane, and wherein the ground conductor is connected to the ground plane.

In a fourth aspect, an electronic switch, comprises an input terminal; an output terminal; a quadrature hybrid comprising first, second, third, and fourth ports; a varactor comprising first and second ends, wherein a capacitance of the varactor changes by changing an external bias voltage applied to the varactor; a capacitor comprising first and second ends; and an inductance comprising first and second ends. The input terminal of the electronic switch is connected to the first port of the quadrature hybrid, and wherein the output port of the electronic switch is connected to the fourth port of the quadrature hybrid. The first end of the capacitor is connected to the second port of the quadrature hybrid, and wherein the second end of the capacitor is connected to a ground conductor. The first end of the varactor and the first end of the inductor are connected to the third port of the quadrature hybrid, and wherein the second end of the varactor and the second end of the inductor are connected to the ground conductor. The electronic switch is configured to receive radio frequency (RF) signals through the input terminal, pass the RF signals through the quadrature hybrid to the second and third ports of the quadrature hybrid, and reflect the RF signals from the capacitor at the second port of the quadrature hybrid and from the varactor and the inductor at the third port of the quadrature hybrid into the quadrature hybrid. In an on state of the electronic switch, an impedance of the varactor and the inductor is selected such that a difference between an impedance of the capacitor and the impedance of the varactor and the inductor is within a first threshold. In the on state, the RF signals reflected from the second and third ports reach the first port with 180 degrees phase difference, resulting in a reflection at the first port of the quadrature hybrid and the input terminal of the electronic switch that is smaller than a third threshold, and wherein the RF signals reflected from the second and third ports reach the fourth port of the quadrature hybrid and the output terminal of the electronic switch with a same phase shift, resulting in a constructive interference at the fourth port. The phase shift of the RF signals at the fourth port of the quadrature hybrid and the output terminal of the electronic switch is equal to −270 degrees plus a phase shift that is a function of the bias voltage applied to the varactor.

In an embodiment of the fourth aspect, the capacitor is one of a constant capacitor and a varactor.

In another embodiment of the fourth aspect, in an off state of the electronic switch, the impedance of the varactor and the inductor is selected such that the difference between the impedance of the capacitor and the impedance of the varactor and the inductor is larger than a second threshold. In the off state, the RF signals reflected from the second and third ports reach the first port with a same phase difference, resulting in a constructive interference at the first port of the quadrature hybrid and the input terminal of the electronic switch. In the off state, the RF signals reflected from the second and third ports reach the first port with 180 degrees phase difference, resulting in a reflection at the fourth port of the quadrature hybrid and the output terminal of the electronic switch that is smaller than a fourth threshold.

In another embodiment of the fourth aspect, the capacitor is one of a constant capacitor and a varactor.

In another embodiment of the fourth aspect, in a modulation state of the electronic switch, the bias voltage applied to the varactor is selected such that a difference between the capacitance of the varactor and the capacitance of the capacitor is smaller than the second threshold and larger than the first threshold. In the modulation state, the RF signals reflected from the second and third ports are modulated by the capacitance of the varactor.

In another embodiment of the fourth aspect, the quadrature hybrid, the capacitor, the varactor, and the inductor are positioned on a top surface of a substrate, wherein the substrate is backed by a ground plane, and wherein the ground conductor is connected to the ground plane.

In a fifth aspect, an electronic switch comprises an input terminal; an output terminal; a quadrature hybrid comprising first, second, third, and fourth ports; a varactor, wherein a capacitance of the varactor changes by changing an external bias voltage applied to the varactor; a capacitor comprising first and second ends; and an inductance. The input terminal of the electronic switch is connected to the first port of the quadrature hybrid, and wherein the output port of the electronic switch is connected to the fourth port of the quadrature hybrid. The first end of the capacitor is connected to the second port of the quadrature hybrid. The second end of the capacitor is connected to a ground conductor. The varactor and the inductor are connected in series between the third port of the quadrature hybrid and the ground conductor. The electronic switch is configured to receive radio frequency (RF) signals through the input terminal, pass the RF signals through the quadrature hybrid to the second and third ports of the quadrature hybrid, and reflect the RF signals from the capacitor at the second port of the quadrature hybrid and from the varactor and the inductor at the third port of the quadrature hybrid into the quadrature hybrid. In an on state of the electronic switch, an impedance of the varactor and the inductor is selected such that a difference between an impedance of the capacitor and the impedance of the varactor and the inductor is within a first threshold. In the on state, the RF signals reflected from the second and third ports reach the first port with 180 degrees phase difference, resulting in a reflection at the first port of the quadrature hybrid and the input terminal of the electronic switch that is smaller than a third threshold, and wherein the RF signals reflected from the second and third ports reach the fourth port of the quadrature hybrid and the output terminal of the electronic switch with a same phase shift, resulting in a constructive interference at the fourth port. The phase shift of the RF signals at the fourth port of the quadrature hybrid and the output terminal of the electronic switch is equal to −270 degrees plus a phase shift that is a function of the bias voltage applied to the varactor.

In an embodiment of the fifth aspect, the capacitor is one of a constant capacitor and a varactor.

In another embodiment of the fifth aspect, in an off state of the electronic switch, the impedance of the varactor and the inductor is selected such that the difference between the impedance of the capacitor and the impedance of the varactor and the inductor is larger than a second threshold. In the off state, the RF signals reflected from the second and third ports reach the first port with a same phase difference, resulting in a constructive interference at the first port of the quadrature hybrid and the input terminal of the electronic switch. In the off state, the RF signals reflected from the second and third ports reach the first port with 180 degrees phase difference, resulting in a reflection at the fourth port of the quadrature hybrid and the output terminal of the electronic switch that is smaller than a fourth threshold.

In another embodiment of the fifth aspect, in a modulation state of the electronic switch, the bias voltage applied to the varactor is selected such that a difference between the capacitance of the varactor and the capacitance of the capacitor is smaller than the second threshold and larger than the first threshold. In the modulation state, the RF signals reflected from the second and third ports are modulated by the capacitance of the varactor.

In another embodiment of the fifth aspect, the quadrature hybrid, the capacitor, the varactor, and the inductor are positioned on a top surface of a substrate, wherein the substrate is backed by a ground plane, and wherein the ground conductor is connected to the ground plane.

From the above description it is manifest that various techniques can be used for implementing the concepts described in the present application without departing from the scope of those concepts. Moreover, while the concepts have been described with specific reference to certain implementations, a person of ordinary skill in the art may recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

What is claimed is:

1. A radio frequency (RF) phase shifter, comprising:
   an input terminal;
   an output terminal;
   a quadrature hybrid comprising first, second, third, and fourth ports; and
   first and second varactors, wherein each varactor comprises first and second ends, and
   wherein:
   a capacitance of each varactor changes by changing an external bias voltage applied to the first and second varactors,
   the input terminal of the RF phase shifter is connected to the first port of the quadrature hybrid, and the output terminal of the RF phase shifter is connected to the fourth port of the quadrature hybrid,
   the first end of the first varactor is connected to the second port of the quadrature hybrid, the first end of the second varactor is connected to the third port of the quadrature hybrid, and the second ends of the first and second varactors are connected to a ground conductor,
   the RF phase shifter is configured to receive RF signals through the input terminal, pass the RF signals through the quadrature hybrid to the second and third ports of the quadrature hybrid, and reflect the RF signals from the first and second varactors into the quadrature hybrid,
   the RF signals reflected from the second and third ports reach the first port with a 180 degrees phase difference, resulting in no reflection at the first port of the quadrature hybrid and the input terminal of the phase shifter, and the RF signals reflected from the second and third ports reach the fourth port of the quadrature hybrid and the output terminal of the phase shifter with a same phase shift, resulting in a constructive interference at the fourth port,
   the phase shift of the RF signals at the fourth port of the quadrature hybrid and the output terminal of the phase shifter is equal to −270 degrees plus a phase shift that is a function of the external bias voltage applied to the first and second varactors,
   the quadrature hybrid is positioned on a top surface of a substrate, each of the first and second varactors further comprises:
   a plurality of active switches inside the substrate, each active switch comprising:
   first and second conducting elements;
   a conducting triangular plate, wherein a first side of the conducting triangular plate is connected to the first conducting element of the active switch; and
   a gap layer between the second conducting element and a tip of the conducting triangular plate that is opposite the first side, and
   the external bias voltage is applied between the first and second conducting elements of the active switches of each varactor.

2. The RF phase shifter of claim 1, wherein the plurality of active switches of each varactor is arranged in a plurality rows and columns, and at least some of the plurality of active switches share a conducting element with another active switch in a same column.

3. The RF phase shifter of claim 1, wherein the gap layer defines a cavity that is filled with air or one or more inert gases.

4. The RF phase shifter of claim 1, wherein the gap layer defines a cavity, and inside the cavity is vacuum.

5. The RF phase shifter of claim 1, wherein the gap layer is a dielectric layer comprising a plurality of channels.

6. The RF phase shifter of claim 5, wherein the dielectric layer comprises one of polyimide and polyester.

7. The RF phase shifter of claim 5, wherein the plurality of channels is filled with air or one or more inert gases.

8. The RF phase shifter of claim 5, wherein inside the plurality of channels is vacuum.

9. The RF phase shifter of claim 1, further comprising:
a first inductor connected in parallel with the first varactor; and
a second inductor connected in parallel with the second varactor.

10. The RF phase shifter of claim 1 further comprising:
a first inductor connected in series with the first varactor; and
a second inductor connected in series with the second varactor.

11. The RF phase shifter of claim 1, wherein the first varactor and the second varactor have substantially identical characteristics.

12. The RF phase shifter of claim 1, wherein the quadrature hybrid and the first and second varactors are positioned on the top surface of the substrate, the substrate is backed by a ground plane, and the ground conductor is connected to the ground plane.

* * * * *